(12) United States Patent
Takada

(10) Patent No.: US 8,679,649 B2
(45) Date of Patent: Mar. 25, 2014

(54) MATERIAL FOR ORGANIC ELECTROLUMINESCENCE DEVICE, AND ORGANIC ELECTROLUMINESCENCE DEVICE

(75) Inventor: Saki Takada, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 100 days.

(21) Appl. No.: 13/393,491

(22) PCT Filed: Aug. 27, 2010

(86) PCT No.: PCT/JP2010/065094
§ 371 (c)(1),
(2), (4) Date: Feb. 29, 2012

(87) PCT Pub. No.: WO2011/025068
PCT Pub. Date: Mar. 3, 2011

(65) Prior Publication Data
US 2012/0169218 A1 Jul. 5, 2012

(30) Foreign Application Priority Data
Aug. 31, 2009 (JP) .................................. 2009-201145

(51) Int. Cl.
H01L 51/54 (2006.01)
C09K 11/06 (2006.01)

(52) U.S. Cl.
USPC .... 428/690; 428/917; 313/504; 257/E51.044; 548/108

(58) Field of Classification Search
None
See application file for complete search history.

(56) References Cited

U.S. PATENT DOCUMENTS

| | | |
|---|---|---|
| 2002/0125818 A1 | 9/2002 | Sato et al. |
| 2004/0178720 A1 | 9/2004 | Lee et al. |
| 2007/0297033 A1 | 12/2007 | Kelley |
| 2008/0160345 A1 | 7/2008 | Inoue et al. |
| 2010/0140606 A1 | 6/2010 | Shibata et al. |
| 2010/0141125 A1 | 6/2010 | Otsu et al. |
| 2010/0141126 A1 | 6/2010 | Otsu et al. |

FOREIGN PATENT DOCUMENTS

| | | | |
|---|---|---|---|
| JP | 2002-305083 A | 10/2002 | |
| JP | 2004-281386 A | 10/2004 | |
| JP | 2007-284549 A | 11/2007 | |
| JP | 2007-305783 A | 11/2007 | |
| JP | 4039023 B2 | 11/2007 | |
| JP | 2008-179607 A | 8/2008 | |
| JP | 2008-311607 A | 12/2008 | |
| JP | 2008-311608 A | 12/2008 | |
| JP | 2009-526071 A | 7/2009 | |
| JP | 2009-534846 A | 9/2009 | |
| JP | 2010-120893 A | 6/2010 | |
| WO | 2007-124172 A2 | 11/2007 | |
| WO | 2008-140069 A1 | 11/2008 | |
| WO | 2008-140114 A1 | 11/2008 | |
| WO | 2008-140115 A1 | 11/2008 | |

OTHER PUBLICATIONS

Japanese Office Action issued Nov. 25, 2009, in corresponding Application 2009-201145.
Japanese Office Action issued Feb. 16, 2010, in corresponding Application 2009-201145.
International Search Report (PCT/ISA/210) issued Sep. 28, 2009, in PCT/JP2010/065094.
Written Opinion (PCT/ISA/237) issued Sep. 2010, in PCT/JP2010/065094.

*Primary Examiner* — Marie R. Yamnitzky
(74) *Attorney, Agent, or Firm* — Morgan, Lewis & Bockius, LLP

(57) ABSTRACT

A material for an organic electroluminescence device is provided and contains compounds represented by the following formulae (3a) and (3b). The compound (3a) has a molecular weight smaller than that of the compound (3b), and the material has a content ratio of the compound (3a) to the compound (3b) of from 0.1 to 5,000 ppm.

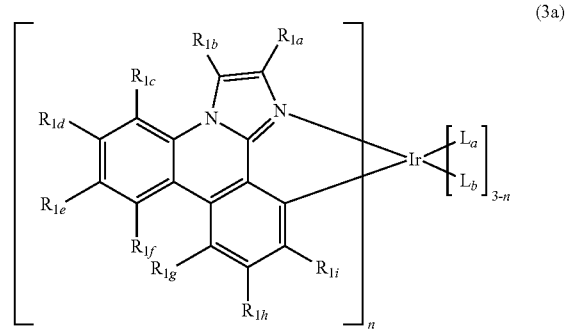

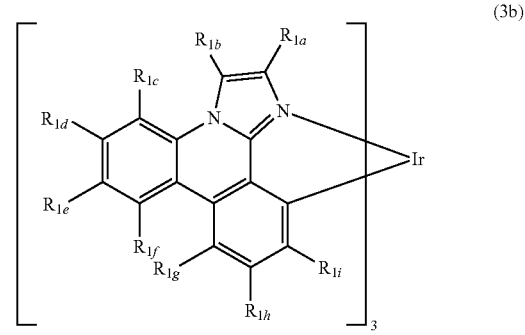

In the formulae, each of $R_{1a}$ to $R_{1i}$ independently represents a hydrogen atom, an alkyl group having a carbon number of 1 to 20, a cycloalkyl having a carbon number of 3 to 8, an aryl group having a carbon number of 6 to 18, an cyano group, or a fluoro group; n is 1 or 2; and $L_a$ and $L_b$ form one of the specific bidentate ligands.

11 Claims, 1 Drawing Sheet

MATERIAL FOR ORGANIC ELECTROLUMINESCENCE DEVICE, AND ORGANIC ELECTROLUMINESCENCE DEVICE

TECHNICAL FIELD

The present invention relates to a material for an organic electroluminescence device and an organic electroluminescence device using the material.

BACKGROUND ART

Studies and development of an organic electroluminescence device (hereinafter sometimes referred to as a "device" or an "organic EL device") are being aggressively made, because high-luminance luminescence can be obtained by low-voltage driving. The organic electroluminescence device has an organic layer between a pair of electrodes, where the energy of an exciton produced when an electron injected from a cathode and a hole injected from an anode are recombined in the organic layer is utilized for luminescence.

In recent years, a phosphorescent material is used with an attempt to achieve high efficiency of the device. For example, an organic electroluminescence device enhanced in the luminous efficiency and durability by using an iridium complex or a platinum complex as the phosphorescent material is being studied. Also, a doping-type device using a light emitting layer where a light emitting material is doped in a host material is widely employed.

Patent Document 1: U.S. Patent Application Publication No. 2007/0297033 discloses a technique where an iridium or platinum complex with a ligand having a condensed ring structure is used as a phosphorescent material so as to obtain a high-durability device capable of emitting blue light with high color purity.

Also, Patent Document 2: Japanese Patent No. 4,039,023 discloses a method where a light emitting material incapable of high-efficiency luminescence by itself is caused to emit high-luminance light with high efficiency by using a method of incorporating a phosphorescent metal complex and another light emitting material together in the light emitting layer.

SUMMARY OF INVENTION

The device using the phosphorescent material described in Patent Document 1 has high durability but fails in obtaining sufficient luminous efficiency. The luminous efficiency can be improved by introducing a substituent into a specific position of a complex of this phosphorescent material, but in this case, the durability is decreased. Accordingly, a technique for enhancing the luminous efficiency, which can be alternative to the introduction of a substituent, is demanded. Also, in Patent Document 2, a phosphorescent metal complex and another light emitting material are mixed in a molar ratio of 0.3 to 3, whereby high efficiency is obtained, but in this technique, as a condition for obtaining high efficiency, the phosphorescent metal complex must be higher in the lowest triplet energy than another light emitting material. For this reason, application of the technique of Patent Document 2 to a blue phosphorescent material like the complex described in Patent Document 1 requires to use a phosphorescent metal complex of shorter wavelength luminescence. However, the phosphorescent metal complex of sufficiently shorter wavelength luminescence than the blue phosphorescent material is extremely limited. Furthermore, application of the technique of Patent Document 2 to the light emitting material of Patent Document 1 is presumed to involve difficulty in controlling the charge transportability, because the proportion of the metal complex occupying in the light emitting layer increases. In practice, according to the investigation by the present inventors to enhance the efficiency of the complex of Patent Document 1 by using the method described in Patent Document 2, it was revealed that the durability greatly deteriorates.

Meanwhile, the organic electroluminescence device is recently expanding its application, for example, to a display, a panel or illumination, and considering the application to an in-vehicle panel or the like that is probably exposed to a high temperature of 70° C. or more, the change in the device characteristics at high-temperature driving is estimated to become an important issue.

An object of the present invention is to provide an organic electroluminescence device having high luminous efficiency and causing less reduction in the luminous efficiency even at high-temperature driving. Another object of the present invention is to provide a material for an organic electroluminescence device, which is used for an organic electroluminescence device excellent in the luminous efficiency.

As a result of investigations to attain the above-described objects, the present inventors have found that when the device is fabricated using a material containing a specific metal complex (for example, a specific tris-type metal complex) having added thereto a small amount of a metal complex having another specific structure with a common ligand (a mixed-type metal complex having two or more kinds of ligands), the luminous efficiency of the device can be greatly improved. Also, it has been found that even when the device is driven under a high-temperature condition exceeding 70° C., the luminous efficiency can be maintained at a high level. That is, the present invention can be attained by the following techniques.

(1) A material for an organic electroluminescence device, comprising a compound represented by formula (1a) and a compound represented by formula (1b), wherein the compound represented by formula (1a) has a molecular weight smaller than that of the compound represented by formula (1b), and the material has a content ratio of the compound represented by formula (1a) to the compound represented by formula (1b) of from 0.1 to 5,000 ppm:

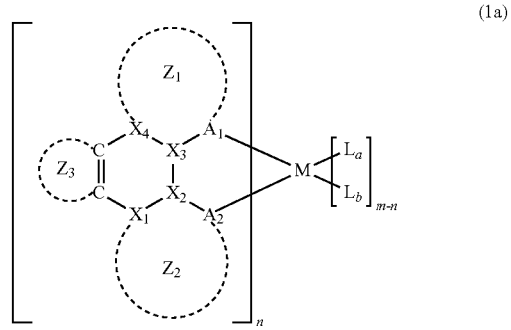

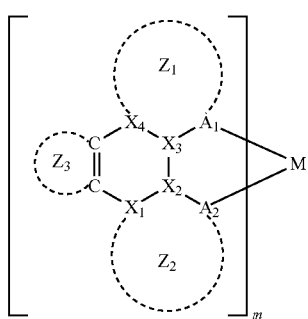

(1b)

wherein each of $A_1$, $A_2$ and $X_1$ to $X_4$ independently represents a carbon atom or a nitrogen atom; $Z_1$ represents a 5-membered ring that includes a carbon atom and may include a heteroatom; each of $Z_2$ and $Z_3$ independently represents an aromatic hydrocarbon ring or a heterocyclic ring; M represents a transition metal atom having an atomic weight of 40 or more and belonging to one of Groups 8 to 10 of the periodic table; n represents 1 or 2; m represents 2 or 3, provided that m is 3 when M is a metal of Group 8 or 9, and m is 2 when M is a metal of Group 10; $L_a$ represents a neutral monodentate ligand, $L_b$ represents a monoanionic monodentate ligand, and $L_a$ and $L_b$ may combine with each other to form a bidentate ligand; and in each of formula (1a) and formula (1b), the ligand containing $Z_1$ to $Z_3$ has a structure with 18 π electrons in total.

(2) The material for an organic electroluminescence device as described in (1) wherein the compound represented by formulae (1a) and (1b) are compounds represented by formula (2a) and formula (2b), respectively:

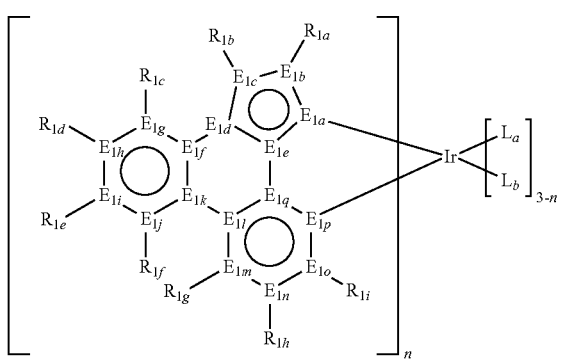

(2a)

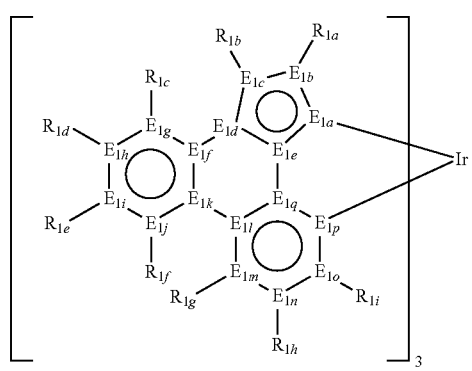

(2b)

wherein each of $E_{1a}$ to $E_{1q}$ independently represents a carbon atom or a heteroatom, provided that each of $E_{1f}$ and $E_{1k}$ represents a carbon atom; each of $R_{1a}$ to $R_{1i}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present; $L_a$, $L_b$ and n have the same meanings as in formula (1a); and in each of formula (2a) and formula (2b), the ligand containing $E_{1a}$ to $E_{1q}$ has a structure with 18 π electrons in total.

(3) The material for an organic electroluminescence device as described in (2), wherein the compound represented by formulae (2a) and (2b) are compounds represented by formula (3a) and formula (3b), respectively:

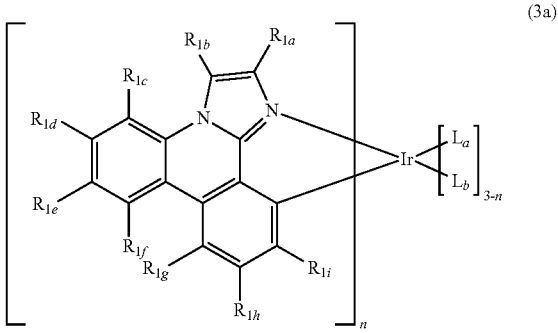

(3a)

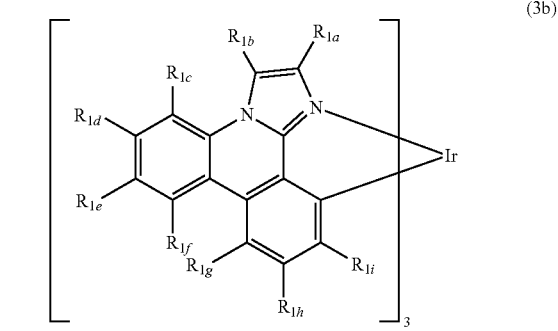

(3b)

wherein $R_{1a}$ to $R_{1i}$ have the same meanings as in formula (2a), and $L_a$, $L_b$ and n have the same meanings as in formula (1a).

(4) The material for an organic electroluminescence device as described in any one of (1) to (3), wherein $L_a$ and $L_b$ form one of bidentate ligands I-1 to I-12:

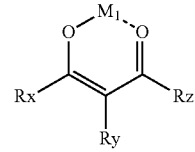

I-1

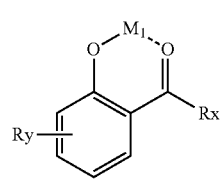

I-2

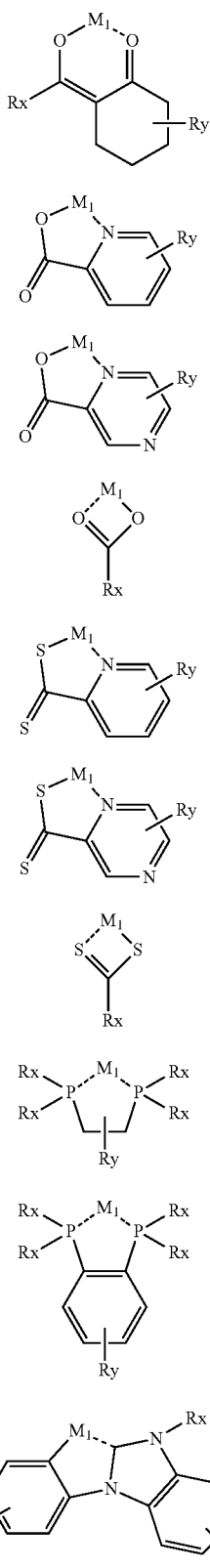

wherein each of Rx, Ry and Rz independently represents a hydrogen atom or a substituent, and $M_1$ corresponds to M in formula (1a).

(5) The material for an organic electroluminescence device as described in (3), wherein the compound represented by formula (3a) is a compound represented by formula (3a-1):

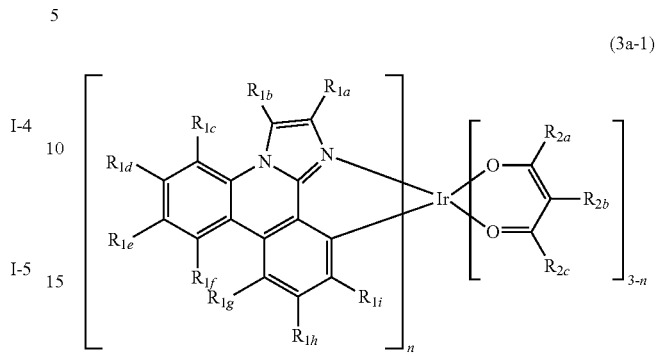

(3a-1)

wherein $R_{1a}$ to $R_{1i}$ have the same meanings as in formula (2a), n has the same meaning as in formula (1a), and each of $R_{2a}$ to $R_{2c}$ independently represents a hydrogen atom or a substituent.

(6) The material for an organic electroluminescence device as described in (5), wherein the compound represented by formula (3a-1) is a compound represented by formula (3a-2):

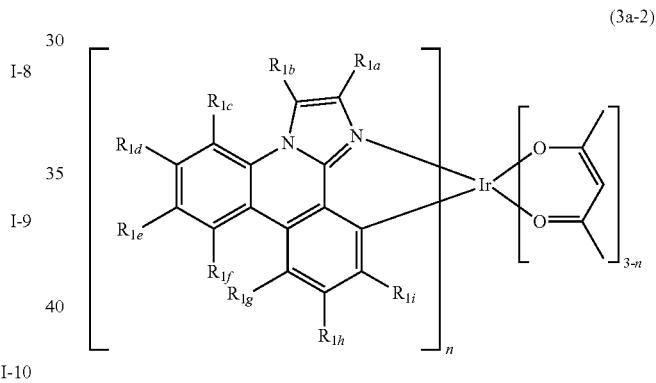

(3a-2)

wherein $R_{1a}$ to $R_{1i}$ have the same meanings as in formula (2a), and n has the same meaning as in formula (1a).

(7) The material for an organic electroluminescence device as described in (6), wherein the compound represented by formula (3a-2) is a compound represented by formula (3a-3):

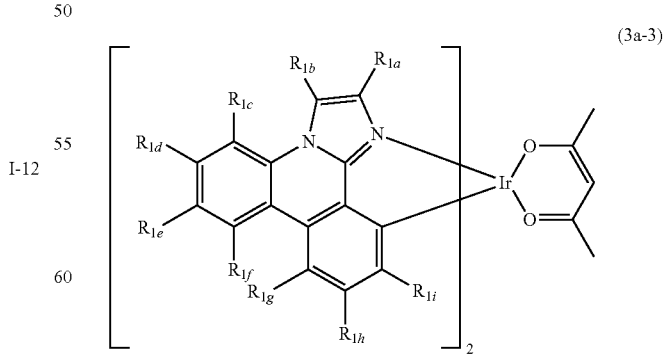

(3a-3)

wherein $R_{1a}$ to $R_{1i}$ have the same meanings as in formula (2a).

(8) The material for an organic electroluminescence device as described in (1), wherein the compounds represented by formulae (1a) and (1b) are compounds represented by formula (4a) and formula (4b), respectively:

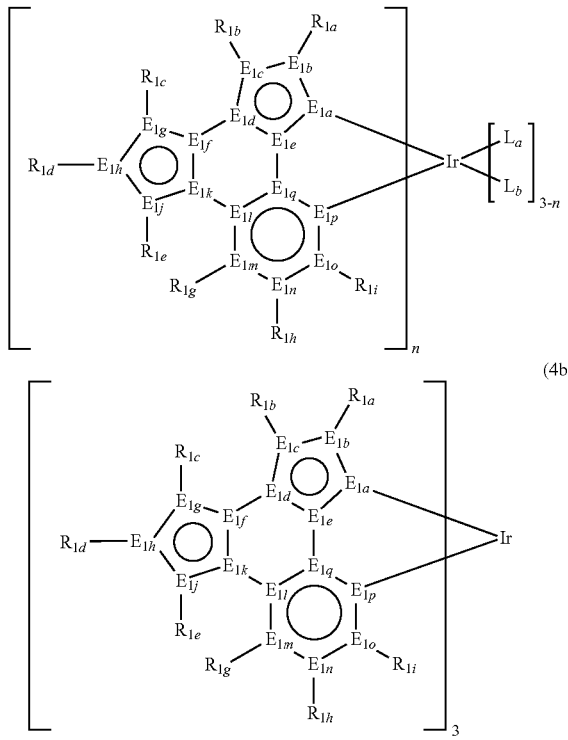

wherein each of $E_{1a}$ to $E_{1q}$ independently represents a carbon atom or a heteroatom, provided that each of $E_{1f}$ and $E_{1k}$ represents a carbon atom; each of $R_{1a}$ to $R_{1h}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present; $L_a$, $L_b$ and n have the same meanings as in formula (1a); and in each of formula (4a) and formula (4b), the ligand containing $E_{1a}$ to $E_{1q}$ has a structure with 18 n electrons in total.

(9) The material for an organic electroluminescence device as described in any one of (1) to (8), wherein the content ratio of the compound represented by formula (1a) to the compound represented by formula (1b) is from 0.1 to 1,000 ppm.

(10) The material for an organic electroluminescence device as described in any one of (1) to (9), wherein a ratio of the molecular weight of the compound represented by formula (1a) to a molecular weight of the compound represented by formula (1b) is from 0.75 to 0.99.

(11) An organic electroluminescence device comprising: a substrate; a pair of electrodes; and at least one organic layer containing a light emitting layer and being disposed between the electrodes, wherein
the organic layer contains a material for an organic electroluminescence device described in any one of (1) to (10).

(12) The organic electroluminescence device as described in (11), wherein the light emitting layer includes the material for an organic electroluminescence device.

(13) A light emission apparatus comprising an organic electroluminescence device described in (11) or (12).

(14) A display apparatus comprising an organic electroluminescence device described in (11) or (12).

(15) An illumination apparatus comprising an organic electroluminescence device described in (11) or (12).

Advantageous Effects of Invention

According to the present invention, an organic electroluminescence device having high luminous efficiency can be obtained.

DESCRIPTION OF EMBODIMENTS

Figure 1:
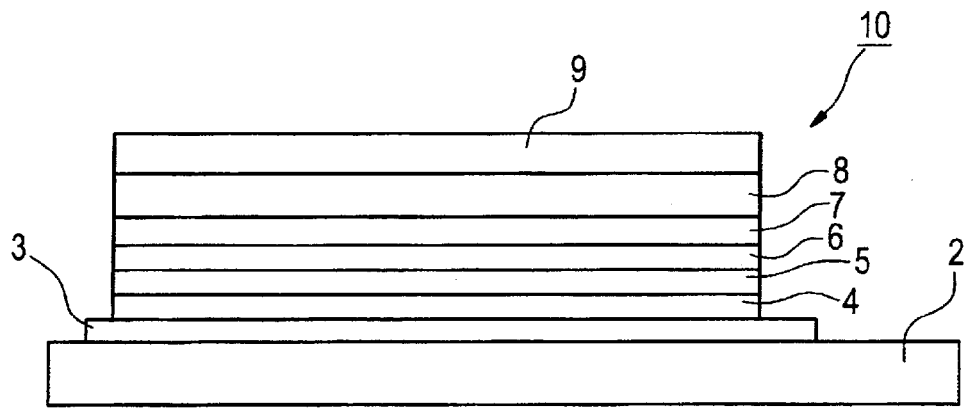
FIG. 1 is a schematic view showing one example of the configuration of the organic electroluminescence device according to the present invention.

In the present invention, the hydrogen atom in the description of a formula is used including its isotopes (e.g., deuterium atom), and the atom constituting a substituent is used including its isotopes.

Also, the "carbon number" of a substituent such as alkyl group is used including a case where the substituent such as alkyl group may be substituted with another substituent, and includes the carbon number of another substituent. Incidentally, in the formula of a ligand for use in the present invention, * is a coordination site to a metal, and the bond between each of $A_1$, $A_2$, $E_{1a}$ and $E_{1p}$ and the metal may be individually either a covalent bond or a coordinate bond.

The material for organic electroluminescence devices of the present invention (hereinafter, sometimes referred to as "the material of the present invention") is a material for organic electroluminescence devices, containing a compound represented by formula (1a) and a compound represented by formula (1b), wherein the molecular weight of the compound represented by formula (1a) is smaller than the molecular weight of the compound represented by formula (1b) and the content of the compound represented by formula (1a) is from 0.1 to 5,000 ppm based on the compound represented by formula (1b):

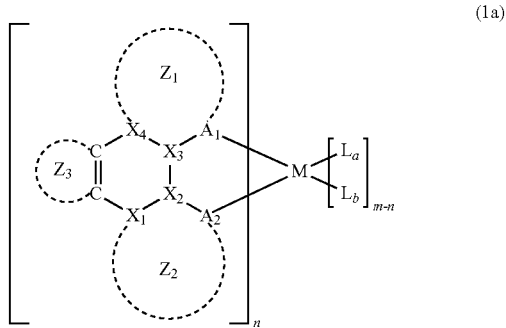

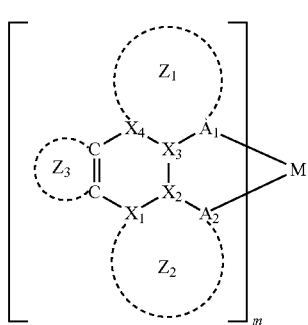

(1b)

In formulae (1a) and (1b), each of $A_1$, $A_2$ and $X_1$ to $X_4$ independently represents a carbon atom or a nitrogen atom, $Z_1$ represents a 5-membered ring composed of a carbon atom and/or a heteroatom, each of $Z_2$ and $Z_3$ independently represents an aromatic hydrocarbon ring or a heterocyclic ring, M represents a transition metal atom having an atomic weight of 40 or more and belonging to Groups 8 to 10 of the periodic table, n represents 1 or 2, m represents 2 or 3, m is 3 when M is a metal of Group 8 or 9, m is 2 when M is a metal of Group 10, $L_a$ represents a neutral monodentate ligand, $L_b$ represents a monoanionic monodentate ligand, $L_a$ and $L_b$ may combine with each other to form a bidentate ligand, and in each of formula (1a) and formula (1b), the ligand containing $Z_1$ to $Z_3$ has a structure with 18 π electrons in total.

By using the material of the present invention, where the molecular weight of the compound represented by formula (1a) is smaller than the molecular weight of the compound represented by formula (1b) and the content of the compound represented by formula (1a) is from 0.1 to 5,000 ppm based on the compound represented by formula (1b), for an organic electroluminescence device, the luminous efficiency of the device can be enhanced, and reduction in the luminous efficiency at high-temperature driving can be suppressed.

In general, when selecting materials of an organic electroluminescence device, a pure material is used in many cases without using a mixture, because deterioration of the durability is predicted. For example, in JP-A-2005-347004 (the term "JP-A" as used herein means an "unexamined published Japanese patent application"), it is indicated that a material where the content of the raw material or decomposition product is 0.5% or less based on the metal complex exhibits high durability. The metal complex represented by formula (1a) of the present invention is also a raw material of the metal complex represented by formula (1b), and this may lead one skilled in the art to consider that mixing of the compound represented by formula (1a) with the compound represented by formula (1b) incurs deterioration of the device performance. However, in the present invention, even a mixture obtained by mixing the compound represented by formula (1a) with the compound represented by formula (1b) in a predetermined content is unexpectedly free of deterioration of the durability and exhibits high performance. Detailed principle of this phenomenon is not clear, but this is considered as follows.

The following presumption is given with respect to the luminous efficiency. In the compound represented by formula (1b), the ligand is bulky and the complex has a structure with many voids. Accordingly, when the compound is used in the light emitting layer, injection of an electric charge at the interface between the light emitting layer and an adjacent layer may not be performed efficiently. In the material of the present invention, a compound represented by formula (1a) having a small molecular weight as compared with the compound represented by formula (1b) is mixed in a small amount and therefore, it is presumed that the compound represented by formula (1a) is fully doped into the interface between the light emitting layer and the adjacent layer to enable good electronic contact of the light emitting layer with the adjacent layer and smooth injection of an electric charge at the interface between the light emitting layer and the adjacent layer, and the recombination probability of an electron and a hole in the light emitting layer is enhanced, as a result, the luminous efficiency is improved. Also, the metal complex represented by formula (1b) is not distributed throughout the light emitting layer but is concentrated in the vicinity of interface, and the content thereof is as small as 5,000 ppm or less, which is presumed to allow for obtaining the above-described effects without incurring deterioration of the device durability.

With respect to the maintenance of luminous efficiency at high-temperature driving, the following presumption is given. When a device is driven at a high temperature of 70° C. or more that is close to the glass transition temperature of the material, a change in the film quality (for example, softening of the material) is of course caused inside of a layer of the device but the change is presumed to be large particularly at the layer interface. The cause of reduction in the luminous efficiency at the high-temperature driving is attributed to the thermal stability of the light emitting material itself, and the material softened at the layer interface is considered to make ambiguous the layer interface and non-uniform the injection of electric charges and lead to reduction in the efficiency. In the case of the material of the present invention, it is estimated that at least three kinds of materials, that is, two kinds of light emitting materials (a compound represented by formula (1a) and a compound represented by formula (1b)) and a host material, are mixed to form a solid in the vicinity of layer interface and this solid inhibits the glass transition. The glass transition is considered to greatly affect the property of the material itself and the alignment in the solid state.

From the standpoint of enhancing the luminous efficiency and maintaining the luminous efficiency at high-temperature driving, the content of the compound represented by formula (1a) is preferably from 0.1 to 3,000 ppm, more preferably from 0.1 to 1,000 ppm, still more preferably from 0.5 to 1,000 ppm, yet still more preferably from 10 to 700 ppm, and even yet still more preferably from 50 to 700 ppm, based on the compound represented by formula (1b).

The molecular weight of the compound represented by formula (1a) is smaller than the molecular weight of the compound represented by formula (1b), and the ratio of the molecular weight of the compound represented by formula (1a) to the molecular weight of the compound represented by formula (1b) is less than 1.0. From the standpoint of enhancing the luminous efficiency and maintaining the luminous efficiency at high-temperature driving, this ratio is preferably from 0.55 to less than 1.00, more preferably from 0.75 to 0.99, and most preferably from 0.75 to 0.90.

The glass transition temperature of each of the compounds represented by formulae (1a) and (1b) is preferably from 80 to 400° C., more preferably from 100 to 400° C., still more preferably from 120 to 400° C.

Formulae (1a) and (1b) are described below.

Each of $A_1$, $A_2$ and $X_1$ to $X_4$ independently represents a carbon atom or a nitrogen atom.

$Z_1$ represents a 5-membered ring composed of a carbon atom and/or a heteroatom.

The 5-membered ring represented by $Z_1$ includes an aromatic ring and a heterocyclic ring. Specific examples of the 5-membered heterocyclic ring include oxazole, thiazole, isoxazole, isothiazole, pyrrole, imidazole, pyrazole, triazole and tetrazole. Among these, imidazole and pyrazole are preferred, and imidazole is more preferred.

Incidentally, the heteroatom as used in the context of the present invention indicates an atom except for a carbon atom and a hydrogen atom, and examples thereof include oxygen, nitrogen, phosphorus, sulfur, selenium, arsenic, chlorine, bromine, silicon and fluorine.

Each of $Z_2$ and $Z_3$ independently represents an aromatic hydrocarbon ring or a heterocyclic ring and is preferably a 5- or 6-membered aromatic hydrocarbon ring or heterocyclic ring, more preferably a 6-membered ring, still more preferably a 6-membered aromatic hydrocarbon ring.

Specific examples of the ring represented by $Z_2$ and $Z_3$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine and triazine. Among these, pyridine and benzene are preferred, and benzene is more preferred.

The ring represented by $Z_1$, $Z_2$ and $Z_3$ may have a substituent, and the substituent is selected from the following substituent group Z and is preferably a hydrogen atom, a hydrocarbon substituent, a cyano group, a fluoro group, $OR_{2a}$, $SR_{2a}$, $NR_{2a}R_{2b}$, $BR_{2a}R_{2b}$ or $SiR_{2a}R_{2b}R_{2c}$. Each of $R_{2a}$ to $R_{2c}$ is independently a hydrocarbon substituent or a hydrocarbon substituent substituted with a heteroatom.

Specific examples of the substituent group Z include an alkyl group, an alkenyl group, an alkynyl group, an aryl group, a heteroaryl group, an amino group, an alkoxy group, an aryloxy group, a heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, a sulfonyl group, a sulfinyl group, a ureido group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group except for heteroaryl group, a silyl group, a silyloxy group and a deuterium atom. These substituents may further be substituted with other substituent.

Here, the alkyl group is preferably an alkyl group having a carbon number of 1 to 30, more preferably from 1 to 20, still more preferably from 1 to 10, and examples thereof include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl and trifluoromethyl.

The alkenyl group is preferably an alkenyl group having a carbon number of 2 to 30, more preferably from 2 to 20, still more preferably from 2 to 10, and examples thereof include vinyl, allyl, 1-propenyl, 1-isopropenyl, 1-butenyl, 2-butenyl and 3-pentenyl.

The alkynyl group is preferably an alkynyl group having a carbon number of 2 to 30, more preferably from 2 to 20, still more preferably from 2 to 10, and examples thereof include ethynyl, propargyl, 1-propynyl and 3-pentynyl.

The aryl group indicates an aromatic hydrocarbon monoradical. In the case where the aryl group is substituted, preferred examples of the substituent include a fluoro group, a hydrocarbon substituent, a heteroatom-substituted hydrocarbon substituent and a cyano group. The aryl group is preferably an aryl group having a carbon number of 6 to 30, more preferably from 6 to 20, still more preferably from 6 to 12, and examples thereof include phenyl, o-methylphenyl, m-methylphenyl, p-methylphenyl, 2,6-xylyl, p-cumenyl, mesityl, naphthyl and anthranyl.

The heteroaryl group indicates an aromatic heterocyclic monoradical. In the case of the heteroaryl group is substituted, preferred examples of the substituent include a fluoro group, a hydrocarbon substituent, a heteroatom-substituted hydrocarbon substituent and a cyano group. Examples of the heterocyclic group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzothiazolyl, carbazolyl and azepinyl.

The amino group is preferably an amino group having a carbon number of 0 to 30, more preferably from 0 to 20, still more preferably from 0 to 10, and examples thereof include amino, methylamino, dimethylamino, diethylamino, dibenzylamino, diphenylamino and ditolylamino.

The alkoxy group is preferably an alkoxy group having a carbon number of 1 to 30, more preferably from 1 to 20, still more preferably from 1 to 10, and examples thereof include methoxy, ethoxy, butoxy and 2-ethylhexyloxy.

The aryloxy group is preferably an aryloxy group having a carbon number of 6 to 30, more preferably from 6 to 20, still more preferably from 6 to 12, and examples thereof include phenyloxy, 1-naphthyloxy and 2-naphthyloxy.

The heterocyclic oxy group is preferably a heterocyclic oxy having a carbon number of 1 to 30, more preferably from 1 to 20, still more preferably from 1 to 12, and examples thereof include pyridyloxy, pyrazyloxy, pyrimidyloxy and quinolyloxy.

The acyl group is preferably an acyl group having a carbon number of 2 to 30, more preferably from 2 to 20, still more preferably from 2 to 12, and examples thereof include acetyl, benzoyl, formyl and pivaloyl.

The alkoxycarbonyl group is preferably an alkoxycarbonyl group having a carbon number of 2 to 30, more preferably from 2 to 20, still more preferably from 2 to 12, and examples thereof include methoxycarbonyl and ethoxycarbonyl.

The aryloxycarbonyl group is preferably an aryloxycarbonyl group having a carbon number of 7 to 30, more preferably from 7 to 20, still more preferably from 7 to 12, and examples thereof include phenyloxycarbonyl.

The acyloxy group is preferably an acyloxy group having a carbon number of 2 to 30, more preferably from 2 to 20, still more preferably from 2 to 10, and examples thereof include acetoxy and benzoyloxy.

The acylamino group is preferably an acylamino group having a carbon number of 2 to 30, more preferably from 2 to 20, still more preferably from 2 to 10, and examples thereof include acetylamino and benzoylamino.

The alkoxycarbonylamino group is preferably an alkoxycarbonylamino group having a carbon number of 2 to 30, more preferably from 2 to 20, still more preferably from 2 to 12, and examples thereof include methoxycarbonylamino.

The aryloxycarbonylamino group is preferably an aryloxycarbonylamino group having a carbon number of 7 to 30, more preferably from 7 to 20, still more preferably from 7 to 12, and examples thereof include phenyloxycarbonylamino.

The sulfonylamino group is preferably a sulfonylamino group having a carbon number of 1 to 30, more preferably from 1 to 20, still more preferably from 1 to 12, and examples thereof include methanesulfonylamino and benzenesulfonylamino.

The sulfamoyl group is preferably a sulfamoyl group having a carbon number of 0 to 30, more preferably from 0 to 20, still more preferably from 0 to 12, and examples thereof include sulfamoyl, methylsulfamoyl, dimethylsulfamoyl and phenylsulfamoyl.

The carbamoyl group is preferably a carbamoyl group having a carbon number of 1 to 30, more preferably from 1 to 20, still more preferably from 1 to 12, and examples thereof include carbamoyl, methylcarbamoyl, diethylcarbamoyl and phenylcarbamoyl.

The alkylthio group is preferably an alkylthio group having a carbon number of 1 to 30, more preferably from 1 to 20, still more preferably from 1 to 12, and examples thereof include methylthio and ethylthio.

The arylthio group is preferably an arylthio group having a carbon number of 6 to 30, more preferably from 6 to 20, still more preferably from 6 to 12, and examples thereof include phenylthio.

The heteroarylthio group is preferably a heteroarylthio group having a carbon number of 1 to 30, more preferably from 1 to 20, still more preferably from 1 to 12, and examples thereof include pyridylthio, 2-benzimidazolylthio, 2-benzoxazolylthio and 2-benzothiazolylthio.

The sulfonyl group is preferably a sulfonyl group having a carbon number of 1 to 30, more preferably from 1 to 20, still more preferably from 1 to 12, and examples thereof include mesyl, tosyl and trifluoromethanesulfonyl.

The sulfinyl group is preferably a sulfinyl group having a carbon number of 1 to 30, more preferably from 1 to 20, still more preferably from 1 to 12, and examples thereof include methanesulfinyl and benzenesulfinyl.

The ureido group is preferably a ureido group having a carbon number of 1 to 30, more preferably from 1 to 20, still more preferably from 1 to 12, and examples thereof include ureido, methylureido and phenylureido.

The phosphoric acid amido group is preferably a phosphoric acid amido group having a carbon number of 1 to 30, more preferably from 1 to 20, still more preferably from 1 to 12, and examples thereof include diethylphosphoric acid amido and phenylphosphoric acid amido.

Examples of the halogen atom include fluorine atom, chlorine atom, bromine atom and iodine atom.

The heterocyclic group except for heteroaryl group is preferably a heterocyclic group having a carbon number of 1 to 30, more preferably from 1 to 12. The heteroatom is, for example, nitrogen atom, oxygen atom or sulfur atom. Specific examples of the heterocyclic group include piperidyl, morpholino and pyrrolidyl.

The silyl group is preferably a silyl group having a carbon number of 3 to 40, more preferably from 3 to 30, still more preferably from 3 to 24, and examples thereof include trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl and tri-2-naphthylsilyl.

The silyloxy group is preferably a silyloxy group having a carbon number of 3 to 40, more preferably from 3 to 30, still more preferably from 3 to 24, and examples thereof include trimethylsilyloxy and triphenylsilyloxy.

The hydrocarbon substituent indicates a monovalent or divalent, chain, branched or cyclic substituent composed of only a carbon atom and a hydrogen atom. Examples of the monovalent hydrocarbon substituent include an alkyl group having a carbon number of 1 to 20 (an alkyl group having a carbon number of 1 to 20 substituted with one or more groups selected from an alkyl group having a carbon number of 1 to 20, a cycloalkyl group having a carbon number of 3 to 8 and an aryl group), a cycloalkyl group having a carbon number of 3 to 8 (a cycloalkyl group having a carbon number of 3 to 8 substituted with one or more groups selected from an alkyl group having a carbon number of 1 to 20, a cycloalkyl group having a carbon number of 3 to 8 and an aryl group), and an aryl group having a carbon number of 6 to 18 (an aryl group substituted with one or more groups selected from an alkyl group having a carbon number of 1 to 20, a cycloalkyl group having a carbon number of 3 to 8 and an aryl group), Examples of the divalent hydrocarbon group include —$CH_2$—, —$CH_2CH_2$—, —$CH_2CH_2CH_2$— and 1,2-phenylene group.

In formulae (1a) and (1b), M represents a transition metal atom having an atomic weight of 40 or more and belonging to Groups 8 to 10 of the periodic table. The metal is preferably any one of Ru, Os, Rh, Ir, Pd and Pt, more preferably Os, Ir or Pt, still more preferably Ir or Pt, and in view of high luminous efficiency, high complex stability and control of the carrier balance in the hole/electron transport inside of the light emitting layer, most preferably Ir.

In formula (1a), n represents 1 or 2. In formula (1b), m represents 2 or 3. m is preferably 3, and n is preferably m−1.

In formulae (1a) and (1b), $L_a$ represents a neutral monodentate ligand, $L_b$ represents a monoanionic monodentate ligand, and $L_a$ and $L_b$ may combine with each other to form a bidentate ligand. $L_a$ and $L_b$ preferably combine with each other to form a bidentate ligand.

As for the ligand represented by $L_a$ and/or $L_b$, various ligands are known, but examples thereof include ligands described in H. Yersin, Photochemistry and Photophysics of Coordination Compounds, Springer-Verlag (1987), and Akio Yamamoto, Yuki Kinzoku Kagaku -Kiso to Oyo- (Organic Metal Chemistry—-Basic and Application—), Shokabo (1982) (for example, a halogen ligand (preferably chlorine ligand), a cyano ligand, an isocyano ligand, a phosphine ligand, a nitrogen-containing heteroaryl ligand (e.g., bipyridyl, phenanthroline), and a diketonate ligand (e.g., acetylacetone)). Diketones and picolinic acid derivatives are preferred, a 1,3-diketonate ligand is more preferred, and an acetylacetonate (acac) ligand is still more preferred.

Specific examples of the bidentate ligand formed by combining $L_a$ and $L_b$ are set forth below, but the present invention is not limited thereto.

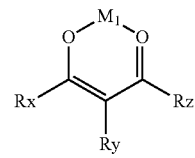

I-1

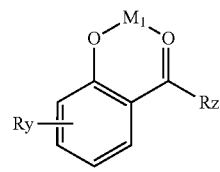

I-2

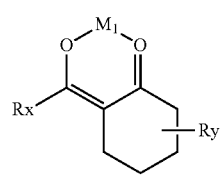

I-3

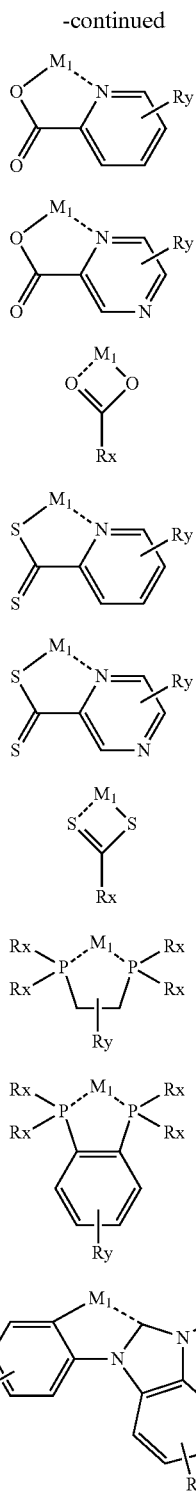

In formulae (I-1) to (I-12), each of Rx, Ry and Rz independently represents a hydrogen atom or a substituent. $M_1$ corresponds to M in formula (1a).

The substituent represented by Rx, Ry and Rz includes those described above for the substituent group Z and is preferably a hydrogen atom, a hydrocarbon substituent, $OR_{2a}$, $SR_{2a}$ or $NR_{2a}R_{2b}$, more preferably a hydrogen atom or a hydrocarbon substituent. Each of $R_{2a}$ to $R_{2b}$ is independently a hydrocarbon substituent or a hydrocarbon substituent substituted with a heteroatom. $R_{2a}$ to $R_{2b}$ may combine with each other to form a saturated or unsaturated, aromatic or non-aromatic ring. Each of Rx, Ry and Rz is preferably an alkyl group having a carbon number of 3 or less or a hydrogen atom.

As for the bidentate ligand formed by combining $L_a$ and $L_b$, among formulae (I-1) to (I-12), those represented by formulae (I-1), (I-4) and (I-12) are preferred, and a ligand represented by formula (I-1) is more preferred.

In formulae (1a) and (1b), ligands used in complexes described in the following patent documents can be suitably used:

that is, specific examples es1 to es61 set forth in paragraph [0081] of US 2008/0297033; specific examples (1) to (60), A-1 to A-204, C-1 to C-248, D-1 to D-49 and P-201 to P-339 set forth in paragraphs [0120] to [0253] of WO2008/140114; specific examples B-1 to B-146 set forth in paragraphs [0116] to [0130] of JP-A-2008-311607; specific examples DM-1-1 to DM-5-47 and P-A to P-C set forth in paragraphs [0115] to [0125] of JP-A-2008-311608; and specific examples 1-1-1 to 16-1-32 and 201 to 312 set forth in paragraphs [0147] to [0286] of JP-A-2009-102533.

In formulae (1a) and (1b), the ligand containing rings represented by $Z_1$ to $Z_3$ (in the formula, the structure on the left side of M) is preferably a monoanionic bidentate ligand represented by any one of the following (A1) to (A4):

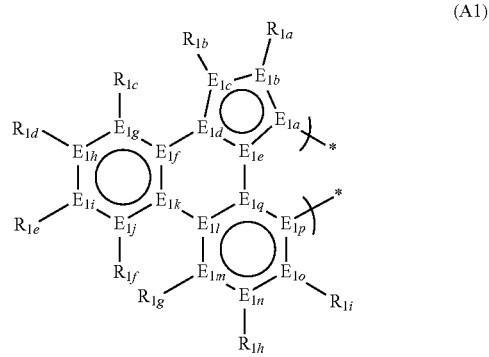

(A1)

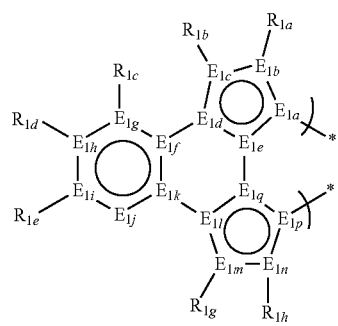

(A2)

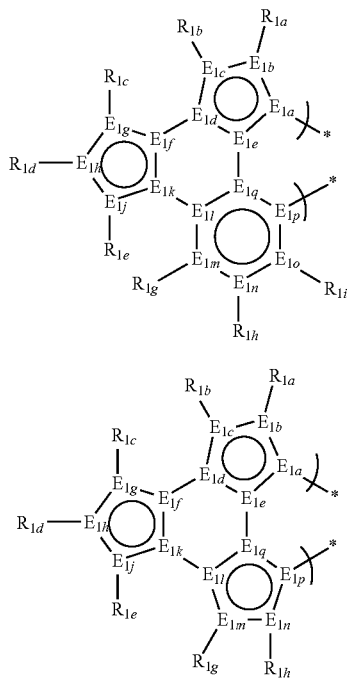

(A3)

(A4)

In formulae (A1) to (A4), each of $E_{1a}$ to $E_{1q}$ independently represents a carbon atom or a heteroatom, provided that each of $E_{1f}$ and $E_{1k}$ represents a carbon atom. Each of $R_{1a}$ to $R_{1i}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present. Each of the structures represented by formulae (A1) to (A4) has a structure with 18 π electrons in total.

Formulae (A1) to (A4) are described below.

Each of $E_{1a}$ to $E_{1q}$ independently represents a carbon atom or a heteroatom and is preferably a carbon atom or a nitrogen atom. Each of $E_{1f}$ and $E_{1k}$ represents a carbon atom.

It is preferred that one of $E_{1a}$ and $E_{1p}$ represents a carbon atom and the other represents a nitrogen atom.

The 5-membered ring formed by $E_{1a}$ to $E_{1e}$ represents a 5-membered aromatic hydrocarbon ring or heterocyclic ring but preferably represents a 5-membered heterocyclic ring. Specific examples of the 5-membered heterocyclic ring include oxazole, thiazole, isoxazole, isothiazole, pyrrole, imidazole, pyrazole, triazole and tetrazole. Among these, imidazole and pyrazole are preferred, and imidazole is more preferred.

At least one of $E_{1a}$ to $E_{1e}$ preferably represents a heteroatom; more preferably, at least one represents a nitrogen atom; and still more preferably, two members out of $E_{1a}$ to $E_{1e}$ represent a nitrogen atom. In the case where two members out of $E_{1a}$ to $E_{1e}$ represent a nitrogen atom, preferably, two members out of $E_{1a}$, $E_{1d}$ and $E_{1e}$ represent a nitrogen atom; more preferably $E_{1a}$ and $E_{1d}$, or $E_{1a}$ and $E_{1e}$ represent a nitrogen atom; and still more preferably, $E_{1a}$ and $E_{1d}$ represent a nitrogen atom.

The ring formed by $E_{1f}$ to $E_{1k}$ is a 5- or 6-membered aromatic hydrocarbon ring or heterocyclic ring, preferably a 5-membered heterocyclic ring or a 6-membered ring, still more preferably a 6-membered aromatic hydrocarbon ring. Specific examples of the ring formed by $E_{1f}$ to $E_{1k}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine and triazine. In the case of a 5-membered ring, thiophene, imidazole and pyrrole are preferred, and thiophene and imidazole are more preferred. In the case of a 6-membered ring, pyridine and benzene are preferred, and benzene is more preferred.

The ring formed by $E_{1l}$ to $E_{1q}$ is a 5- or 6-membered aromatic hydrocarbon ring or heterocyclic ring, preferably a 6-membered ring, still more preferably a 6-membered aromatic hydrocarbon ring. Specific examples of the ring formed by $E_{1l}$ to $E_{1q}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine and triazine. Among these, pyridine and benzene are preferred, and benzene is more preferred.

Each of $R_{1a}$ to $R_{1i}$ independently represents a hydrogen atom or a substituent. The substituent is selected from the substituent group Z and is preferably a hydrogen atom, a hydrocarbon substituent, a cyano group, a fluoro group, $OR_{2a}$, $SR_{2a}$, $NR_{2a}R_{2b}$, $BR_{2a}R_{2b}$ or $SiR_{2a}R_{2b}R_{2c}$. Each of $R_{2a}$ to $R_{2c}$ is independently a hydrocarbon substituent or a hydrocarbon substituent substituted with a heteroatom. Two members out of $R_{1a}$ to $R_{1i}$ and $R_{2a}$ to $R_{2c}$ may combine with each other to form a saturated or unsaturated, aromatic or non-aromatic ring. When bonded to a nitrogen atom, $R_{1a}$ to $R_{1i}$ are not present.

At least one of $R_{1a}$ to $R_{1i}$ is preferably an aryl group having a dihedral angle of 70° or more with respect to the mother structure, more preferably a substituent represented by the following formula ss-1, still more preferably a 2,6-disubstituted aryl group, and it is most preferred that $R_{1b}$ is a 2,6-disubstituted aryl group.

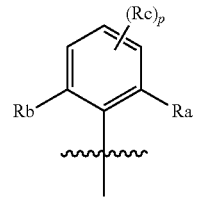

(ss-1)

In formula ss-1, each of Ra, Rb and Rc independently represents a hydrogen atom, an alkyl group or an aryl group, and p represents an integer of 0 to 3.

The alkyl group represented by Ra, Rb and Rc is preferably an alkyl group having a carbon number of 1 to 30, more preferably from 1 to 20, still more preferably from 1 to 10, and examples thereof include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl and trifluoromethyl, with a methyl group and an isopropyl group being preferred.

The aryl group represented by Ra, Rb and Rc is preferably an aryl group having a carbon number of 6 to 30, more preferably from 6 to 20, still more preferably from 6 to 12, and examples thereof include phenyl, o-methylphenyl, m-methylphenyl, p-methylphenyl, 2,6-xylyl, p-cumenyl, mesityl, naphthyl and anthranyl. Among these, a phenyl group, a 2,6-xylyl group and a mesityl group are preferred, and a phenyl group is more preferred.

At least one of Ra and Rb is preferably selected from an alkyl group and an aryl group; more preferably, at least one of Ra and Rb is selected from an alkyl group; still more preferably, both Ra and Rb are an alkyl group; and most preferably, both Ra and Rb are a methyl group or an isopropyl group.

The 2,6-disubstituted aryl group is preferably a 2,6-dimethylphenyl group, a 2,4,6-trimethylphenyl group, a 2,6-diisopropylphenyl group, a 2,4,6-triisopropylphenyl group, a 2,6-dimethyl-4-phenylphenyl group, a 2,6-dimethyl-4-(2,6-dimethylpyridin-4-yl)phenyl group, a 2,6-diphenylphenyl group, a 2,6-diphenyl-4-isopropylphenyl group, a 2,4,6-triphenylphenyl group, a 2,6-diisopropyl-4-(4-isopropylphenyl)phenyl group, a 2,6-diisopropyl-4-(3,5-dimethylphenyl)phenyl group, a 2,6-diisopropyl-4-(pyridin-4-yl)phenyl group or a 2,6-di-(3,5-dimethylphenyl)phenyl group, p is preferably 0 or 1.

In formulae (A1) to (A4), at least one of $R_{1a}$ to $R_{1i}$ is preferably an alkyl group, and more preferably, $R_{1e}$ is an alkyl group. The alkyl group is preferably an alkyl group composed of 4 or more carbon atoms and branched at a site distant from the benzyl position, more preferably a methyl group or a neopentyl group, still more preferably a neopentyl group.

At least one of $R_{1a}$ and $R_{1b}$ is preferably an electron-donating substituent; more preferably, $R_{1a}$ is an electron-donating substituent; still more preferably, $R_{1a}$ is an alkyl group; and most preferably, $R_{1a}$ is a methyl group.

The monoanionic bidentate ligand represented by formulae (A1) to (A4) is preferably a monoanionic bidentate ligand represented by formula (A1) or (A3):

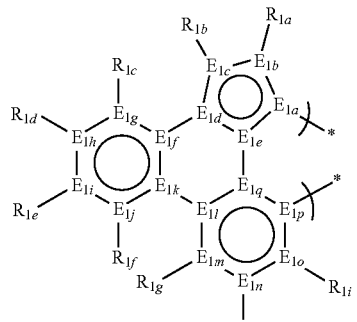

(A1)

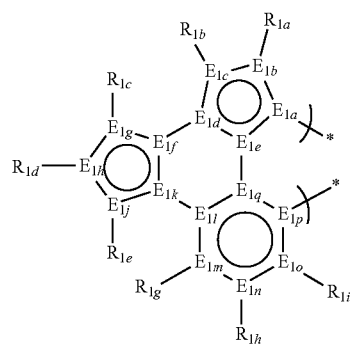

(A3)

In formulae (A1) and (A3), each of $E_{1a}$ to $E_{1q}$ independently represents a carbon atom or a heteroatom, provided that each of $E_{1f}$ and $E_{1k}$ represents a carbon atom. Each of $R_{1a}$ to $R_{1i}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present. Each of the structures represented by formulae (A1) and (A3) has a structure with 18 π electrons in total.

The bidentate ligand represented by formula (A1) or (A3) is preferably a monoanionic bidentate ligand represented by formula (A1-1) or (A3-1):

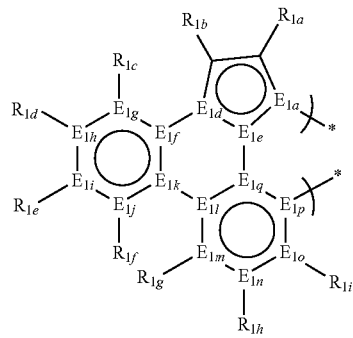

(A1-1)

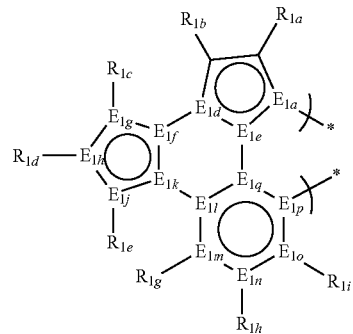

(A3-1)

In formulae (A1-1) and (A3-1), each of $E_{1a}$, $E_{1d}$ and $E_{1e}$ to $E_{1q}$ independently represents a carbon atom or a heteroatom. Each of $R_{1a}$ to $R_{1i}$ independently represents a hydrogen atom or a substituent, provided that when each of $E_{1g}$ to $E_{1j}$ and $E_{1m}$ to $E_{1o}$ represents a nitrogen atom, $R_{1c}$ to $R_{1i}$ bonded thereto are not present. Each of the structures represented by formulae (A1-1) and (A3-1) has a structure with 18 π electrons in total.

In formulae (A1-1) and (A3-1), preferred embodiments of $E_{1a}$, $E_{1d}$, $E_{1e}$ to $E_{1q}$ and $R_{1a}$ to $R_{1i}$ are the same as those of $E_{1a}$, $E_{1d}$, $E_{1e}$ to $E_{1q}$ and $R_{1a}$ to $R_{1i}$ in formulae (A1) and (A3).

In the present invention, a monoanionic bidentate ligand represented by formula (A1-1) is more preferred.

The bidentate ligand represented by formula (A1-1) or (A3-1) is preferably a monoanionic bidentate ligand represented by the following formula (A1-2) or (A3-2):

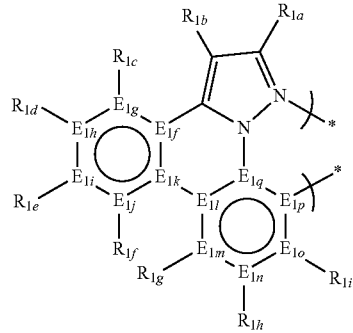

(A1-2)

-continued (A3-2)

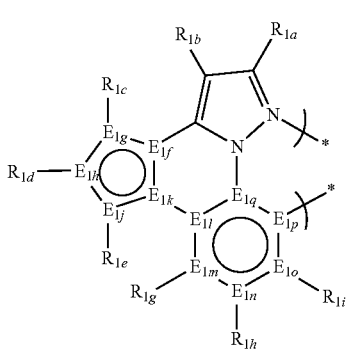

In formulae (A1-2) and (A3-2), each of $E_{1l}$ to $E_{1q}$ independently represents a carbon atom or a heteroatom. Each of $R_{1a}$ to $R_{1i}$ independently represents a hydrogen atom or a substituent, provided that when each of $E_{1g}$ to $E_{1j}$ and $E_{1m}$ to $E_{1o}$ represents a nitrogen atom, $R_{1c}$ to $R_{1i}$ bonded thereto are not present. Each of the structures represented by formulae (A1-2) and (A3-2) has a structure with 18 π electrons in total.

In formulae (A1-2) and (A3-2), preferred embodiments of $E_{1l}$ to $E_{1q}$ and $R_{1a}$ to $R_{1i}$ are the same as those of $E_{1l}$ to $E_{1q}$ and $R_{1a}$ to $R_{1i}$ in formulae (A1-1) and (A3-1).

The monoanionic bidentate ligand represented by formula (A1-1) or (A3-1) is more preferably a monoanionic bidentate ligand represented by formula (A1-3) or (A3-3):

(A1-3)

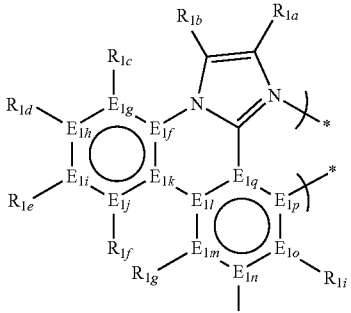

(A3-3)

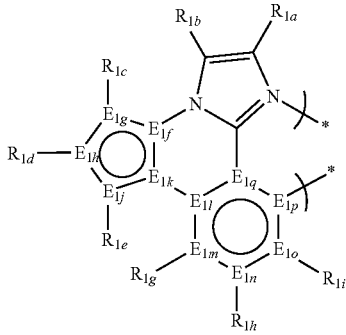

In formulae (A1-3) and (A3-3), each of $E_{1l}$ to $E_{1q}$ independently represents a carbon atom or a heteroatom. Each of $R_{1a}$ to $R_{1i}$ independently represents a hydrogen atom or a substituent, provided that when each of $E_{1g}$ to $E_{1j}$ and $E_{1m}$ to $E_{1o}$ represents a nitrogen atom, $R_{1a}$ to $R_{1i}$ bonded thereto are not present. Each of the structures represented by formulae (A1-3) and (A3-3) has a structure with 18 π electrons in total.

In formulae (A1-3) and (A3-3), preferred embodiments of $E_{1l}$ to $E_{1q}$ and $R_{1a}$ to $R_{1i}$ are the same as those of $E_{1l}$ to $E_{1q}$ and $R_{1a}$ to $R_{1i}$ in formulae (A1-1) and (A3-1).

The monoanionic bidentate ligand represented by formula (A1-3) or (A3-3) is more preferably a monoanionic bidentate ligand represented by formula (A1-4) or (A3-4):

(A1-4)

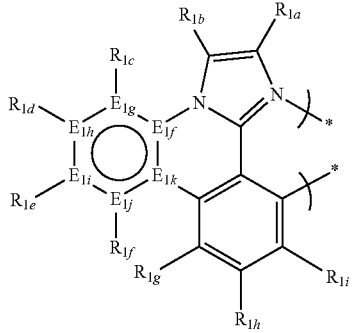

(A3-4)

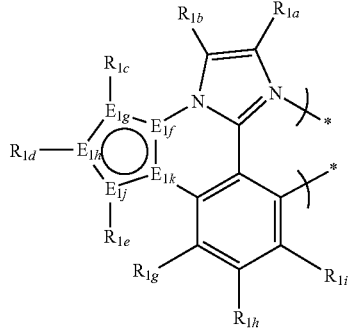

In formulae (A1-4) and (A3-4), each of $E_{1f}$ to $E_{1k}$ independently represents a carbon atom or a heteroatom. Each of $R_{1a}$ to $R_{1i}$ independently represents a hydrogen atom or a substituent, provided that when each of $E_{1g}$ to $E_{1j}$ represents a nitrogen atom, $R_{1c}$ to $R_{1f}$ bonded thereto are not present. Each of the structures represented by formulae (A1-4) and (A3-4) has a structure with 18 π electrons in total.

The monoanionic bidentate ligand represented by formulae (A1-4) or (A3-4) is preferably a bidentate ligand represented by the following formula (A9):

(A9)

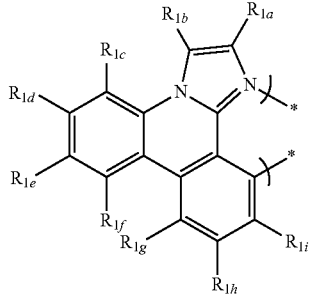

In formula (A9), each of $R_{1a}$ to $R_{1i}$ independently represents a hydrogen atom or a substituent.

In formula (A9), the definitions of $R_{1a}$ to $R_{1i}$ are the same as those of $R_{1a}$ to $R_{1i}$ in formulae (A1-4) and (A3-4), and preferred ranges are also the same.

The bidentate ligand represented by formula (A9) is preferably a bidentate ligand represented by formula (A10):
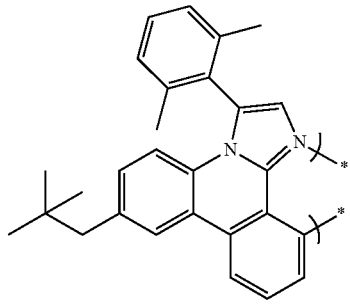
(A10)
Specific preferred structures of formula (A1) are set forth below. Among these, (X-1) and (X-33) are preferred, and (X-1) is most preferred.
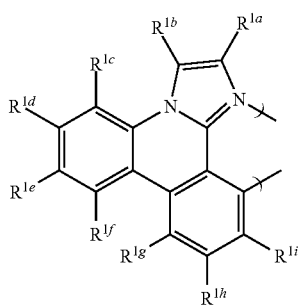
X-1
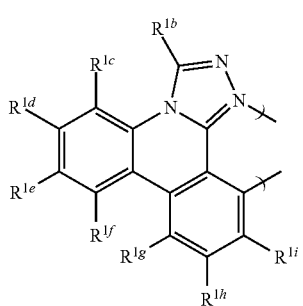
X-2
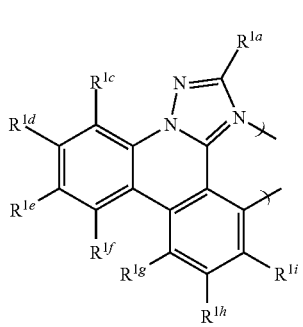
X-3
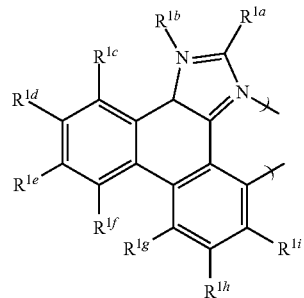
X-4
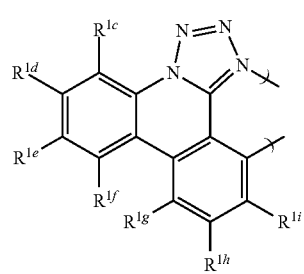
X-5
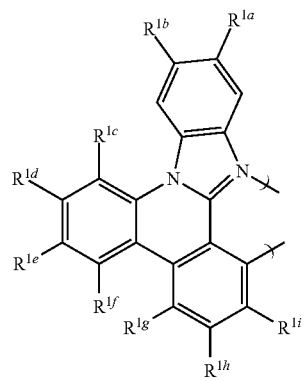
X-6
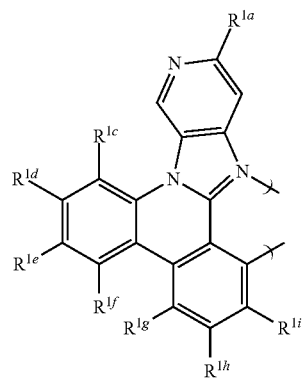
X-7

-continued
X-8
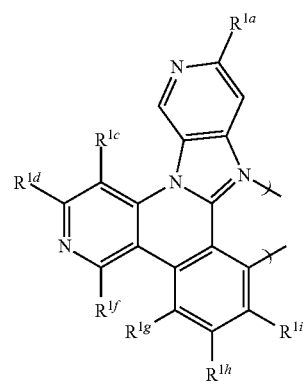
X-9
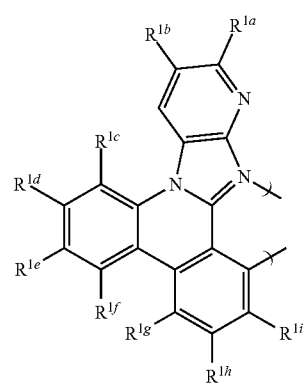
X-10
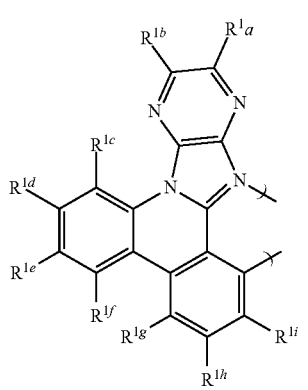
X-11
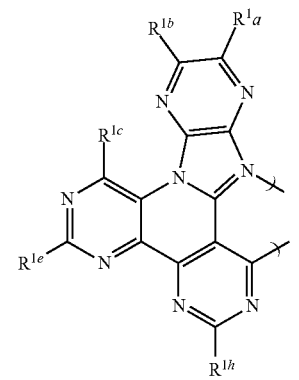
-continued
X-12
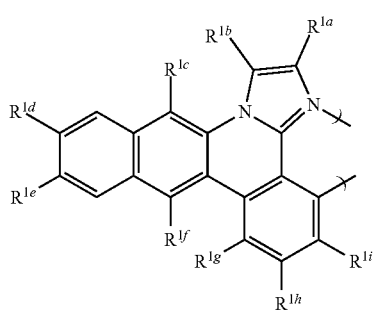
X-13
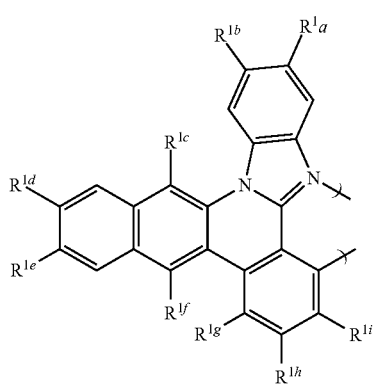
X-14
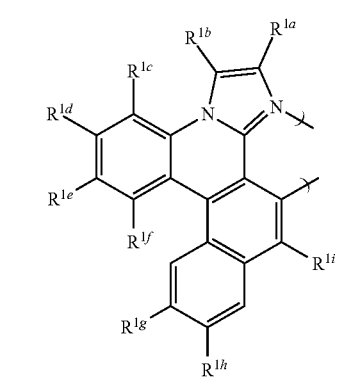
X-15
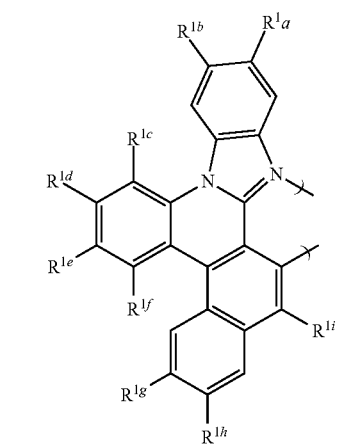

-continued
X-16
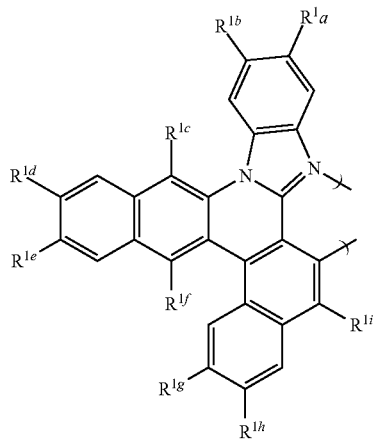
X-17
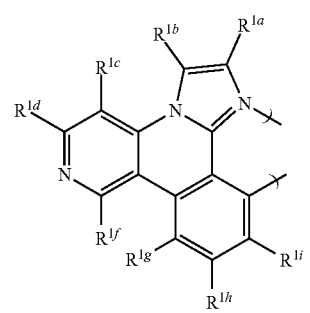
X-18
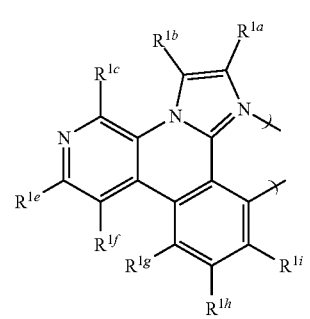
X-19
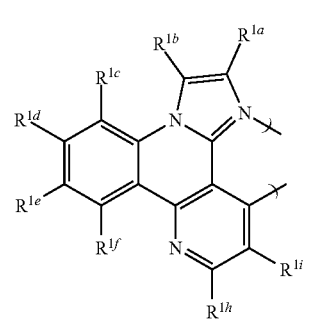
-continued
X-20
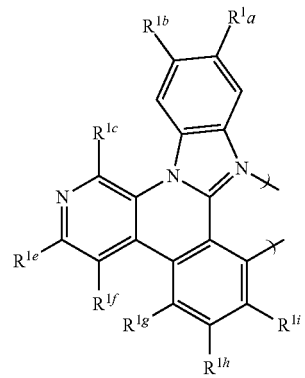
X-21
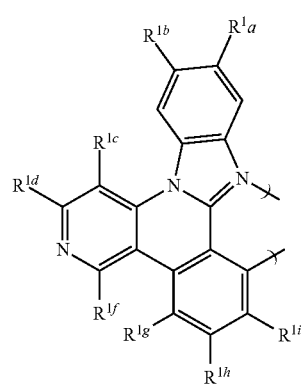
X-22
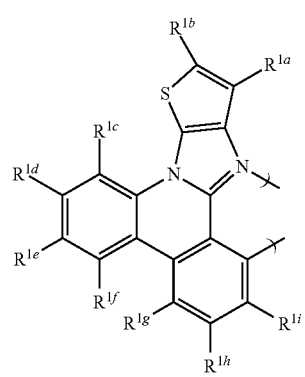
X-23
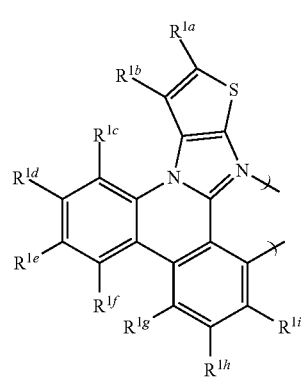

X-24
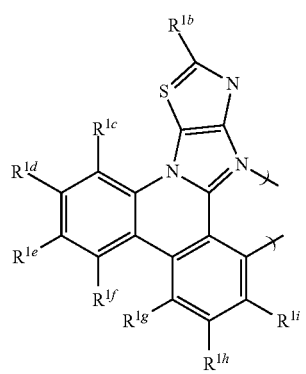
X-25
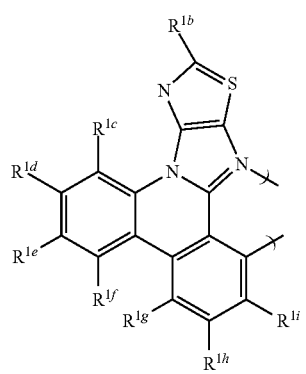
X-26
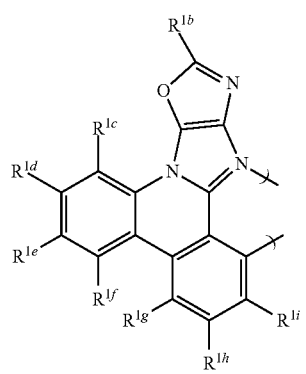
X-27
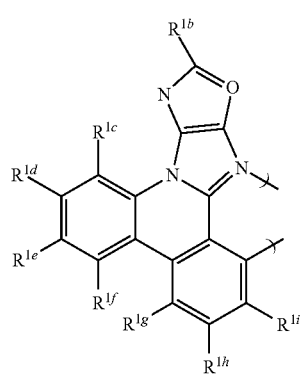
X-28
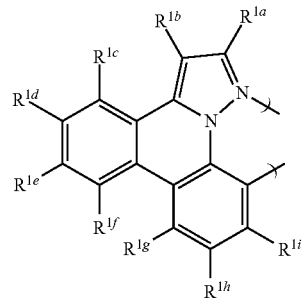
X-29
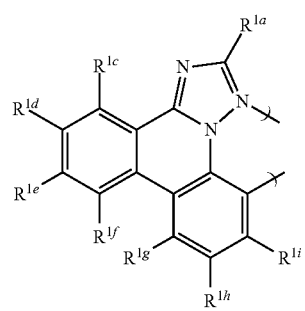
X-30
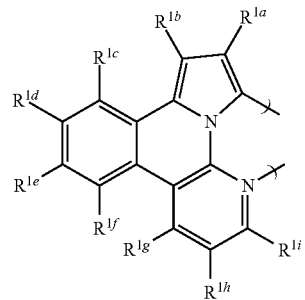
X-31
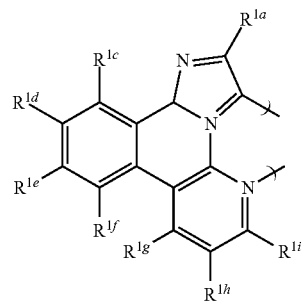
X-32
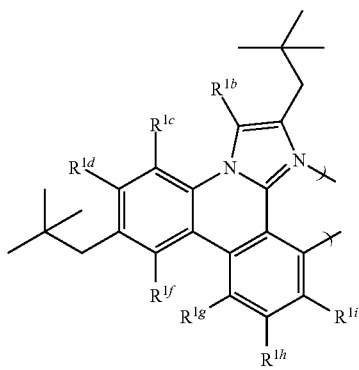

-continued
X-33
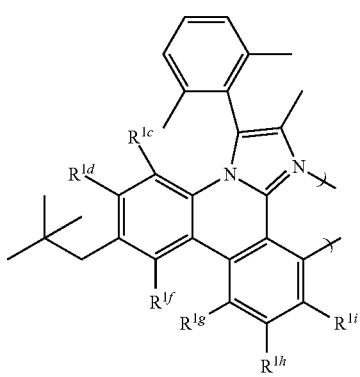
X-34
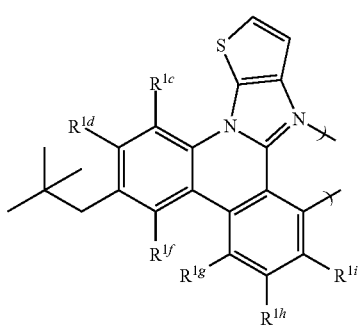
X-35
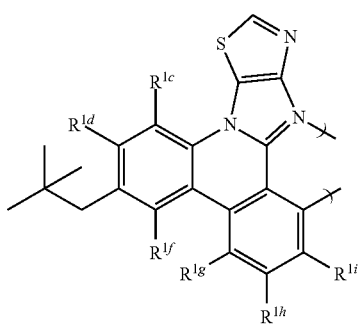
X-36
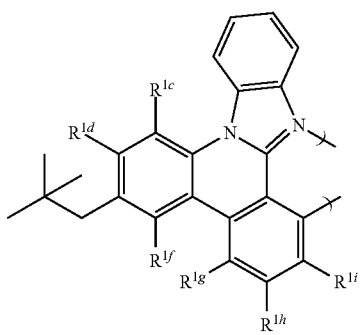
-continued
X-37
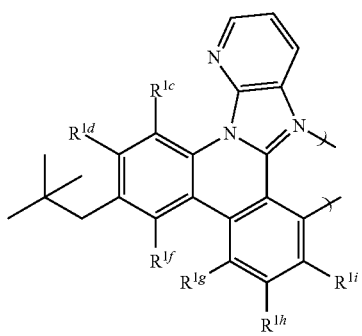
X-38
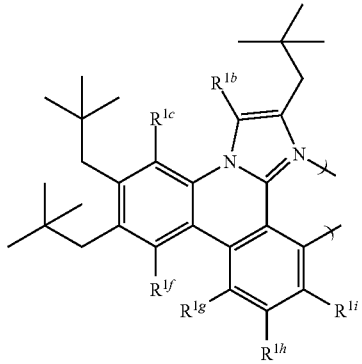
X-39
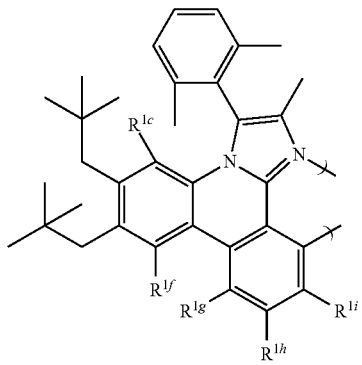
X-40
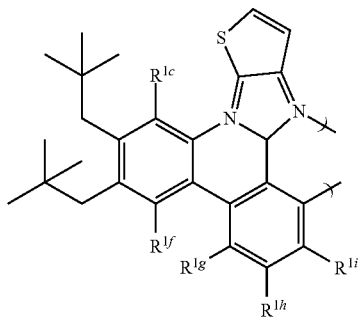

-continued
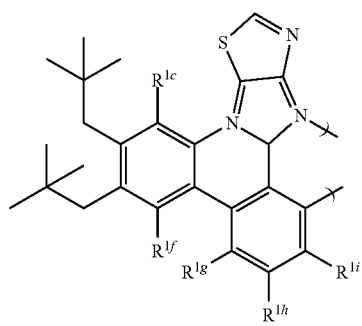
X-41
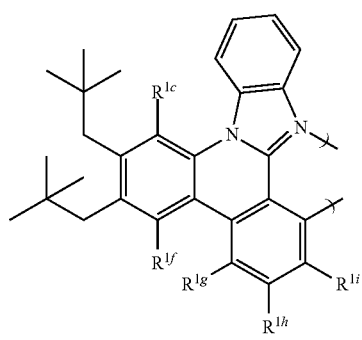
X-42
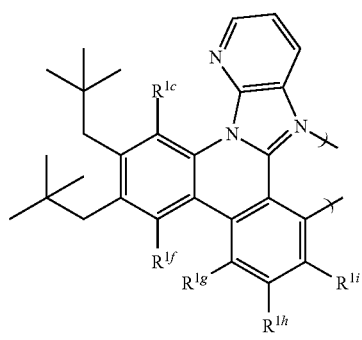
X-43
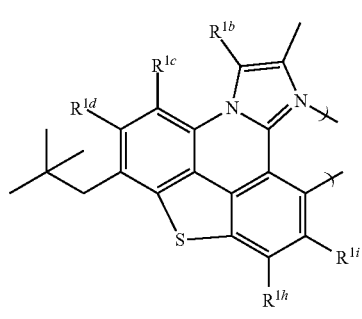
X-44
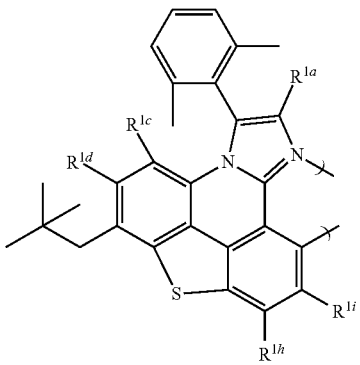
X-45
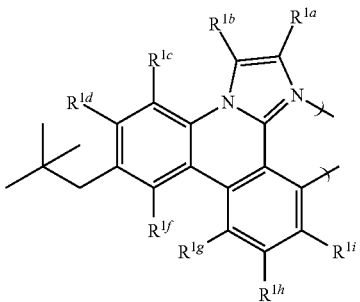
X-46
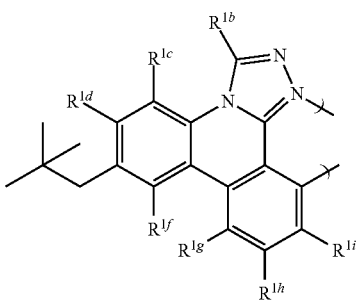
X-47
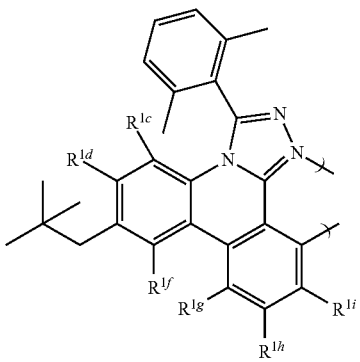
X-48
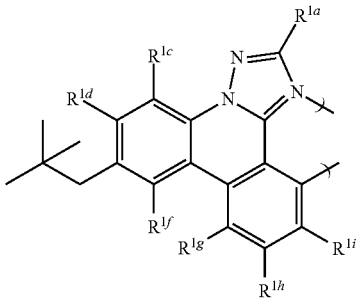
X-49

X-50
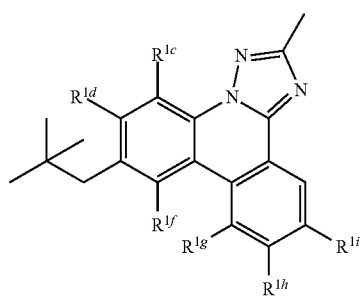
X-51
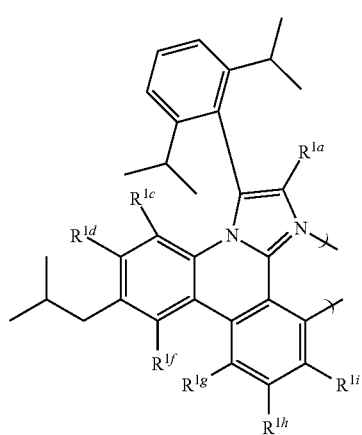
X-52
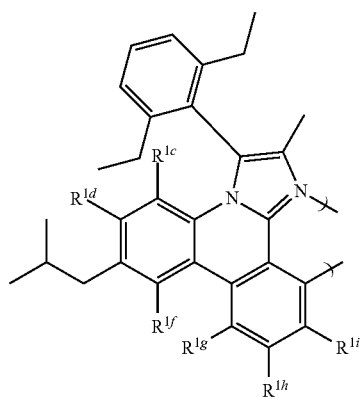
X-53
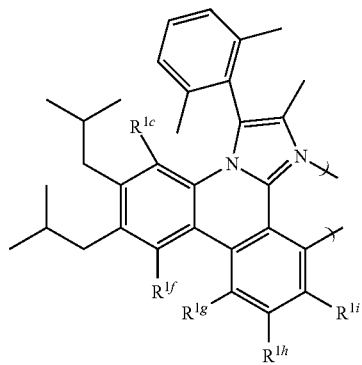
X-54
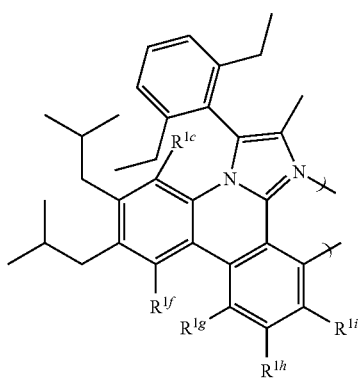
X-55
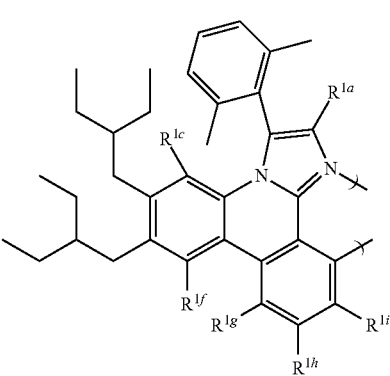
X-56
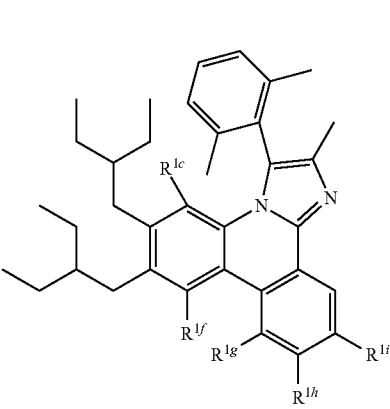
X-57
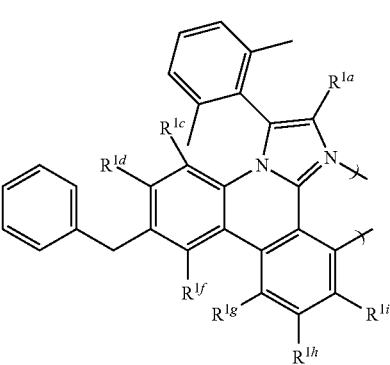

-continued
X-58
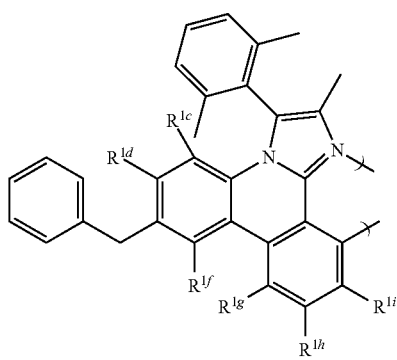
X-59
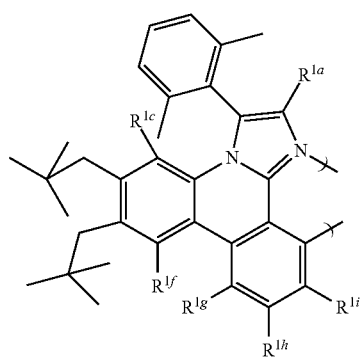
X-60
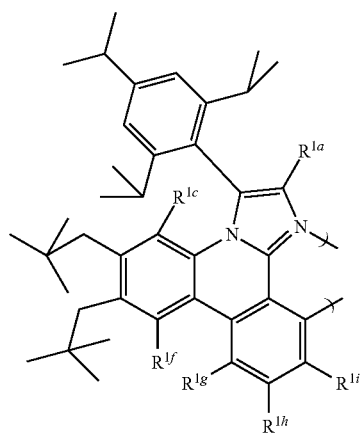
X-61
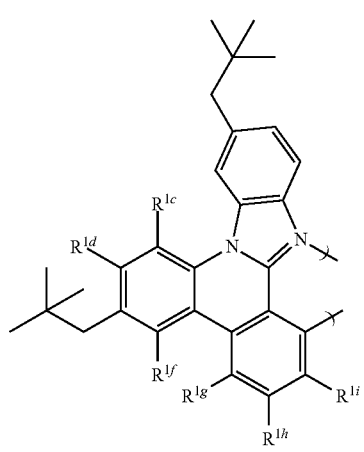
-continued
X-62
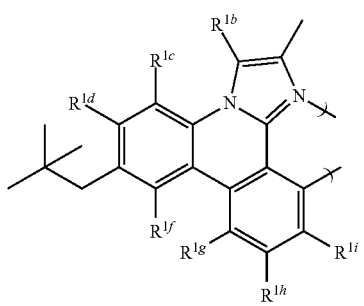
X-63
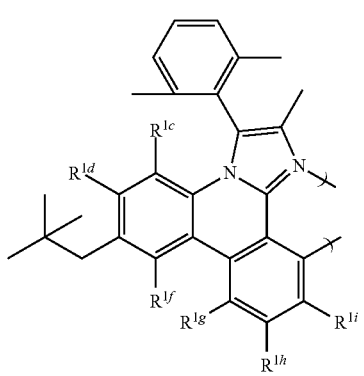
X-64
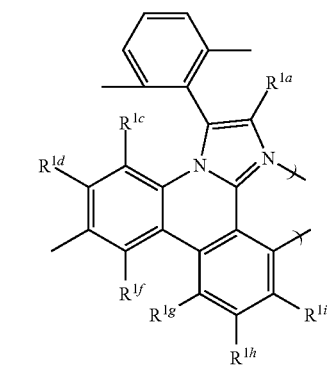
X-65
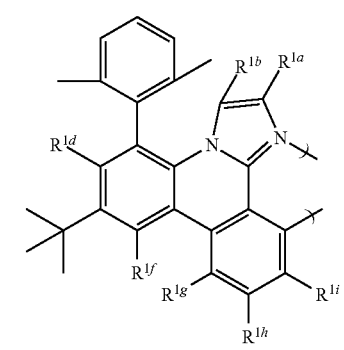

-continued

X-66
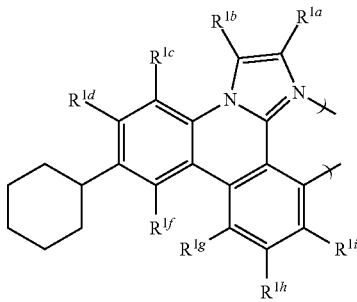

X-67
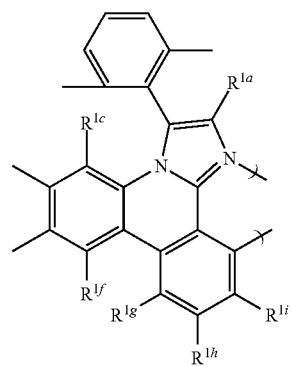

X-68
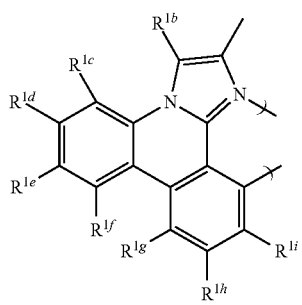

In specific examples (X-1) to (X-68), each of $R_{1a}$ to $R_{1i}$ has the same meaning as in formula (A1) and is preferably a hydrogen atom or an alkyl group, most preferably a hydrogen atom.

The monoanionic bidentate ligands represented by formulae (A1) to (A4) can be synthesized by various methods such as methods described in US2007/0190359 and US2008/0297033.

In view of luminous efficiency of the device using the material of the present invention and the maintenance of luminous efficiency at high-temperature driving, the compounds represented by formulae (1a) and (1b) are preferably compounds represented by formula (2a) and formula (2b), respectively.

(2a)
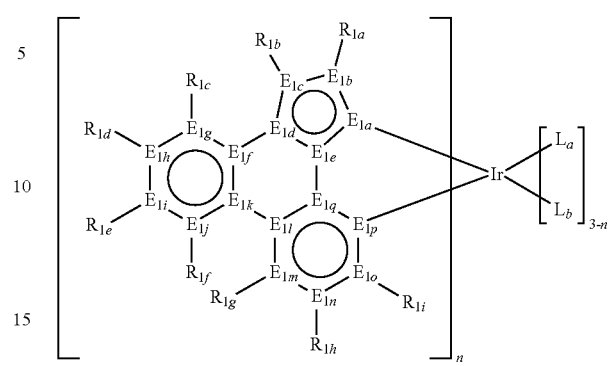

(2b)
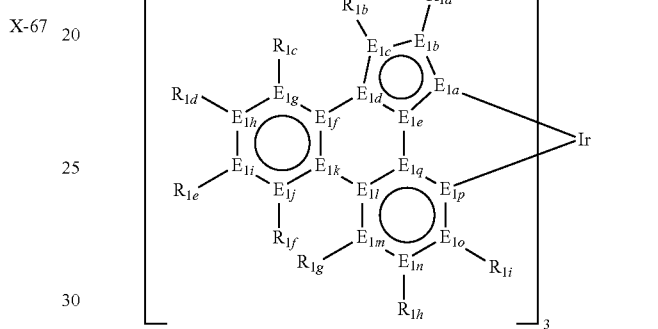

In formulae (2a) and (2b), each of $E_{1a}$ to $E_{1q}$ independently represents a carbon atom or a heteroatom, provided that while one of $E_{1a}$ and $E_{1p}$ represents a carbon atom, the other represents a nitrogen atom and each of $E_{1f}$ and $E_{1k}$ represents a carbon atom. Each of $R_{1a}$ to $R_{1i}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present. $L_a$, $L_b$ and n have the same meanings as in formula (1a). In each of formula (2a) and formula (2b), the ligand containing $E_{1a}$ to $E_{1q}$ has a structure with 18 π electrons in total.

In formulae (2a) and (2b), the definitions of $E_{1a}$ to $E_{1q}$ and $R_{1a}$ to $R_{1i}$ are the same as those of $E_{1a}$ to $E_{1q}$ and $R_{1a}$ to $R_{1i}$ in formula (A1), and preferred ranges are also the same.

The compounds represented by formulae (2a) and (2b) are preferably compounds represented by formula (3a) and formula (3b), respectively.

(3a)
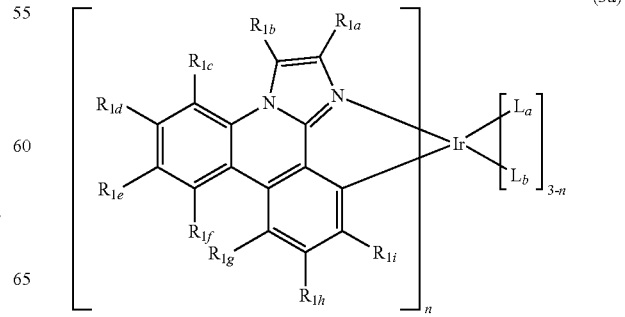

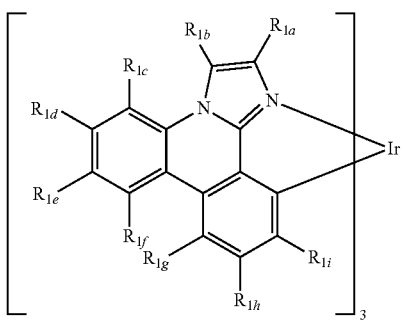

(3b)

In formulae (3a) and (3b), the definitions of $R_{1a}$ to $R_{1i}$ are the same as those of $R_{1a}$ to $R_{1i}$ in formula (A9), and preferred ranges are also the same.

The compound represented by formula (3a) is preferably a compound represented by formula (3a-1).

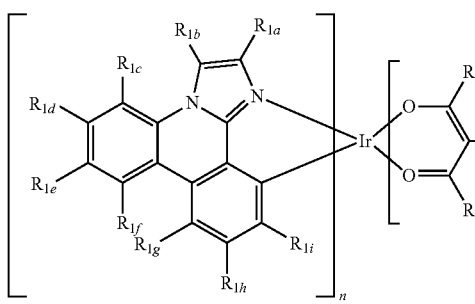

(3a-1)

In formula (3a-1), $R_{1a}$ to $R_{1i}$ have the same meanings as in formula (2a), n has the same meaning as in formula (1a), and each of $R_{2a}$ to $R_{2c}$ independently represents a hydrogen atom or a substituent and is preferably a hydrogen atom, a hydrocarbon substituent, $OR_{2a}$, $SR_{2a}$ or $NR_{2a}R_{2b}$, more preferably a hydrogen atom or a hydrocarbon substituent having a carbon number of 6 or less. Two members out of $R_{2a}$ to $R_{2c}$ may combine with each other to form a saturated or unsaturated, aromatic or non-aromatic ring.

In formula (3a-1), the definitions of $R_{1a}$ to $R_{1i}$ are the same as those of $R_{1a}$ to $R_{1i}$ in formula (A9), and preferred ranges are also the same.

The compound represented by formula (3a-1) is preferably a compound represented by formula (3a-2).

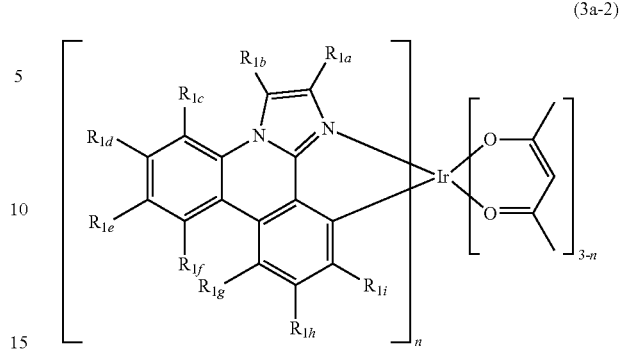

(3a-2)

In formula (3a-2), $R_{1a}$ to $R_{1i}$ have the same meanings as in formula (2a), and n has the same meaning as in formula (1a).

In formula (3a-2), the definitions of $R_{1a}$ to $R_{1i}$ are the same as those of $R_{1a}$ to $R_{1i}$ in formula (A9), and preferred ranges are also the same.

The compound represented by formula (3a-2) is preferably a compound represented by formula (3a-3). In the case where the material of the present invention uses the compound represented by formula (3a-3), production of the material is easy and also in this viewpoint, the compound represented by formula (3a-3) is preferred.

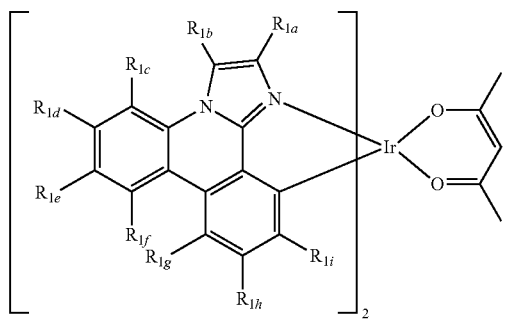

(3a-3)

In formula (3a-3), $R_{1a}$ to $R_{1i}$ have the same meanings as in formula (2a).

In formula (3a-3), the definitions of $R_{1a}$ to $R_{1i}$ are the same as those of $R_{1a}$ to $R_{1i}$ in formula (A9), and preferred ranges are also the same.

From the standpoint of improving the emission hue of the device using the material of the present invention, the compounds represented by formulae (1a) and (1b) are also preferably compounds represented by formula (4a) and formula (4b), respectively.

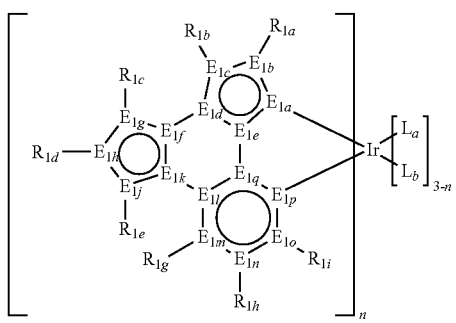

(4a)

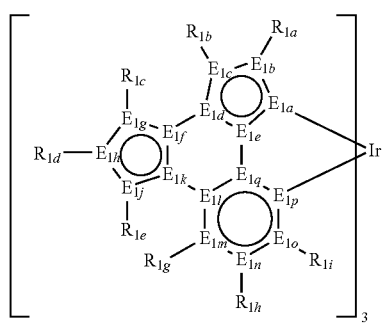

(4b)

In formulae (4a) and (4b), each of $E_{1a}$ to $E_{1q}$ independently represents a carbon atom or a heteroatom, provided that each of $E_{1f}$ and $E_{1k}$ represents a carbon atom. Each of $R_{1a}$ to $R_{1h}$ independently represents a hydrogen atom or a substituent, provided that when each of $E_{1b}$, $E_{1c}$, $E_{1g}$ to $E_{1j}$ and $E_{1m}$ to $E_{1o}$ represents a nitrogen atom, $R_{1a}$ to $R_{1i}$ bonded thereto are not present. $L_a$, $L_b$ and n have the same meanings as in formula (1a). In each of formula (4a) and formula (4b), each of the structures represented by $E_{1a}$ to $E_{1q}$ has a structure with 18 π electrons in total.

In formulae (4a) and (4b), the definitions of $E_{1a}$ to $E_{1q}$ and $R_{1a}$ to $R_{1i}$ are the same as those of $E_{1a}$ to $E_{1q}$ and $R_{1a}$ to $R_{1i}$ in formula (A2), and preferred ranges are also the same.

The compounds represented by formulae (1a), (2a), (3a), (3a-1) to (3a-3), (4a) and (4b) can be synthesized by various methods such as methods described in JP-A-2008-311607, WO02/15645 and WO2008/140114. Also, the compounds represented by formulae (1b), (2b), (3b) and (4b) can be synthesized by various methods such as methods described in US2007/0190359 and US2008/0297033.

For example, a ligand or a dissociation product thereof and a metal compound are reacted with or without a solvent (for example, a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent or water) in the presence or absence of a base (various inorganic or organic bases, for example, sodium methoxide, tert-butoxy potassium, triethylamine or potassium carbonate) at not higher than room temperature or under heating (in addition to normal heating, microwave heating is also effective), whereby the compound can be obtained.

In an organic electroluminescence device, the material of the present invention may be contained in any layer of the organic layer but is preferably incorporated as a phosphorescent material into a light emitting layer.

Specific examples of the compounds represented by formulae (1a), (2a), (3a), (3a-1) to (3a-3) and (4a) and the material for organic electroluminescence devices containing such a compound are set forth below, but the present invention is not limited thereto.

In specific examples below, each bond between a metal and a ligand is independently a covalent bond or a coordinate bond. In the case where specific examples are a compound represented by formula (1a), (2a), (3a), (3a-1) to (3a-3) and (4a), n is 1 or 2.

1

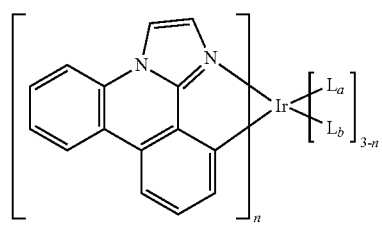

2

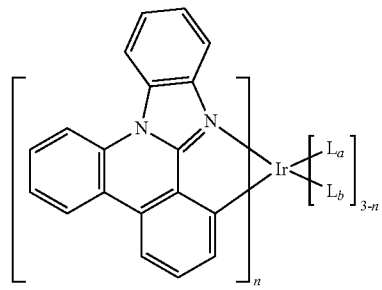

3

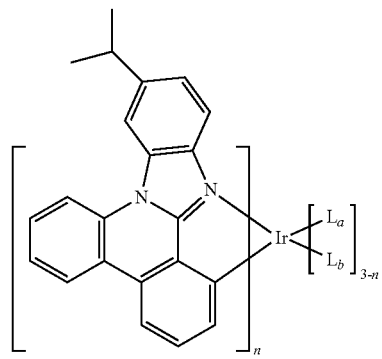

4

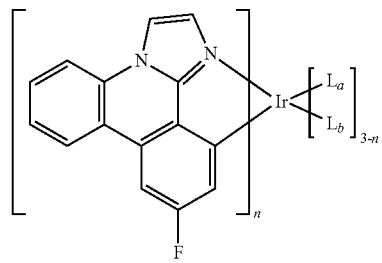

5

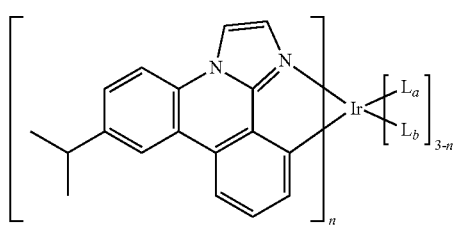

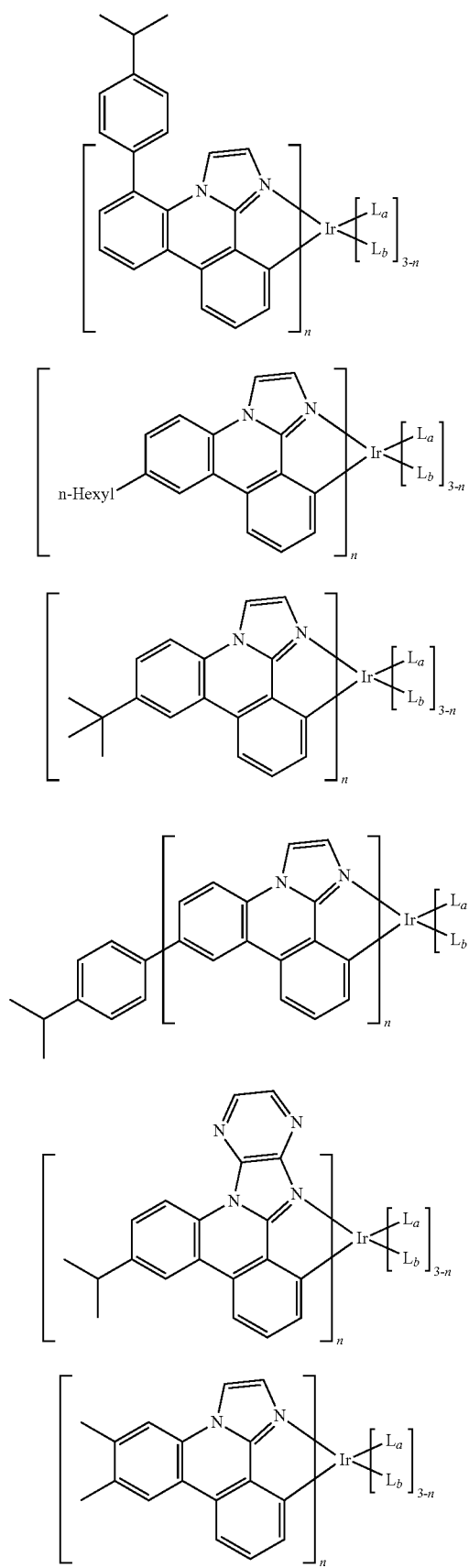
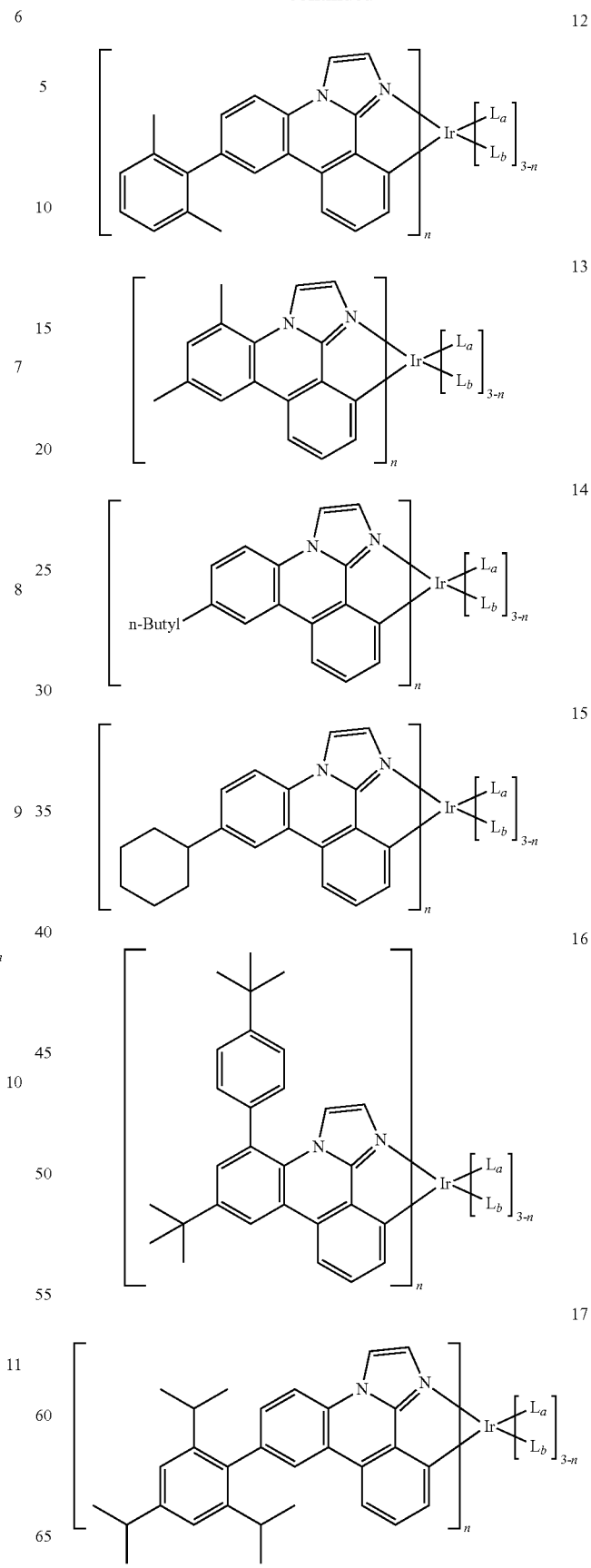

18
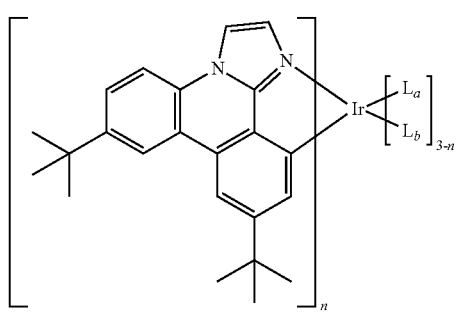
19
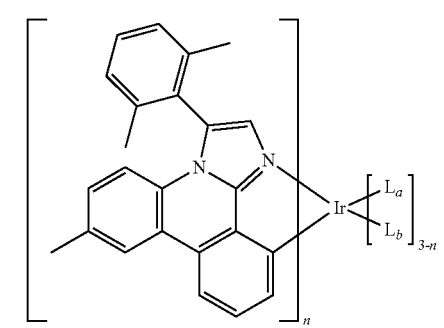
20
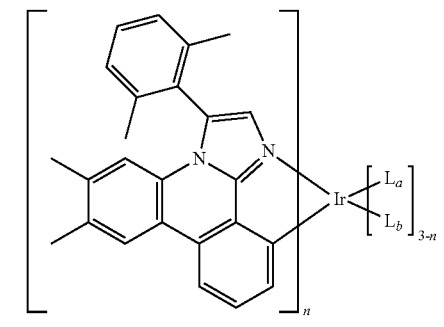
21
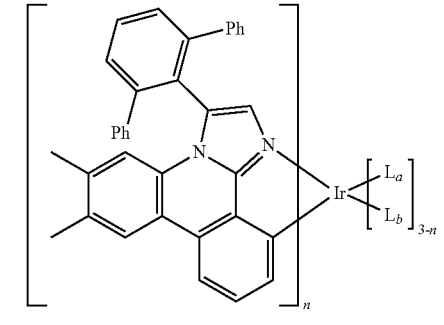
22
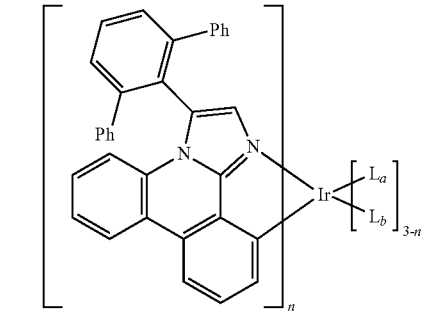
23
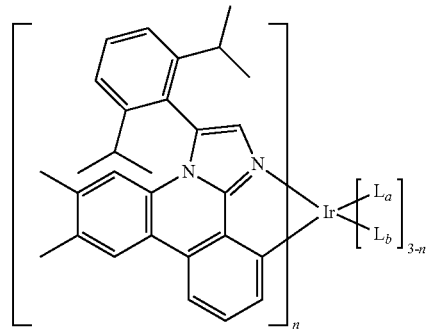
24
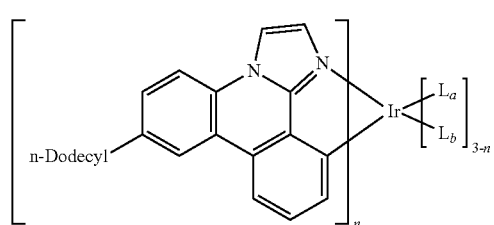
25
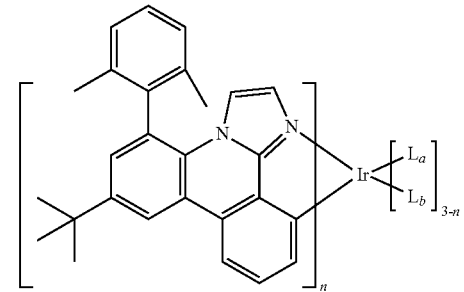
26
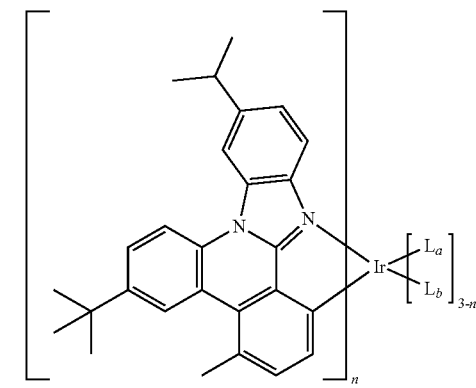
27
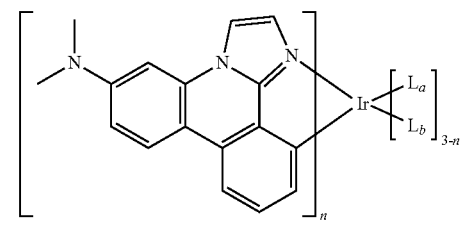

28
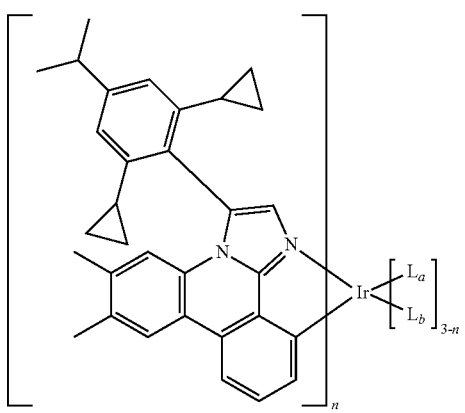
29
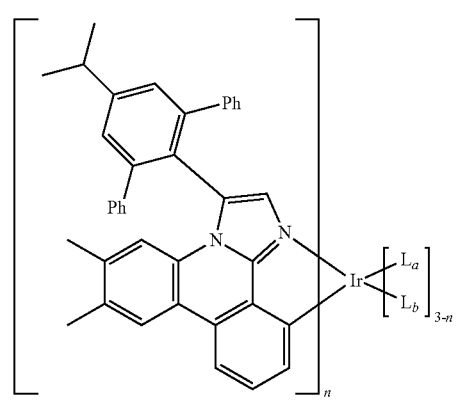
30
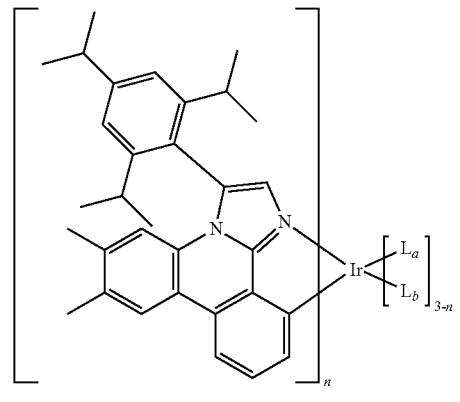
31
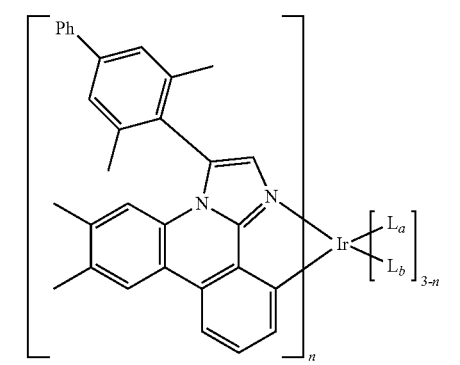
32
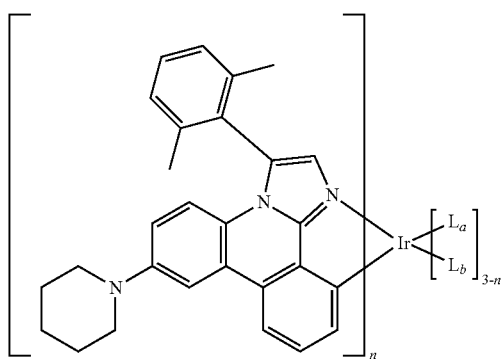
33
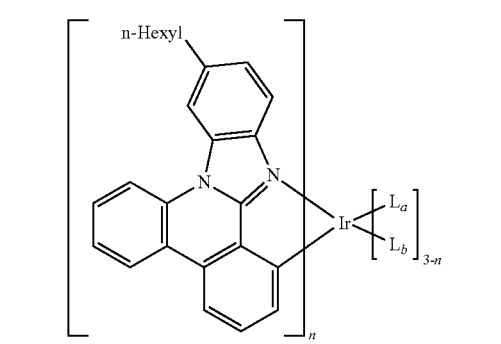
34
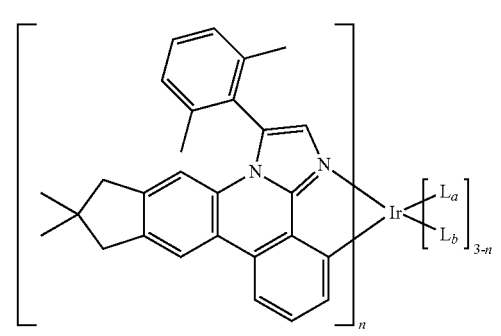
35
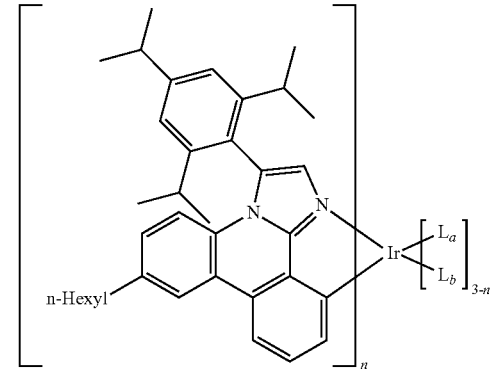

36
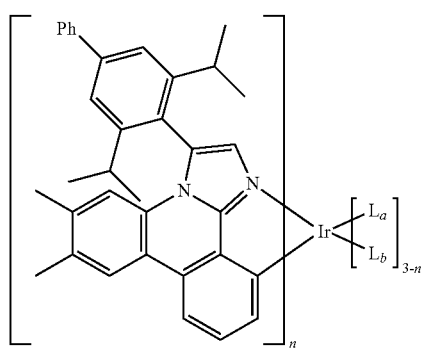
37
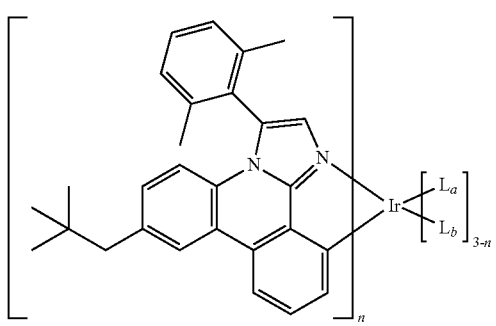
38
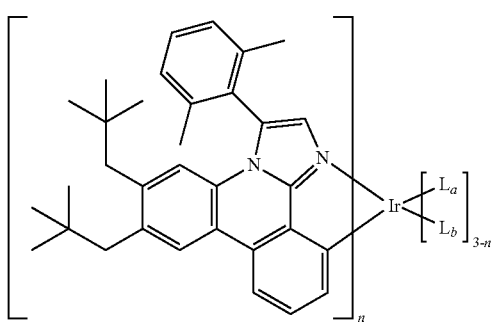
39
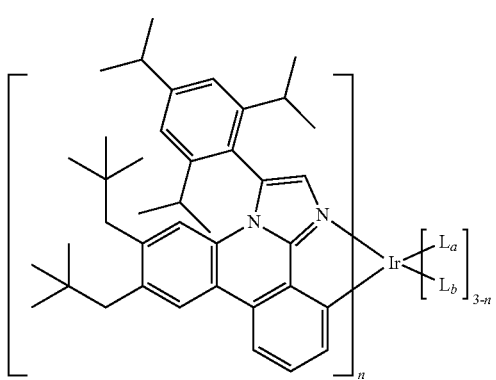
40
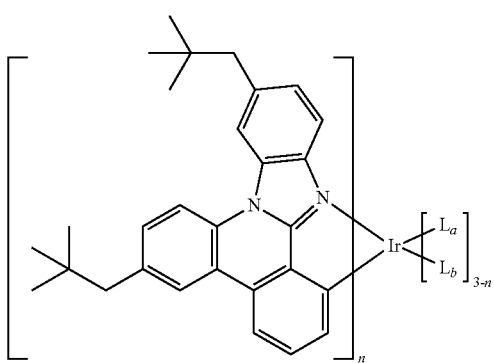
41
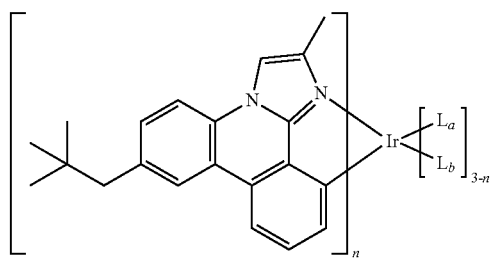
42
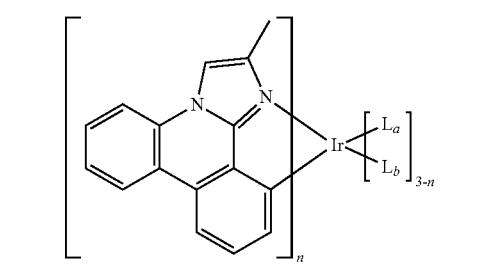
43
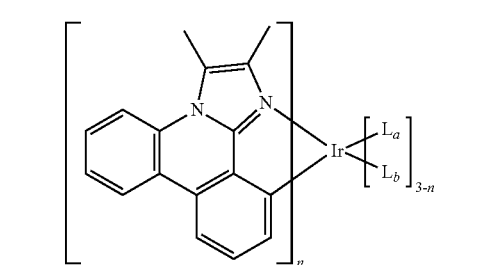
44
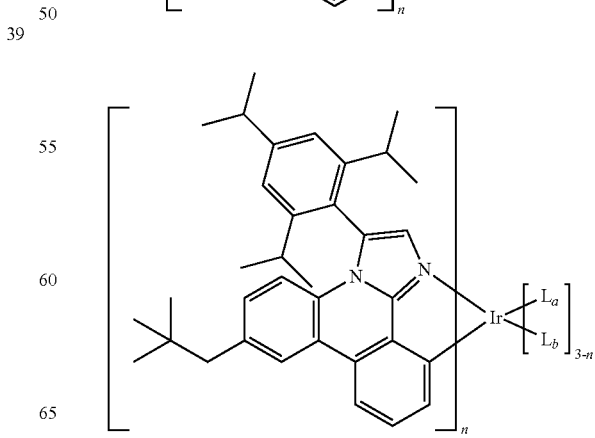

45
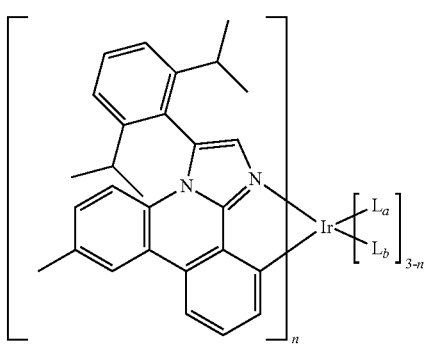
46
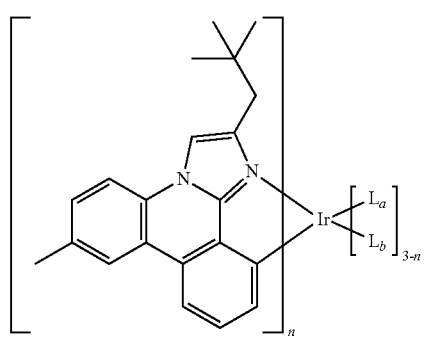
47
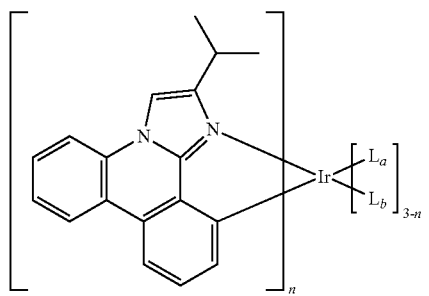
48
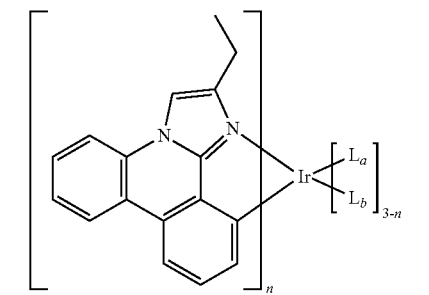
49
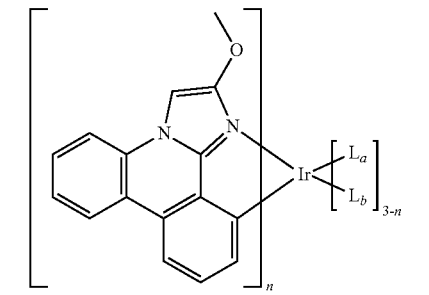
50
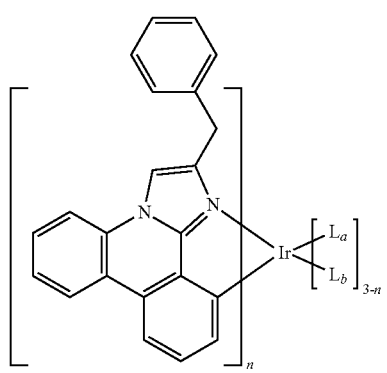
51
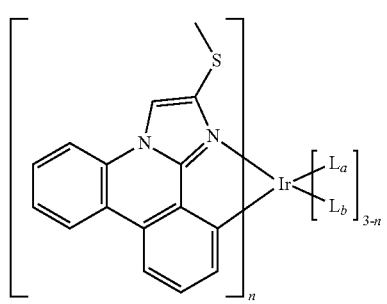
52
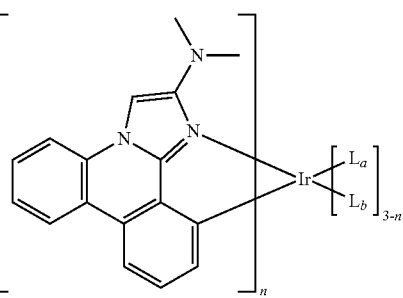
53
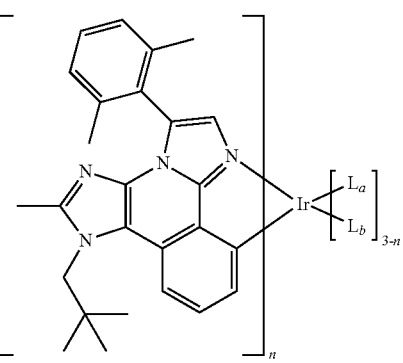

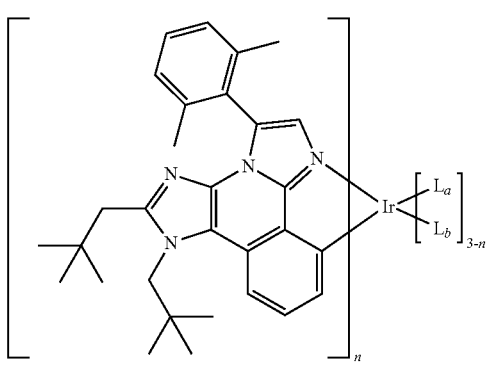
54
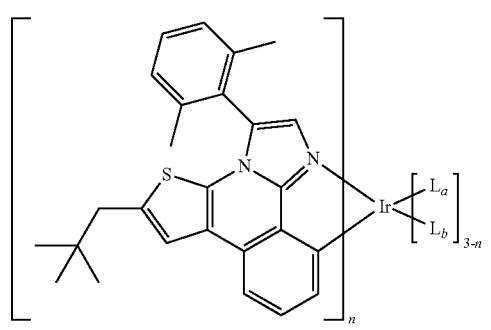
55
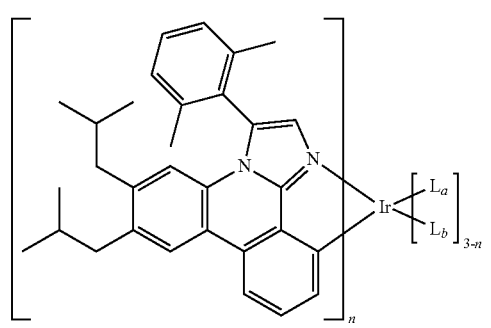
56
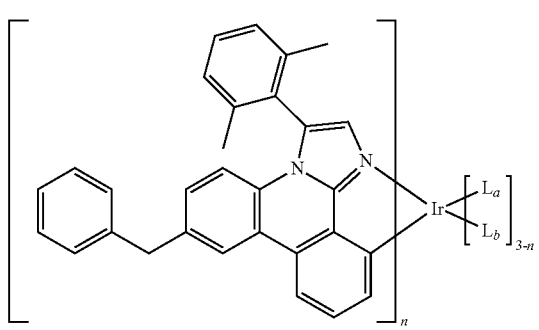
57
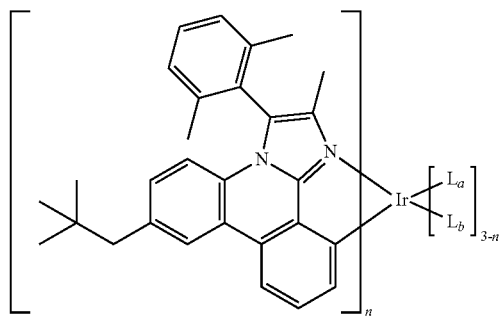
58
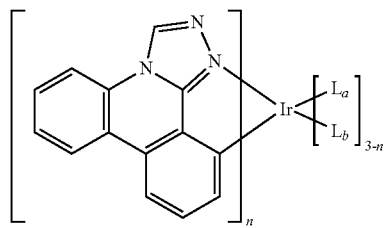
59
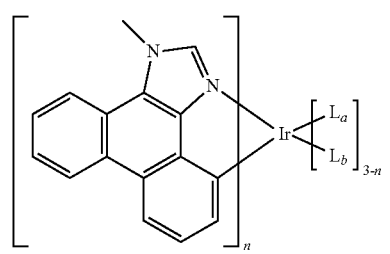
60
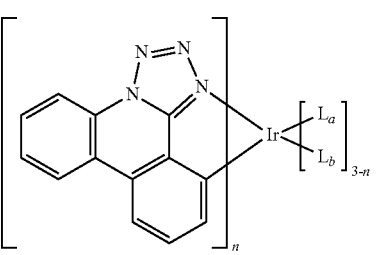
61
62
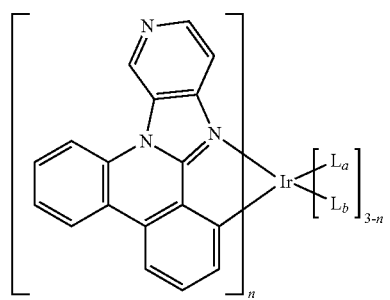
63

64
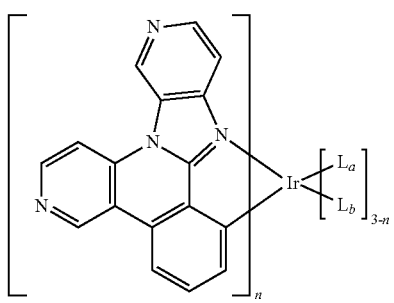
65
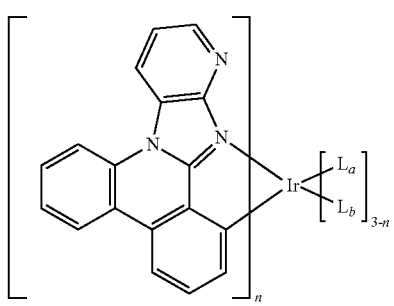
66
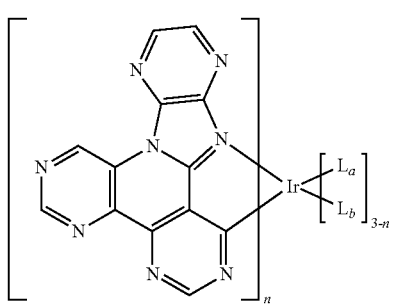
67
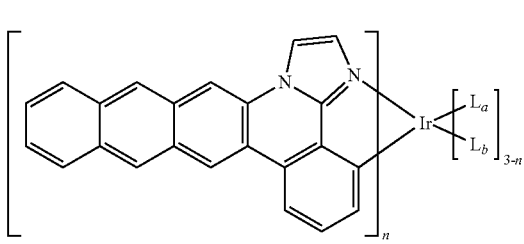
68
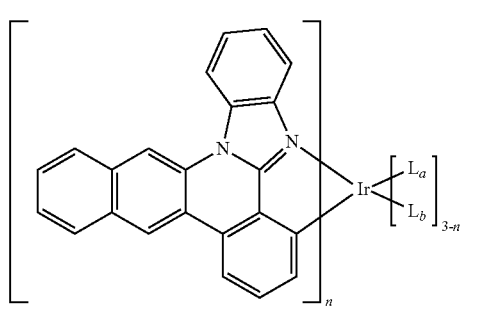
69
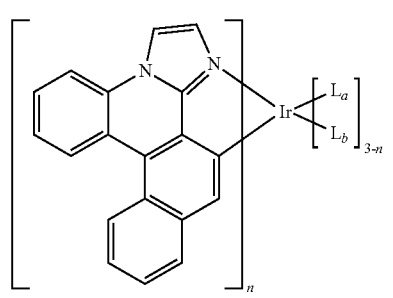
70
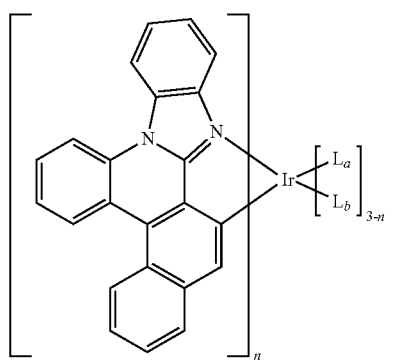
71
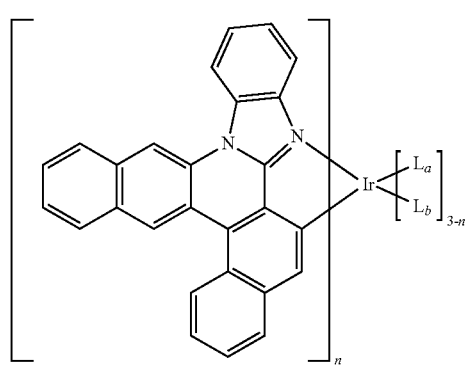
72
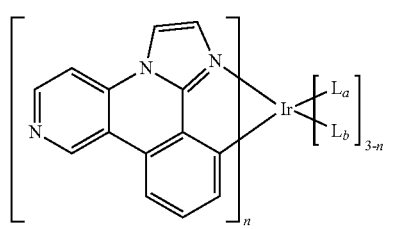
73
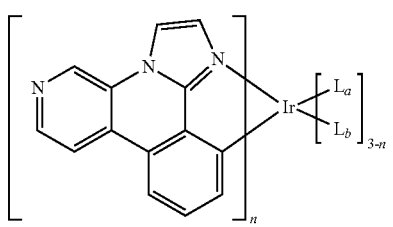

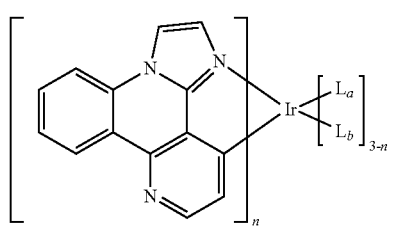
74
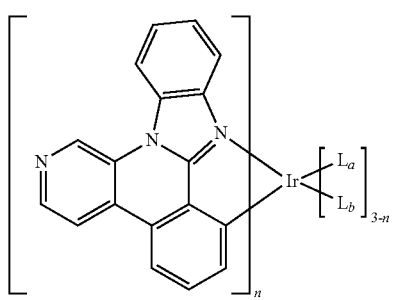
75
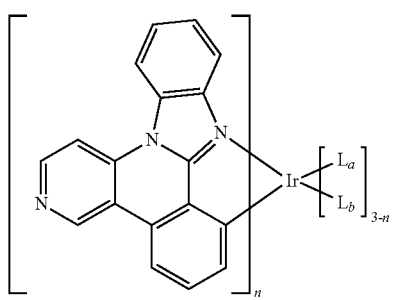
76
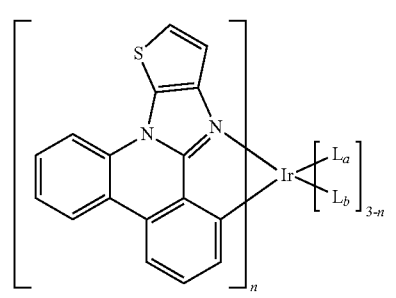
77
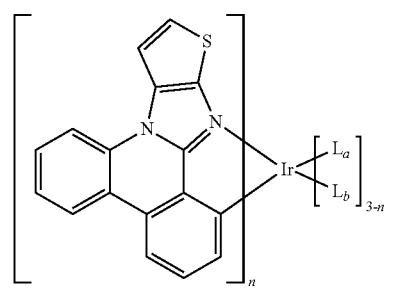
78
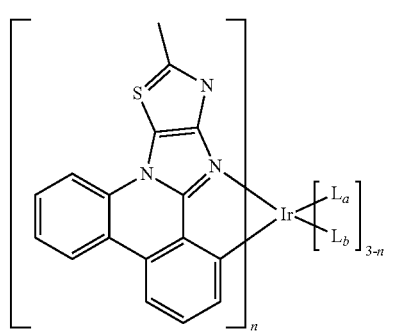
79
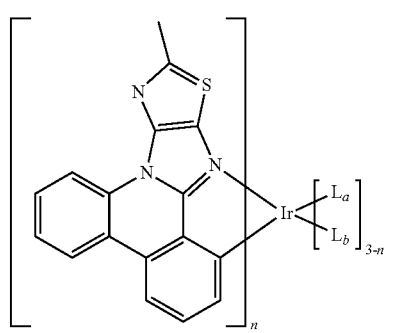
80
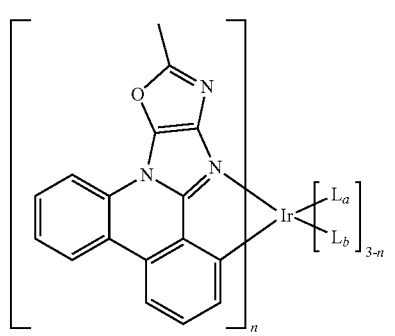
81
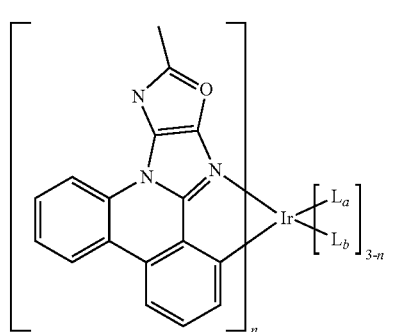
82
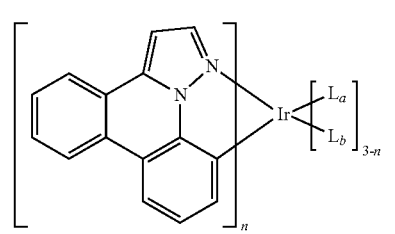
83

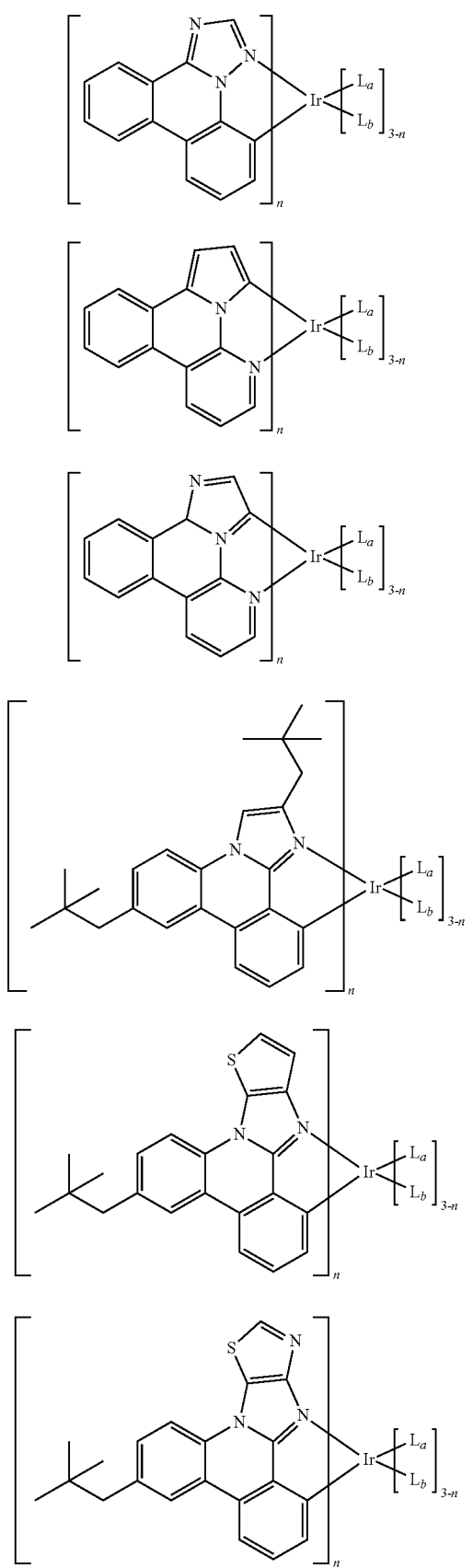
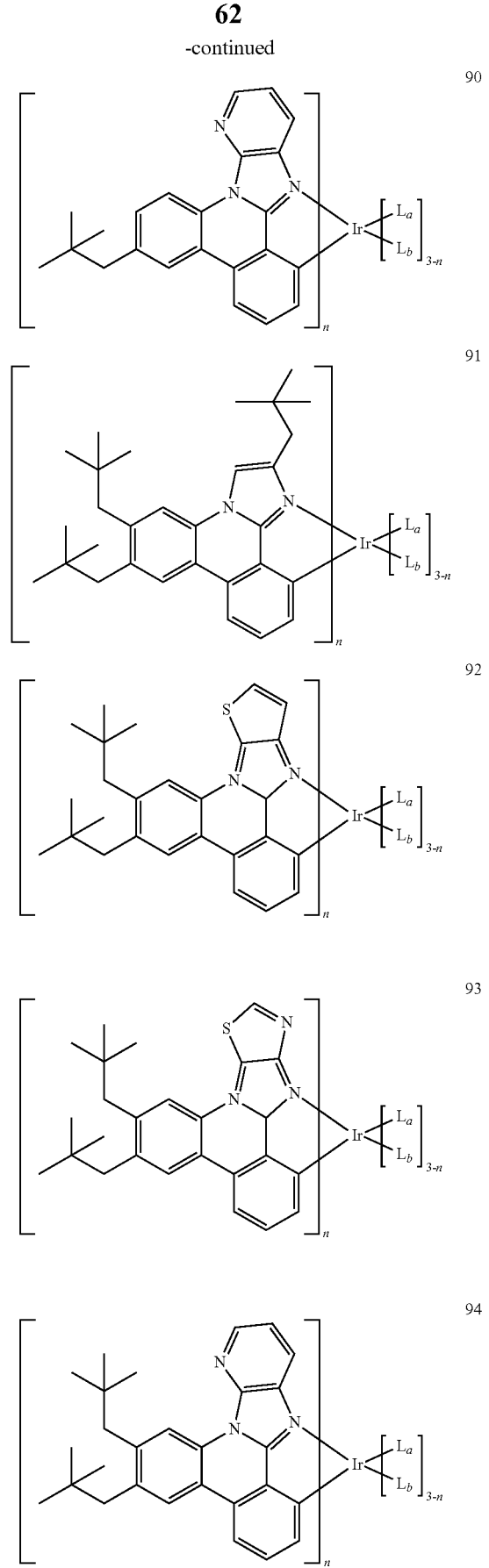

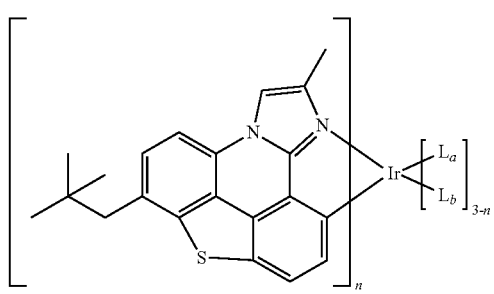
95
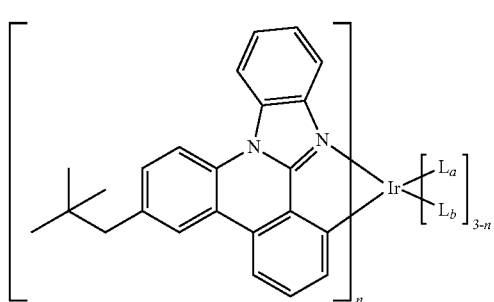
96
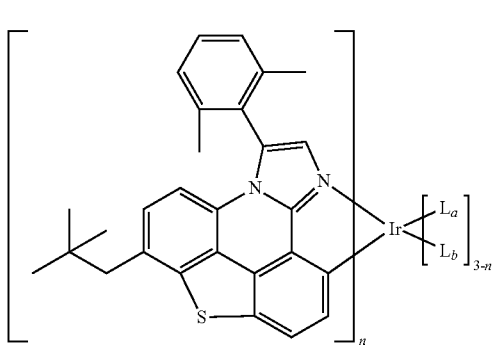
97
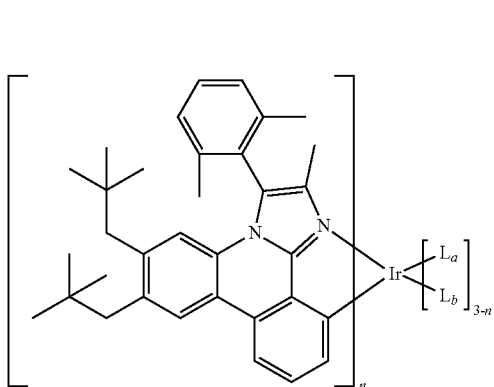
98
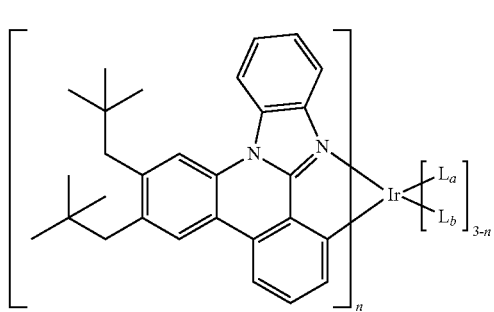
99
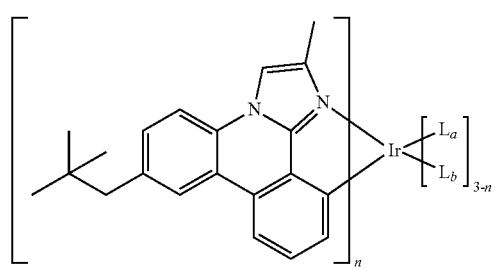
100
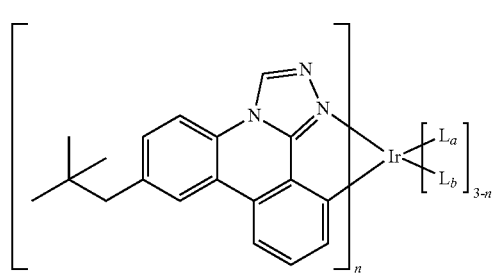
101
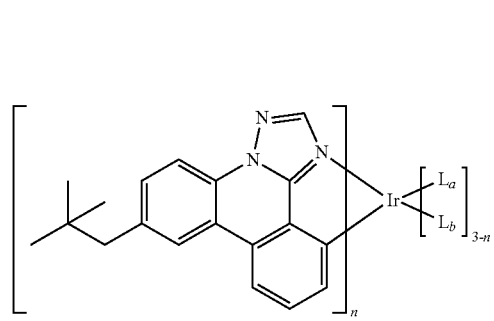
102
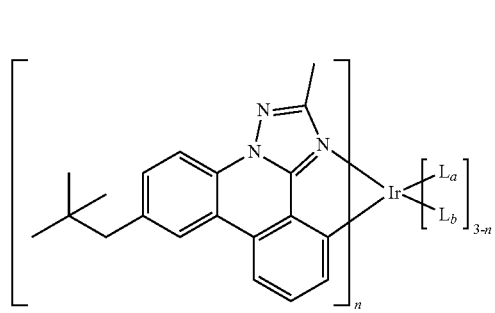
103
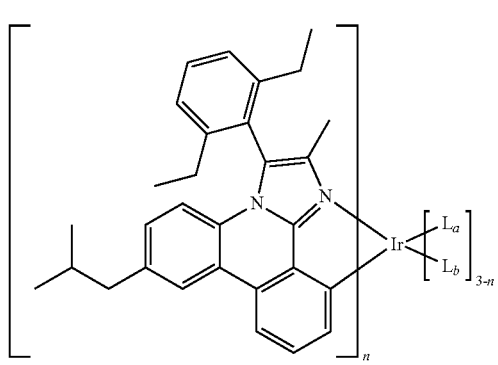
104

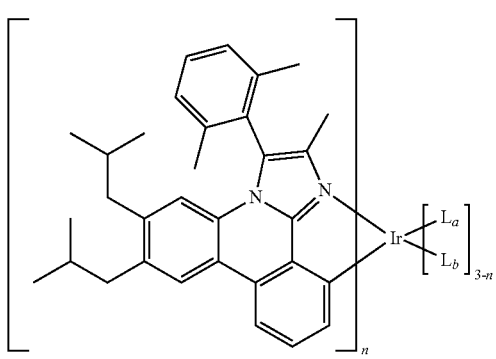
105
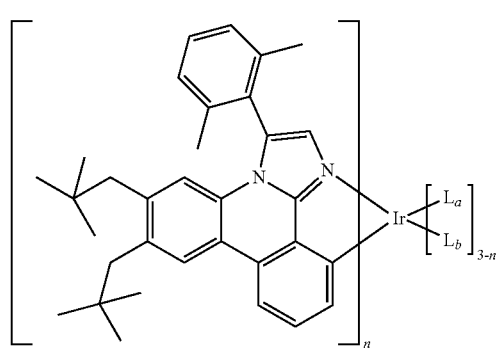
109
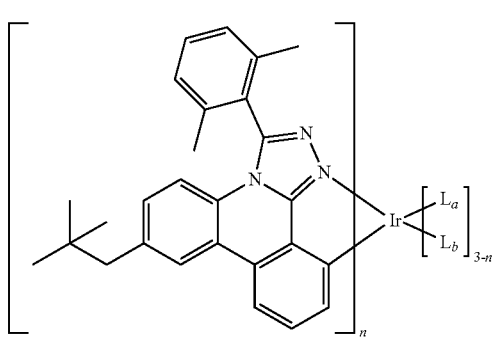
106
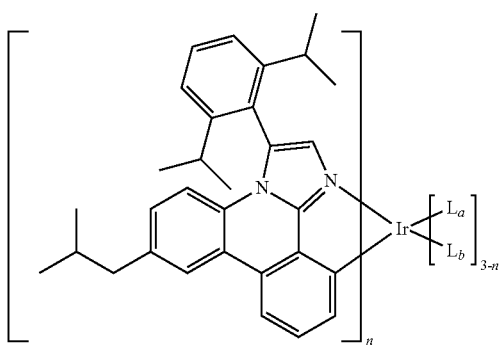
110
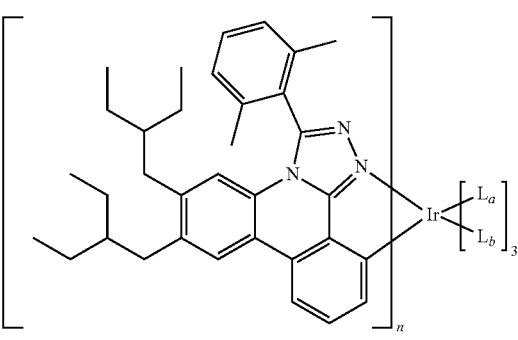
107
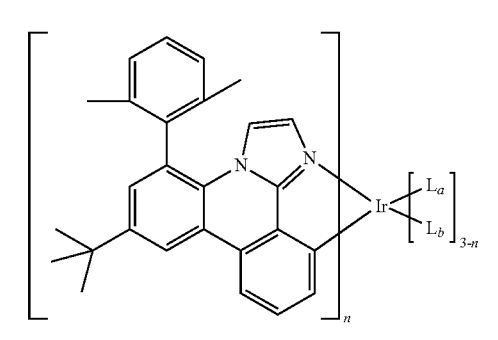
111
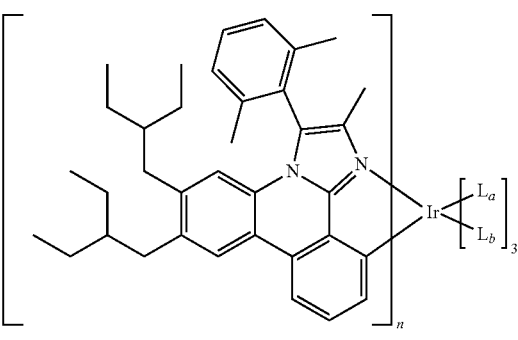
108
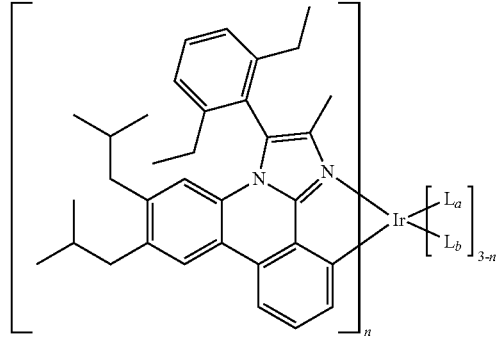
112

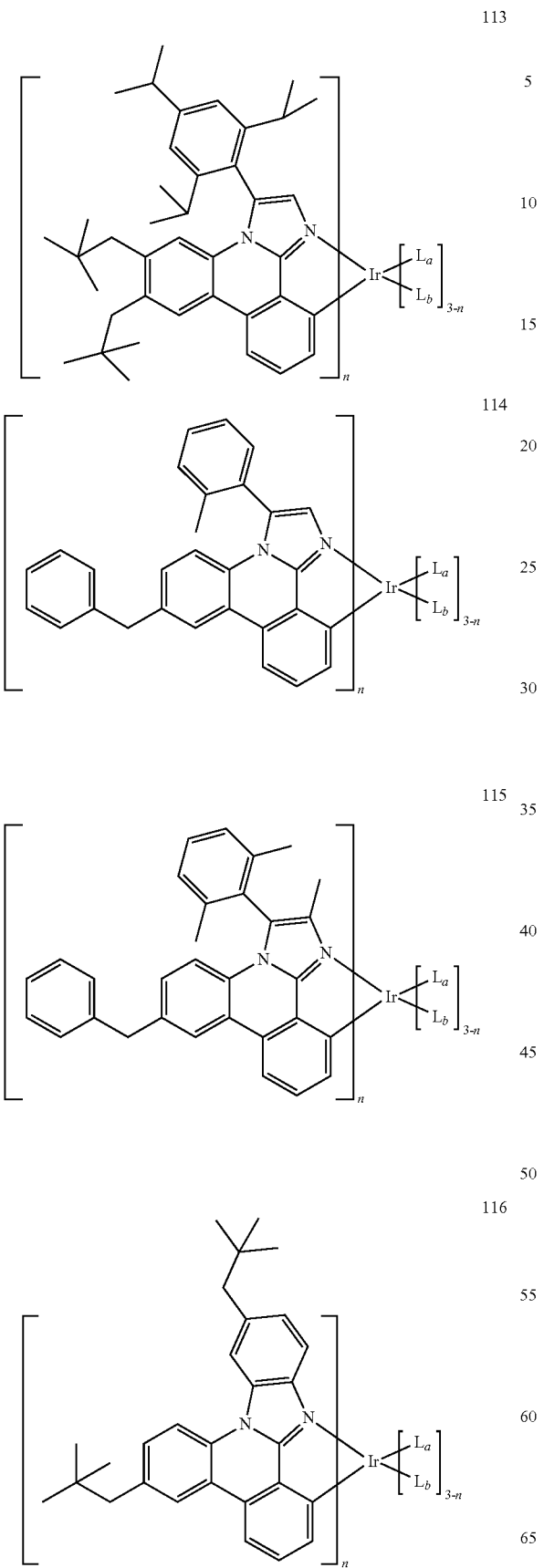
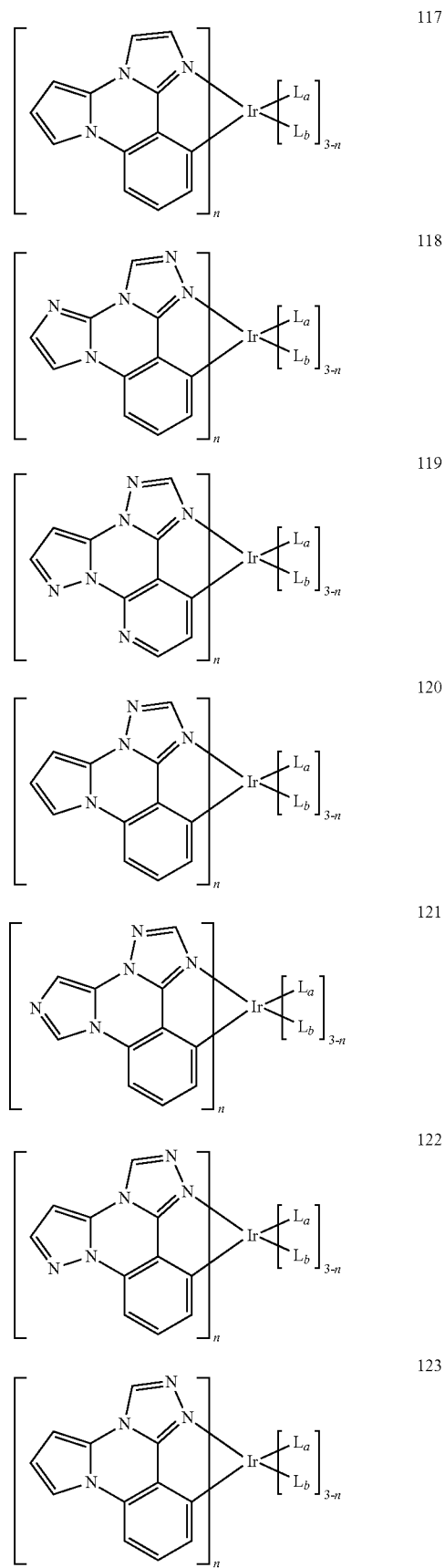

124 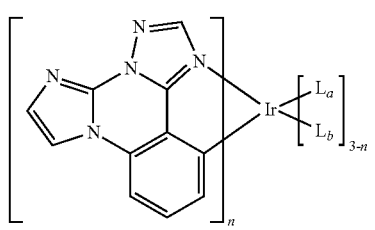
125 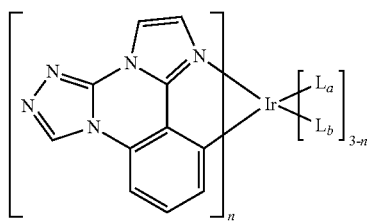
126 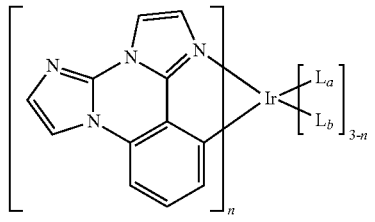
127 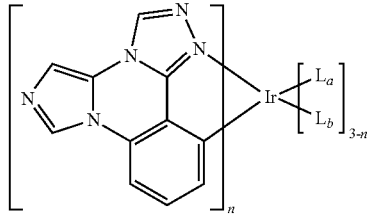
128 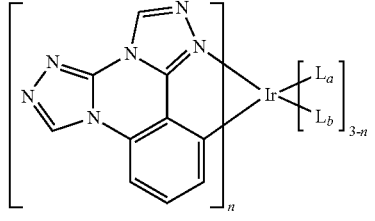
129 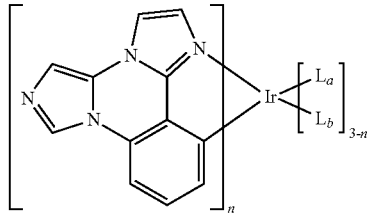
130 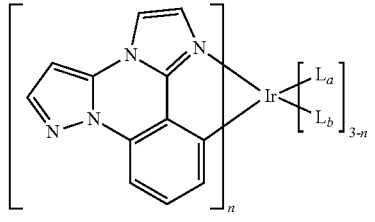
131 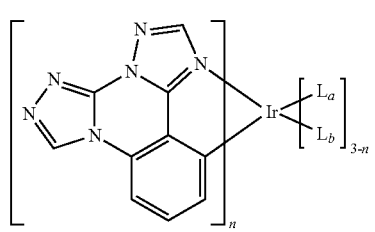
132 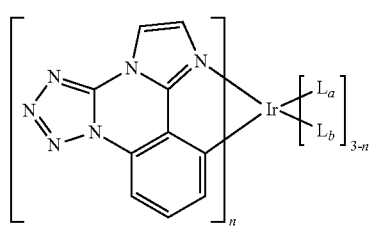
133 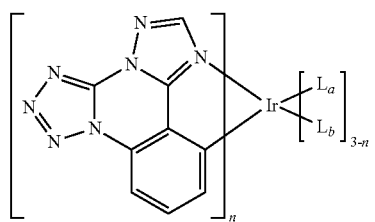
134 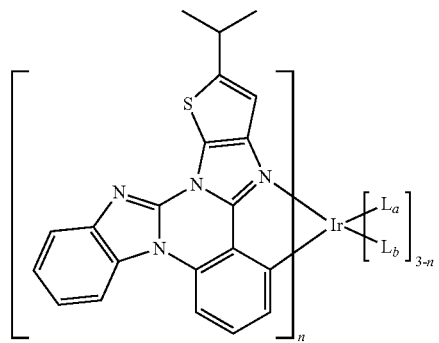
135 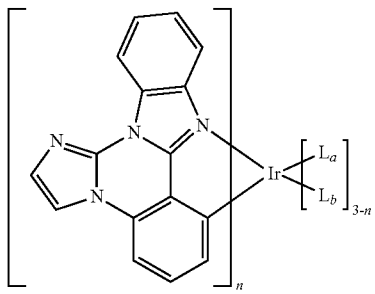
136 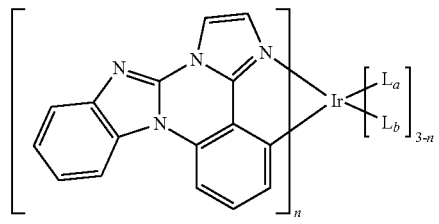

-continued
137
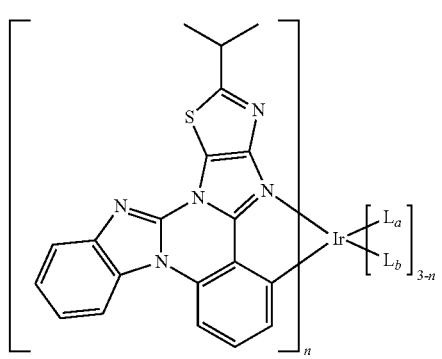
138
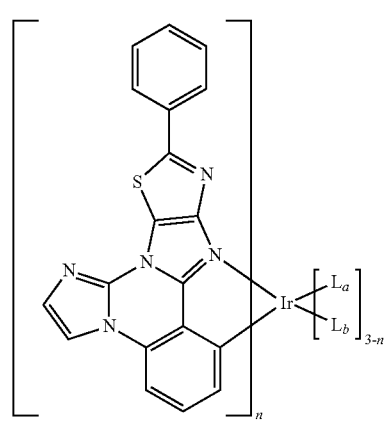
139
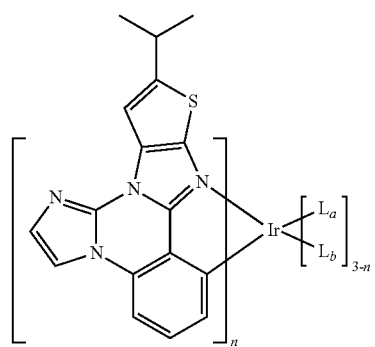
140
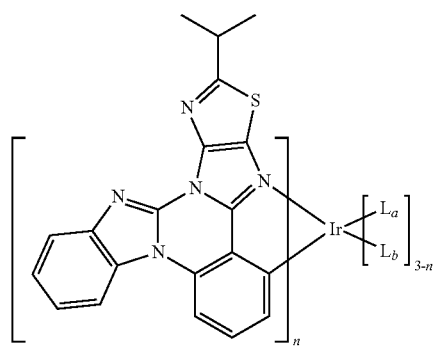
-continued
141
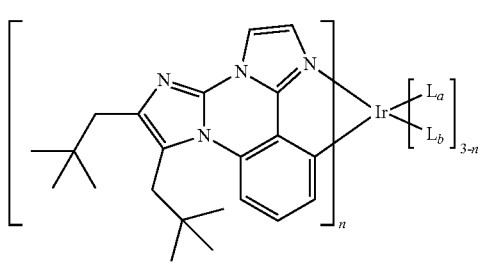
142
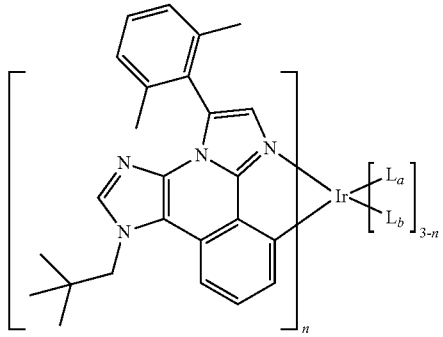
143
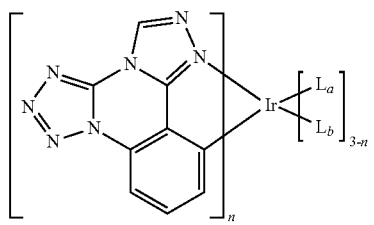
144
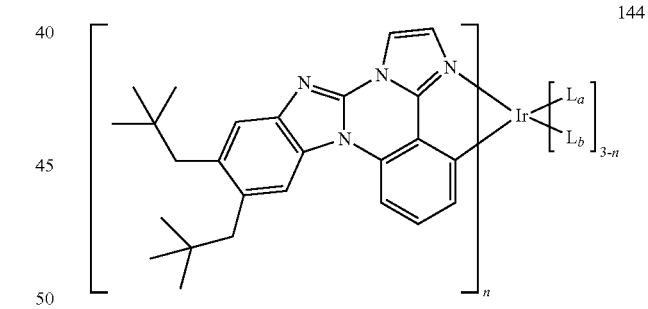
145
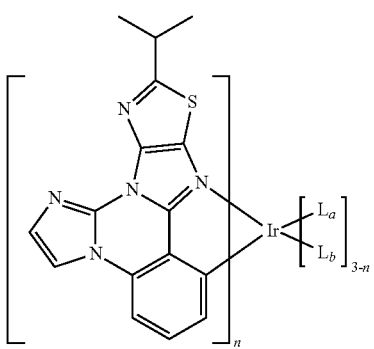

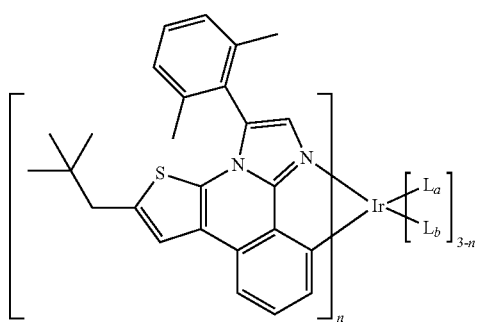
146
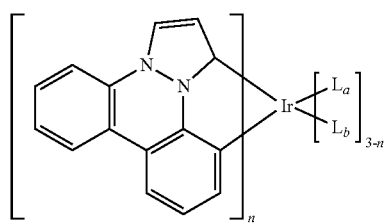
151
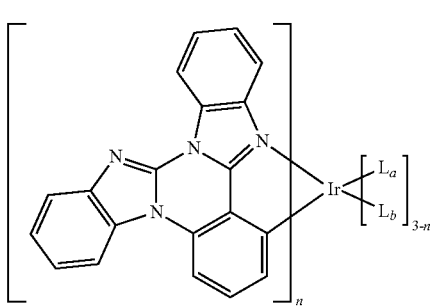
147
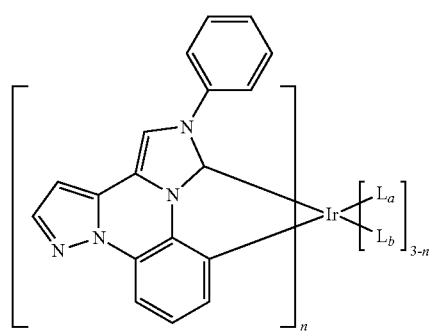
152
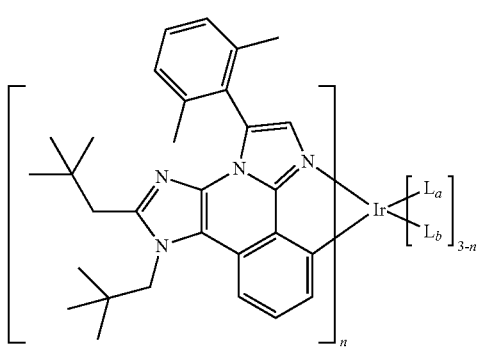
148
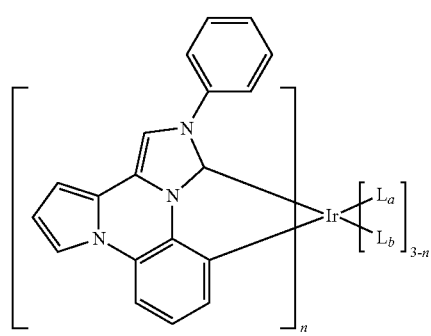
153
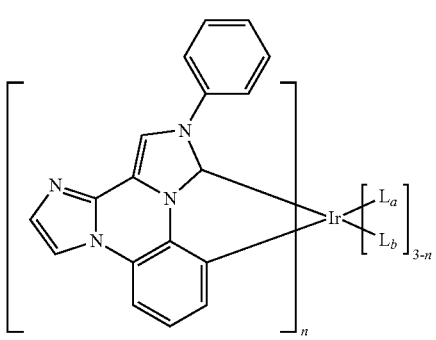
149
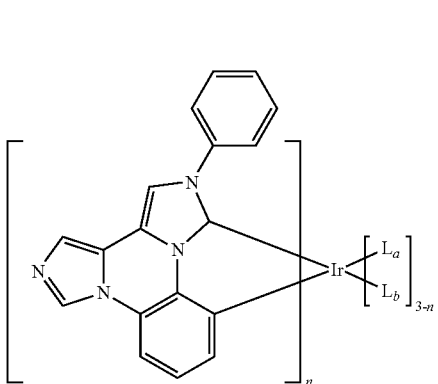
154
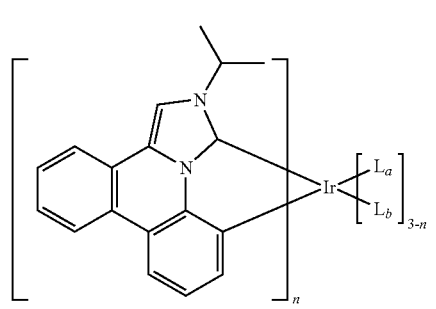
150
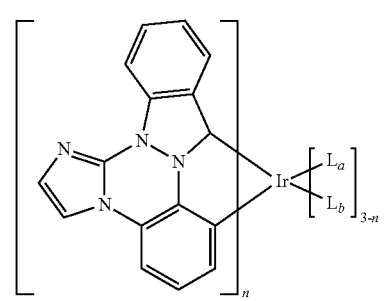
155

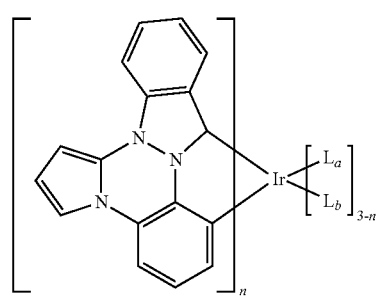
156
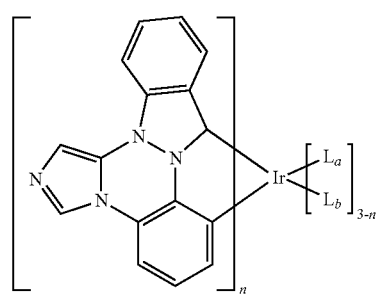
157
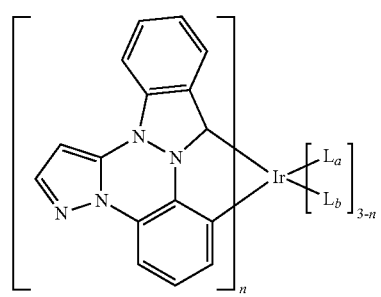
158
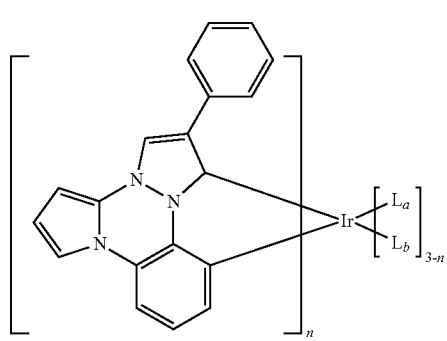
159
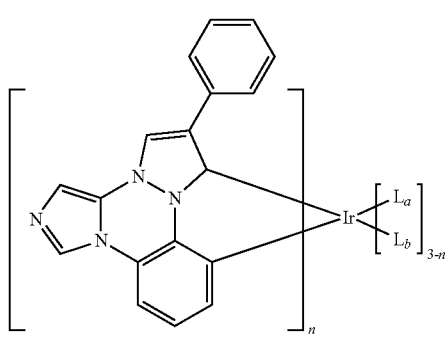
160
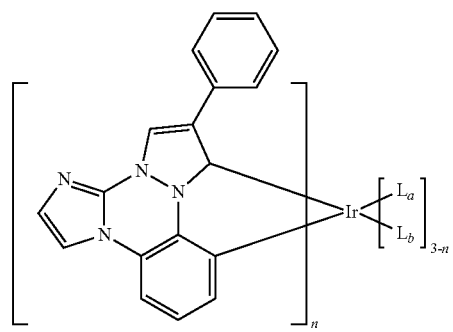
161
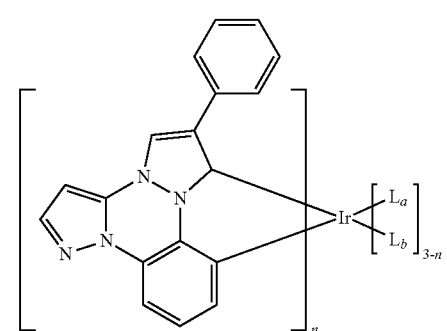
162
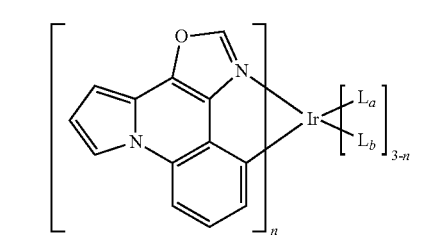
163
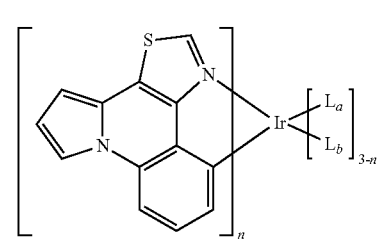
164
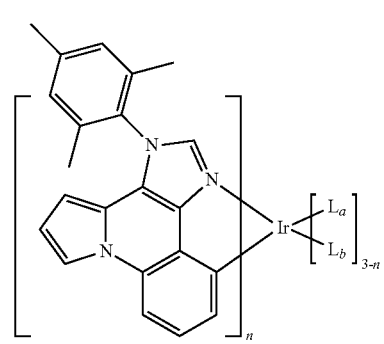
165

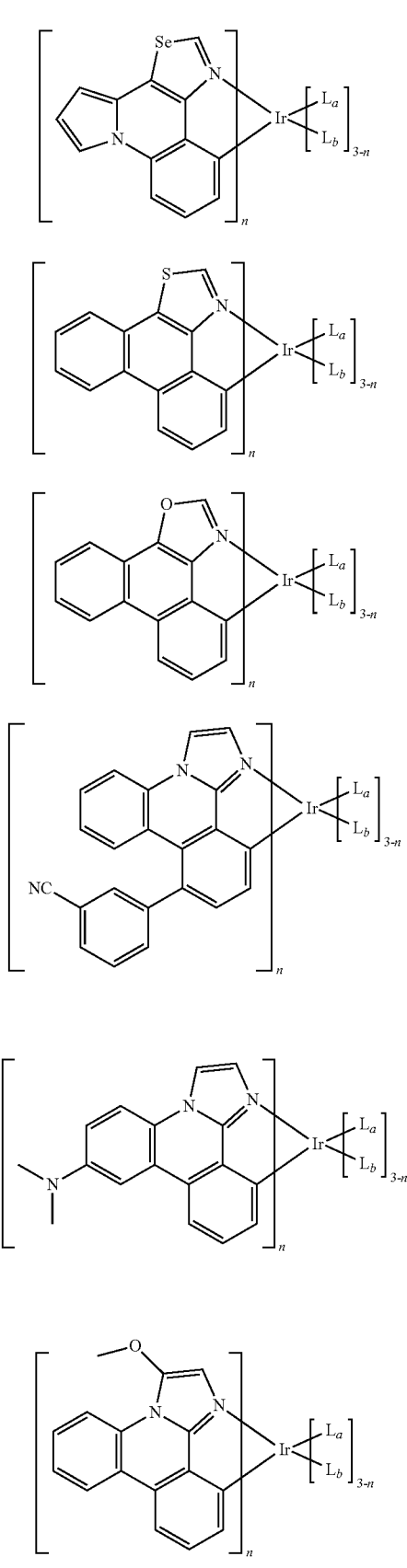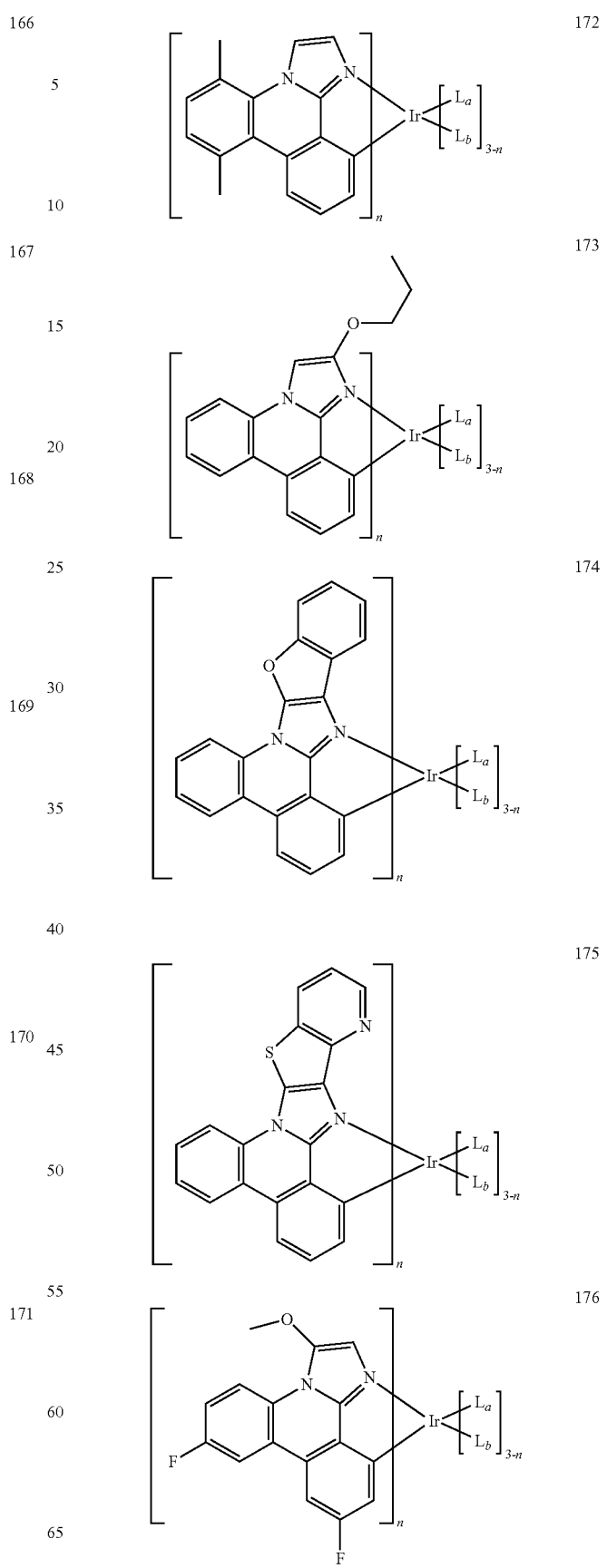

177 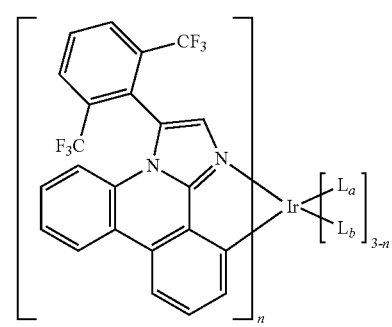
178 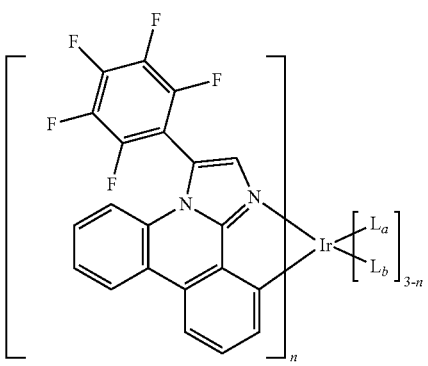
179 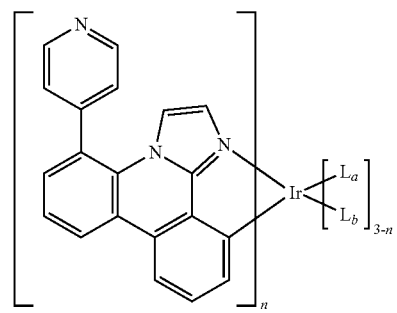
180 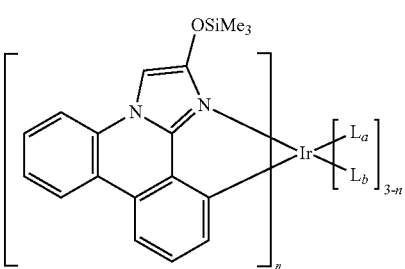
181 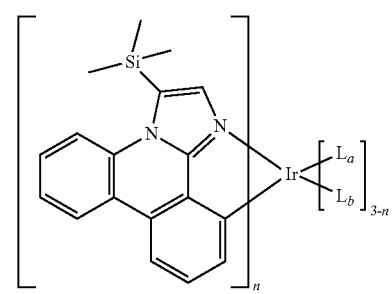
182 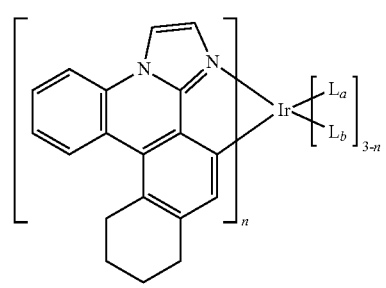
183 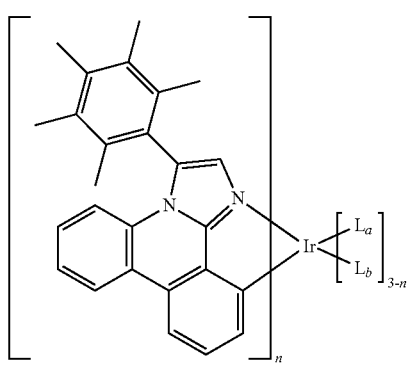
184 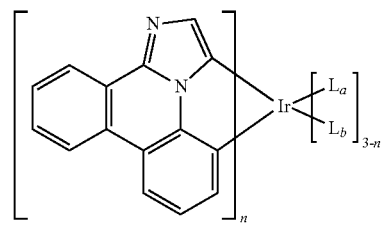
185 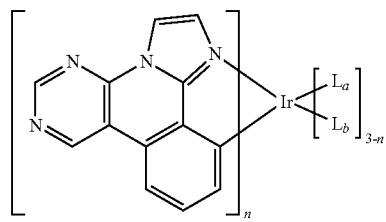
186 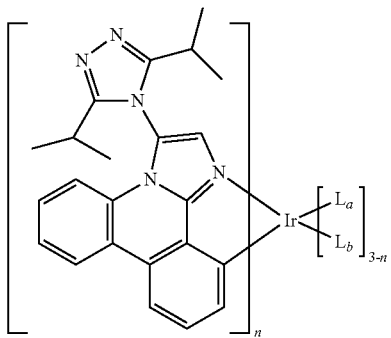

-continued

187

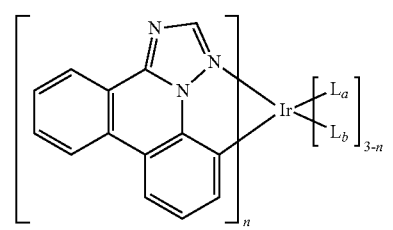

188

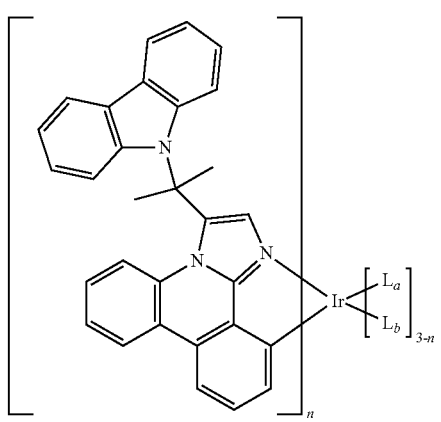

189

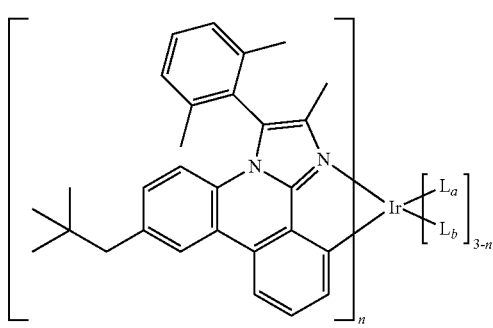

Specific examples of the material for organic electroluminescence devices of the present invention are shown in Table below. In the Table, "Material 1" indicates a compound represented by formula (1b), (2b), (3b), (3b-1) to (3b-3) or (4b), and "Material 2" indicates a compound represented by formula (1a), (2a), (3a), (3a-1) to (3a-3) or (4a). Also, in the Table, "Compound No." corresponds to the number in specific examples set forth above.

TABLE 1

| Material No. | Material 1 Compound No. | n | Material 2 Compound No. | n | $L_a, L_b$ | Content Ratio of Material 2 to Material 1 (ppm) |
|---|---|---|---|---|---|---|
| 1-1-1 | 1 | 3 | 1 | 2 | L1 | 0.1 |
| 1-1-2 | 1 | 3 | 1 | 2 | L1 | 0.15 |
| 1-1-3 | 1 | 3 | 1 | 2 | L1 | 0.2 |
| 1-1-4 | 1 | 3 | 1 | 2 | L1 | 0.25 |
| 1-1-5 | 1 | 3 | 1 | 2 | L1 | 0.3 |
| 1-1-6 | 1 | 3 | 1 | 2 | L1 | 0.35 |
| 1-1-7 | 1 | 3 | 1 | 2 | L1 | 0.4 |
| 1-1-8 | 1 | 3 | 1 | 2 | L1 | 0.45 |
| 1-1-9 | 1 | 3 | 1 | 2 | L1 | 0.5 |
| 1-1-10 | 1 | 3 | 1 | 2 | L1 | 0.55 |
| 1-1-11 | 1 | 3 | 1 | 2 | L1 | 0.6 |

TABLE 1-continued

| Material No. | Material 1 Compound No. | n | Material 2 Compound No. | n | $L_a, L_b$ | Content Ratio of Material 2 to Material 1 (ppm) |
|---|---|---|---|---|---|---|
| 1-1-12 | 1 | 3 | 1 | 2 | L1 | 0.65 |
| 1-1-13 | 1 | 3 | 1 | 2 | L1 | 0.7 |
| 1-1-14 | 1 | 3 | 1 | 2 | L1 | 0.75 |
| 1-1-15 | 1 | 3 | 1 | 2 | L1 | 0.8 |
| 1-1-16 | 1 | 3 | 1 | 2 | L1 | 0.85 |
| 1-1-17 | 1 | 3 | 1 | 2 | L1 | 0.9 |
| 1-1-18 | 1 | 3 | 1 | 2 | L1 | 0.95 |
| 1-1-19 | 1 | 3 | 1 | 2 | L1 | 1 |
| 1-1-20 | 1 | 3 | 1 | 2 | L1 | 1.5 |
| 1-1-21 | 1 | 3 | 1 | 2 | L1 | 2 |
| 1-1-22 | 1 | 3 | 1 | 2 | L1 | 2.5 |
| 1-1-23 | 1 | 3 | 1 | 2 | L1 | 3 |
| 1-1-24 | 1 | 3 | 1 | 2 | L1 | 3.5 |
| 1-1-25 | 1 | 3 | 1 | 2 | L1 | 4 |
| 1-1-26 | 1 | 3 | 1 | 2 | L1 | 4.5 |
| 1-1-27 | 1 | 3 | 1 | 2 | L1 | 5 |
| 1-1-28 | 1 | 3 | 1 | 2 | L1 | 5.5 |
| 1-1-29 | 1 | 3 | 1 | 2 | L1 | 6 |
| 1-1-30 | 1 | 3 | 1 | 2 | L1 | 6.5 |
| 1-1-31 | 1 | 3 | 1 | 2 | L1 | 7 |
| 1-1-32 | 1 | 3 | 1 | 2 | L1 | 7.5 |
| 1-1-33 | 1 | 3 | 1 | 2 | L1 | 8 |
| 1-1-34 | 1 | 3 | 1 | 2 | L1 | 8.5 |
| 1-1-35 | 1 | 3 | 1 | 2 | L1 | 9 |
| 1-1-36 | 1 | 3 | 1 | 2 | L1 | 9.5 |
| 1-1-37 | 1 | 3 | 1 | 2 | L1 | 10 |
| 1-1-38 | 1 | 3 | 1 | 2 | L1 | 20 |
| 1-1-39 | 1 | 3 | 1 | 2 | L1 | 30 |
| 1-1-40 | 1 | 3 | 1 | 2 | L1 | 40 |

TABLE 2

| Material No. | Material 1 Compound No. | n | Material 2 Compound No. | n | $L_a, L_b$ | Content Ratio of Material 2 to Material 1 (ppm) |
|---|---|---|---|---|---|---|
| 1-1-41 | 1 | 3 | 1 | 2 | L1 | 50 |
| 1-1-42 | 1 | 3 | 1 | 2 | L1 | 60 |
| 1-1-43 | 1 | 3 | 1 | 2 | L1 | 70 |
| 1-1-44 | 1 | 3 | 1 | 2 | L1 | 80 |
| 1-1-45 | 1 | 3 | 1 | 2 | L1 | 90 |
| 1-1-46 | 1 | 3 | 1 | 2 | L1 | 100 |
| 1-1-47 | 1 | 3 | 1 | 2 | L1 | 150 |
| 1-1-48 | 1 | 3 | 1 | 2 | L1 | 200 |
| 1-1-49 | 1 | 3 | 1 | 2 | L1 | 250 |
| 1-1-50 | 1 | 3 | 1 | 2 | L1 | 300 |
| 1-1-51 | 1 | 3 | 1 | 2 | L1 | 350 |
| 1-1-52 | 1 | 3 | 1 | 2 | L1 | 400 |
| 1-1-53 | 1 | 3 | 1 | 2 | L1 | 450 |
| 1-1-54 | 1 | 3 | 1 | 2 | L1 | 500 |
| 1-1-55 | 1 | 3 | 1 | 2 | L1 | 550 |
| 1-1-56 | 1 | 3 | 1 | 2 | L1 | 600 |
| 1-1-57 | 1 | 3 | 1 | 2 | L1 | 650 |
| 1-1-58 | 1 | 3 | 1 | 2 | L1 | 700 |
| 1-1-59 | 1 | 3 | 1 | 2 | L1 | 750 |
| 1-1-60 | 1 | 3 | 1 | 2 | L1 | 800 |
| 1-1-61 | 1 | 3 | 1 | 2 | L1 | 850 |
| 1-1-62 | 1 | 3 | 1 | 2 | L1 | 900 |
| 1-1-63 | 1 | 3 | 1 | 2 | L1 | 950 |
| 1-1-64 | 1 | 3 | 1 | 2 | L1 | 1000 |
| 1-1-65 | 1 | 3 | 1 | 2 | L1 | 1500 |
| 1-1-66 | 1 | 3 | 1 | 2 | L1 | 2000 |
| 1-1-67 | 1 | 3 | 1 | 2 | L1 | 2500 |
| 1-1-68 | 1 | 3 | 1 | 2 | L1 | 3000 |
| 1-1-69 | 1 | 3 | 1 | 2 | L1 | 3500 |
| 1-1-70 | 1 | 3 | 1 | 2 | L1 | 4000 |

TABLE 2-continued

| | Material 1 | | Material 2 | | | Content Ratio of Material 2 to Material 1 (ppm) |
|---|---|---|---|---|---|---|
| Material No. | Compound No. | n | Compound No. | n | $L_a, L_b$ | |
| 1-1-71 | 1 | 3 | 1 | 2 | L1 | 4500 |
| 1-1-72 | 1 | 3 | 1 | 2 | L1 | 5000 |

TABLE 3

| | Material 1 | | Material 2 | | | Content Ratio of Material 2 to Material 1 (ppm) |
|---|---|---|---|---|---|---|
| Material No. | Compound No. | n | Compound No. | n | $L_a, L_b$ | |
| 37-1-1 | 37 | 3 | 37 | 2 | L1 | 0.1 |
| 37-1-2 | 37 | 3 | 37 | 2 | L1 | 0.3 |
| 37-1-3 | 37 | 3 | 37 | 2 | L1 | 0.35 |
| 37-1-4 | 37 | 3 | 37 | 2 | L1 | 0.5 |
| 37-1-5 | 37 | 3 | 37 | 2 | L1 | 0.8 |
| 37-1-6 | 37 | 3 | 37 | 2 | L1 | 0.85 |
| 37-1-7 | 37 | 3 | 37 | 2 | L1 | 0.9 |
| 37-1-8 | 37 | 3 | 37 | 2 | L1 | 0.95 |
| 37-1-9 | 37 | 3 | 37 | 2 | L1 | 1 |
| 37-1-10 | 37 | 3 | 37 | 2 | L1 | 1.5 |
| 37-1-11 | 37 | 3 | 37 | 2 | L1 | 2 |
| 37-1-12 | 37 | 3 | 37 | 2 | L1 | 2.5 |
| 37-1-13 | 37 | 3 | 37 | 2 | L1 | 3 |
| 37-1-14 | 37 | 3 | 37 | 2 | L1 | 3.5 |
| 37-1-15 | 37 | 3 | 37 | 2 | L1 | 4 |
| 37-1-16 | 37 | 3 | 37 | 2 | L1 | 4.5 |
| 37-1-17 | 37 | 3 | 37 | 2 | L1 | 5 |
| 37-1-18 | 37 | 3 | 37 | 2 | L1 | 7.5 |
| 37-1-19 | 37 | 3 | 37 | 2 | L1 | 8 |
| 37-1-20 | 37 | 3 | 37 | 2 | L1 | 8.5 |
| 37-1-21 | 37 | 3 | 37 | 2 | L1 | 9 |
| 37-1-22 | 37 | 3 | 37 | 2 | L1 | 9.5 |
| 37-1-23 | 37 | 3 | 37 | 2 | L1 | 10 |
| 37-1-24 | 37 | 3 | 37 | 2 | L1 | 20 |
| 37-1-25 | 37 | 3 | 37 | 2 | L1 | 30 |
| 37-1-26 | 37 | 3 | 37 | 2 | L1 | 40 |
| 37-1-27 | 37 | 3 | 37 | 2 | L1 | 50 |
| 37-1-28 | 37 | 3 | 37 | 2 | L1 | 60 |
| 37-1-29 | 37 | 3 | 37 | 2 | L1 | 100 |
| 37-1-30 | 37 | 3 | 37 | 2 | L1 | 300 |
| 37-1-31 | 37 | 3 | 37 | 2 | L1 | 350 |
| 37-1-32 | 37 | 3 | 37 | 2 | L1 | 400 |
| 37-1-33 | 37 | 3 | 37 | 2 | L1 | 450 |
| 37-1-34 | 37 | 3 | 37 | 2 | L1 | 500 |
| 37-1-35 | 37 | 3 | 37 | 2 | L1 | 550 |
| 37-1-36 | 37 | 3 | 37 | 2 | L1 | 600 |
| 37-1-37 | 37 | 3 | 37 | 2 | L1 | 650 |
| 37-1-38 | 37 | 3 | 37 | 2 | L1 | 700 |
| 37-1-39 | 37 | 3 | 37 | 2 | L1 | 750 |
| 37-1-40 | 37 | 3 | 37 | 2 | L1 | 800 |
| 37-1-41 | 37 | 3 | 37 | 2 | L1 | 850 |
| 37-1-42 | 37 | 3 | 37 | 2 | L1 | 1000 |
| 37-1-43 | 37 | 3 | 37 | 2 | L1 | 1500 |
| 37-1-44 | 37 | 3 | 37 | 2 | L1 | 2000 |
| 37-1-45 | 37 | 3 | 37 | 2 | L1 | 2500 |
| 37-1-46 | 37 | 3 | 37 | 2 | L1 | 3000 |
| 37-1-47 | 37 | 3 | 37 | 2 | L1 | 3500 |
| 37-1-48 | 37 | 3 | 37 | 2 | L1 | 4000 |
| 37-1-49 | 37 | 3 | 37 | 2 | L1 | 4500 |
| 37-1-50 | 37 | 3 | 37 | 2 | L1 | 5000 |

TABLE 4

| | Material 1 | | Material 2 | | | Content Ratio of Material 2 to Material 1 (ppm) |
|---|---|---|---|---|---|---|
| Material No. | Compound No. | n | Compound No. | n | $L_a, L_b$ | |
| 1-5-1 | 1 | 3 | 1 | 2 | L5 | 0.1 |
| 1-5-2 | 1 | 3 | 1 | 2 | L5 | 0.15 |
| 1-5-3 | 1 | 3 | 1 | 2 | L5 | 0.2 |
| 1-5-4 | 1 | 3 | 1 | 2 | L5 | 0.7 |
| 1-5-5 | 1 | 3 | 1 | 2 | L5 | 0.75 |
| 1-5-6 | 1 | 3 | 1 | 2 | L5 | 0.8 |
| 1-5-7 | 1 | 3 | 1 | 2 | L5 | 0.85 |
| 1-5-8 | 1 | 3 | 1 | 2 | L5 | 0.9 |
| 1-5-9 | 1 | 3 | 1 | 2 | L5 | 0.95 |
| 1-5-10 | 1 | 3 | 1 | 2 | L5 | 1 |
| 1-5-11 | 1 | 3 | 1 | 2 | L5 | 1.5 |
| 1-5-12 | 1 | 3 | 1 | 2 | L5 | 2 |
| 1-5-13 | 1 | 3 | 1 | 2 | L5 | 2.5 |
| 1-5-14 | 1 | 3 | 1 | 2 | L5 | 3 |
| 1-5-15 | 1 | 3 | 1 | 2 | L5 | 3.5 |
| 1-5-16 | 1 | 3 | 1 | 2 | L5 | 4 |
| 1-5-17 | 1 | 3 | 1 | 2 | L5 | 4.5 |
| 1-5-18 | 1 | 3 | 1 | 2 | L5 | 5 |
| 1-5-19 | 1 | 3 | 1 | 2 | L5 | 5.5 |
| 1-5-20 | 1 | 3 | 1 | 2 | L5 | 20 |
| 1-5-21 | 1 | 3 | 1 | 2 | L5 | 30 |
| 1-5-22 | 1 | 3 | 1 | 2 | L5 | 40 |
| 1-5-23 | 1 | 3 | 1 | 2 | L5 | 50 |
| 1-5-24 | 1 | 3 | 1 | 2 | L5 | 60 |
| 1-5-25 | 1 | 3 | 1 | 2 | L5 | 70 |
| 1-5-26 | 1 | 3 | 1 | 2 | L5 | 80 |
| 1-5-27 | 1 | 3 | 1 | 2 | L5 | 90 |
| 1-5-28 | 1 | 3 | 1 | 2 | L5 | 100 |
| 1-5-29 | 1 | 3 | 1 | 2 | L5 | 150 |
| 1-5-30 | 1 | 3 | 1 | 2 | L5 | 200 |
| 1-5-31 | 1 | 3 | 1 | 2 | L5 | 250 |
| 1-5-32 | 1 | 3 | 1 | 2 | L5 | 300 |
| 1-5-33 | 1 | 3 | 1 | 2 | L5 | 900 |
| 1-5-34 | 1 | 3 | 1 | 2 | L5 | 950 |
| 1-5-35 | 1 | 3 | 1 | 2 | L5 | 1000 |
| 1-5-36 | 1 | 3 | 1 | 2 | L5 | 3500 |
| 1-5-37 | 1 | 3 | 1 | 2 | L5 | 5000 |

TABLE 5

| | Material 1 | | Material 2 | | | Content Ratio of Material 2 to Material 1 (ppm) |
|---|---|---|---|---|---|---|
| Material No. | Compound No. | n | Compound No. | n | $L_a, L_b$ | |
| 4-10-1 | 4 | 3 | 4 | 2 | L10 | 0.8 |
| 4-10-2 | 4 | 3 | 4 | 2 | L10 | 1 |
| 4-10-3 | 4 | 3 | 4 | 2 | L10 | 5 |
| 4-10-4 | 4 | 3 | 4 | 2 | L10 | 100 |
| 4-10-5 | 4 | 3 | 4 | 2 | L10 | 1000 |
| 4-10-6 | 4 | 3 | 4 | 2 | L10 | 3500 |
| 4-10-7 | 4 | 3 | 4 | 2 | L10 | 5000 |

TABLE 6

| | Material 1 | | Material 2 | | | Content Ratio of Material 2 to Material 1 (ppm) |
|---|---|---|---|---|---|---|
| Material No. | Compound No. | n | Compound No. | n | $L_a, L_b$ | |
| 189-3-1 | 189 | 3 | 189 | 2 | L3 | 0.8 |
| 189-3-2 | 189 | 3 | 189 | 2 | L3 | 1 |
| 189-3-3 | 189 | 3 | 189 | 2 | L3 | 5 |
| 189-3-4 | 189 | 3 | 189 | 2 | L3 | 500 |

TABLE 6-continued

| Material No. | Material 1 Compound No. | n | Material 2 Compound No. | n | $L_a, L_b$ | Content Ratio of Material 2 to Material 1 (ppm) |
|---|---|---|---|---|---|---|
| 189-3-5 | 189 | 3 | 189 | 2 | L3 | 1000 |
| 189-3-6 | 189 | 3 | 189 | 2 | L3 | 3500 |
| 189-3-7 | 189 | 3 | 189 | 2 | L3 | 5000 |

TABLE 7

| Material No. | Material 1 Compound No. | n | Material 2 Compound No. | n | $L_a, L_b$ | Content Ratio of Material 2 to Material 1 (ppm) |
|---|---|---|---|---|---|---|
| 5-2-1 | 5 | 3 | 5 | 2 | L2 | 500 |
| 5-2-2 | 5 | 3 | 5 | 2 | L2 | 600 |
| 5-2-3 | 5 | 3 | 5 | 2 | L2 | 1200 |
| 12-6-1 | 12 | 3 | 12 | 2 | L6 | 5 |
| 12-6-2 | 12 | 3 | 12 | 2 | L6 | 4500 |
| 18-16-1 | 18 | 3 | 18 | 2 | L16 | 1 |
| 18-16-2 | 18 | 3 | 18 | 2 | L16 | 60 |
| 18-16-3 | 18 | 3 | 18 | 2 | L16 | 900 |
| 18-12-1 | 18 | 3 | 18 | 2 | L12 | 500 |
| 18-12-2 | 18 | 3 | 18 | 2 | L12 | 1400 |
| 24-1-1 | 24 | 3 | 24 | 2 | L1 | 0.4 |
| 24-1-2 | 24 | 3 | 24 | 2 | L1 | 35 |
| 24-1-3 | 24 | 3 | 24 | 2 | L1 | 750 |
| 27-9-1 | 27 | 3 | 27 | 2 | L9 | 1000 |
| 27-9-2 | 27 | 3 | 27 | 2 | L9 | 1200 |
| 27-17-1 | 27 | 3 | 27 | 2 | L17 | 500 |
| 32-5-1 | 32 | 3 | 32 | 2 | L5 | 2 |
| 33-5-1 | 33 | 3 | 33 | 2 | L5 | 650 |
| 33-5-2 | 33 | 3 | 33 | 2 | L5 | 3500 |
| 33-7-1 | 33 | 3 | 33 | 2 | L7 | 1 |
| 39-1-1 | 39 | 3 | 39 | 2 | L1 | 0.75 |
| 39-1-2 | 39 | 3 | 39 | 2 | L1 | 2500 |
| 42-8-1 | 42 | 3 | 42 | 2 | L8 | 10 |

TABLE 8

| Material No. | Material 1 Compound No. | n | Material 2 Compound No. | n | $L_a, L_b$ | Content Ratio of Material 2 to Material 1 (ppm) |
|---|---|---|---|---|---|---|
| 42-8-2 | 42 | 3 | 42 | 2 | L8 | 80 |
| 42-11-1 | 42 | 3 | 42 | 2 | L11 | 500 |
| 42-11-2 | 42 | 3 | 42 | 2 | L11 | 900 |
| 42-11-3 | 42 | 3 | 42 | 1 | L11 | 1750 |
| 42-1-1 | 42 | 3 | 42 | 1 | L1 | 50 |
| 42-1-2 | 42 | 3 | 42 | 1 | L1 | 650 |
| 49-1-1 | 49 | 3 | 49 | 2 | L1 | 4500 |
| 51-14-1 | 51 | 3 | 51 | 2 | L14 | 20 |
| 51-4-1 | 51 | 3 | 51 | 2 | L4 | 10 |
| 51-4-2 | 51 | 3 | 51 | 2 | L4 | 65 |
| 54-13-1 | 54 | 3 | 54 | 2 | L13 | 5 |
| 54-13-2 | 54 | 3 | 54 | 2 | L13 | 100 |
| 59-10-1 | 59 | 3 | 59 | 2 | L10 | 500 |
| 59-10-2 | 59 | 3 | 59 | 2 | L10 | 700 |
| 59-13-1 | 59 | 3 | 59 | 2 | L13 | 2 |
| 61-1-1 | 61 | 3 | 61 | 2 | L1 | 0.4 |
| 61-15-1 | 61 | 3 | 61 | 2 | L15 | 1800 |
| 61-15-2 | 61 | 3 | 61 | 2 | L15 | 4000 |
| 65-10-1 | 65 | 3 | 65 | 2 | L10 | 30 |
| 65-10-2 | 65 | 3 | 65 | 2 | L10 | 4500 |
| 70-2-1 | 70 | 3 | 70 | 2 | L2 | 0.75 |
| 70-2-2 | 70 | 3 | 70 | 2 | L2 | 350 |

TABLE 8-continued

| Material No. | Material 1 Compound No. | n | Material 2 Compound No. | n | $L_a, L_b$ | Content Ratio of Material 2 to Material 1 (ppm) |
|---|---|---|---|---|---|---|
| 73-11-1 | 73 | 3 | 73 | 2 | L11 | 500 |
| 73-11-2 | 73 | 3 | 73 | 2 | L11 | 1000 |
| 81-6-1 | 81 | 3 | 81 | 2 | L6 | 20 |
| 81-6-2 | 81 | 3 | 81 | 2 | L6 | 40 |
| 81-6-3 | 81 | 3 | 81 | 2 | L6 | 700 |
| 85-1-1 | 85 | 3 | 85 | 2 | L1 | 5 |
| 85-1-2 | 85 | 3 | 85 | 2 | L1 | 10 |
| 85-1-3 | 85 | 3 | 85 | 2 | L1 | 60 |
| 85-1-4 | 85 | 3 | 85 | 2 | L1 | 1000 |
| 95-2-1 | 95 | 3 | 95 | 2 | L2 | 3500 |
| 98-7-1 | 98 | 3 | 98 | 2 | L7 | 2 |
| 98-7-2 | 98 | 3 | 98 | 2 | L7 | 500 |
| 122-9-1 | 122 | 3 | 122 | 2 | L9 | 0.5 |
| 122-9-2 | 122 | 3 | 122 | 2 | L9 | 5 |
| 122-9-3 | 122 | 3 | 122 | 2 | L9 | 50 |
| 122-9-4 | 122 | 3 | 122 | 2 | L9 | 200 |
| 122-9-5 | 122 | 3 | 122 | 2 | L9 | 5000 |
| 134-5-1 | 134 | 3 | 134 | 2 | L5 | 25 |
| 134-5-2 | 134 | 3 | 134 | 2 | L5 | 300 |
| 134-5-3 | 134 | 3 | 134 | 2 | L5 | 450 |
| 148-3-1 | 148 | 3 | 148 | 2 | L3 | 10 |
| 148-3-2 | 148 | 3 | 148 | 2 | L3 | 75 |
| 160-1-1 | 160 | 3 | 160 | 2 | L1 | 200 |
| 160-1-2 | 160 | 3 | 160 | 2 | L1 | 250 |
| 160-1-3 | 167 | 3 | 167 | 2 | L1 | 1600 |
| 177-13-1 | 177 | 3 | 177 | 2 | L13 | 0.5 |
| 177-13-2 | 177 | 3 | 177 | 2 | L13 | 15 |
| 177-13-3 | 177 | 3 | 177 | 2 | L13 | 250 |
| 181-16-1 | 181 | 3 | 181 | 2 | L16 | 50 |
| 181-16-2 | 181 | 3 | 181 | 2 | L16 | 100 |
| 188-2-1 | 188 | 3 | 188 | 2 | L2 | 0.5 |
| 188-2-2 | 188 | 3 | 188 | 2 | L2 | 700 |
| 188-2-3 | 188 | 3 | 188 | 2 | L2 | 5000 |

In the Tables, each of L1 to L17 in "$L_a, L_b$" of Material 2 indicates a ligand coordinated to Ir of the following structures.

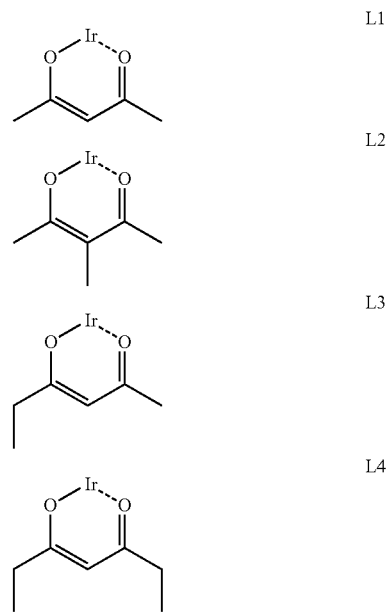

L5 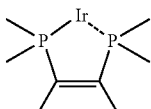

L6 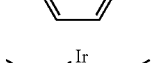

L7

L8

L9

L10

L11

L12

L13

L14

L15 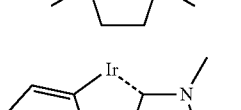

L16 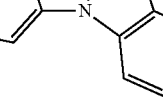

L17

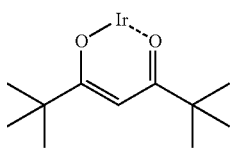
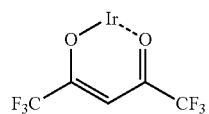
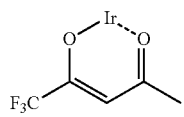
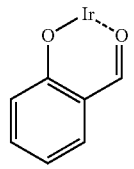
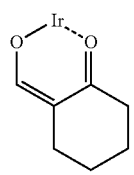
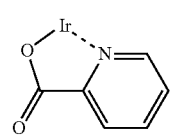
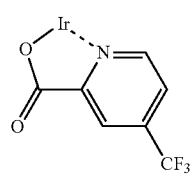
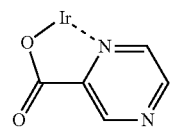
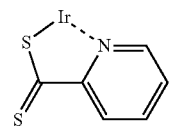
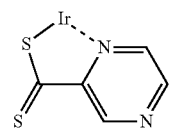

The present invention is not limited to the combinations of complexes and the contents shown in the Tables and includes, for example, a material where a complex obtained by replacing some of ligands in the tris form (n=3) of an arbitrary complex denoted by Compound Nos. 1 to 189 with an arbitrary secondary ligand denoted by L1 to L17 is mixed in an arbitrary ratio of 0.1 to 5,000 ppm.

[Organic Electroluminescence Device]

The organic electroluminescence device of the present invention is an organic electroluminescence device comprising a substrate having thereon a pair of electrodes and at least one organic layer containing a light emitting layer and being disposed between the electrodes, wherein at least one layer of the organic layer contains a compound represented by formula (1a) and a compound represented by formula (1b).

The light emitting layer preferably contains the material of the present invention as a phosphorescent material.

FIG. 1 shows one example of the configuration of the organic electroluminescence device of the present invention. In the organic electroluminescence device 10 of the present invention shown in FIG. 1, a light emitting layer 6 is sandwiched between a pair of electrodes (an anode 3 and a cathode 9) on a supporting substrate 2. More specifically, a hole injection layer 4, a hole transport layer 5, a light emitting layer 6, a hole blocking layer 7 and an electron transport layer 8 are stacked in this order between an anode 3 and a cathode 9.

In view of property of the luminescence device, at least one electrode of the anode and the cathode is preferably transparent or translucent.

<Configuration of Organic Layer>

The layer configuration of the organic layer is not particularly limited and may be appropriately selected according to the use and purpose of the organic electroluminescence device but is preferably formed on the transparent electrode or back plate. In this case, the organic layer is formed on the front surface or one surface of the transparent electrode or back plate.

The shape, size, thickness and the like of the organic layer are not particularly limited and may be appropriately selected according to the purpose.

Specific examples of the layer configuration include the following configurations, but the present invention is not limited thereto.

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/blocking layer/electron transport layer/cathode Anode/hole injection layer/hole transport layer/light emitting layer/blocking layer/electron transport layer/electron injection layer/cathode The device configuration, substrate, cathode and anode of an organic electroluminescence device are described in detail, for example, in JP-A-2008-270736, and the matters described therein can be applied to the present invention.

<Substrate>

The substrate for use in the present invention is preferably a substrate which does not scatter or attenuate the light emitted from the organic layer. In the case of an organic material, a substrate excellent in the heat resistance, dimensional stability, solvent resistance, electric insulation and processability is preferred.

<Anode>

The anode is usually sufficient if it has a function as an electrode of supplying a hole to the organic layer. The shape, structure, size and the like thereof are not particularly limited, and the anode material may be appropriately selected from known electrode materials according to the use or purpose of the luminescence device. As described above, the anode is usually provided as a transparent anode.

<Cathode>

The cathode is usually sufficient if it has a function as an electrode of injecting an electron in the organic layer. The shape, structure, size and the like thereof are not particularly limited, and the cathode material may be appropriately selected from known electrode materials according to the use or purpose of the luminescence device.

As for the substrate, anode and cathode, the matters described in JP-A-2008-270736, paragraphs [0070] to [0089] can be applied to the present invention.

<Organic Layer>

The organic layer is described below.

—Formation of Organic Layer—

In the organic electroluminescence device of the present invention, each of the organic layer may be suitably formed by any method such as dry deposition method (e.g., vapor deposition, sputtering), transfer method and printing method.

(Light Emitting Layer)

<Light Emitting Material>

The light emitting material for use in the present invention is preferably the above-described material of the present invention.

In the light emitting layer, the light emitting material is preferably contained in an amount of 0.1 to 50 mass %, and in view of durability and external quantum efficiency, more preferably from 1 to 50 mass %, still more preferably from 2 to 40 mass %, based on the mass of all compounds generally forming the light emitting layer.

In the case of using the material of the present invention as a phosphorescent material, the content thereof in the light emitting layer is, in view of luminous efficiency, preferably from 1 to 30 mass %, more preferably from 5 to 20 mass %, still more preferably from 7 to 15 mass %.

The thickness of the light emitting layer is not particularly limited but usually, the thickness is preferably from 2 to 500 nm, and in view of external quantum efficiency, more preferably from 3 to 200 nm, still more preferably from 5 to 100 nm.

In the device of the present invention, the light emitting layer may be composed of only a light emitting material or may have a mixed layer configuration of a host material and a light emitting material. The light emitting material may be either a fluorescent material or a phosphorescent material and as for the dopant, one kind of a dopant or two or more kinds of dopants may be used. The host material is preferably a charge transport material. As for the host material, one kind of a host material or two or more kinds of host materials may be used, and examples of this case include a configuration where an electron-transporting host material and a hole-transporting host material are mixed. Also, the light emitting layer may contain a material having no electron transport property and being incapable of emitting light.

Furthermore, the light emitting layer may be a single layer or a multilayer composed of two or more layers, and the layers may emit light of different colors.

<Host Material>

A compound described below may be contained as the host material for use in the present invention. Examples thereof include pyrrole, indole, carbazole (e.g., CBP (4,4'-di(9-carbazoyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, an aromatic tertiary amine compound, a styrylamine compound, a porphyrin-based compound, a polysilane-based compound, poly(N-vinylcarbazole), an aniline-base copolymer, an electrically conductive polymer oligomer such as thiophene oligomer and polythiophene, an organic silane, a carbon film, pyridine, pyrimidine, triazine, imidazole, pyrazole, triazole, oxazole, oxadiazole, anthraquinodimethane, anthrone, diphenylquinone, thiopyran dioxide, carbodiimide, fluorenylidenemethane, distyrylpyrazine, a fluorine-substituted aromatic compound, a heterocyclic tetracarboxylic anhydride such as naphthaleneperylene, various metal complexes typified by a metal complex of phthalocyanine or 8-quinolinol derivative and a metal complex having metal phthalocyanine, benzoxazole or benzothiazole as the ligand, and derivatives thereof (may have a substituent or form a condensed ring).

In view of color purity, luminous efficiency and drive durability, the lowest triplet excitation energy ($T_1$ energy) of the host material in the light emitting layer for use in the present invention is preferably higher than the $T_1$ energy of the phosphorescent material.

In the present invention, the content of the host compound is not particularly limited but in view of luminous efficiency and drive voltage, the content is preferably from 15 to 95 mass % based on the total mass of the light emitting layer.

The light emitting layer preferably contains a compound represented by formula (1a), (2a), (3a), (3a-1) to (3a-3) or (4a) and further contains the host material. The host material may be a hole-transporting host material or an electron-transporting host material, but a hole-transporting host material can be used.

In the present invention, the light emitting layer preferably contains a compound represented by formula (1a), (2a), (3a), (3a-1) to (3a-3) or (4a) and further contains at least one or more compounds represented by formula (4-1) or (4-2).

The compound represented by formula (4-1) or (4-2) is preferably contained in the light emitting layer in an amount of 30 to 100 mass %, more preferably from 40 to 100 mass %, still more preferably from 50 to 100 mass %. Also, in the case of using the compound represented by formula (4-1) or (4-2)

in a plurality of organic layers, the compound is preferably contained in each layer in the range above.

As for the compound represented by formula (4-1) or (4-2), only one kind of a compound may be contained in any one organic layer, or a plurality of compounds represented by formula (4-1) or (4-2) may be contained in combination in an arbitrary ratio.

The host material is preferably a compound represented by the following formula (4-1) or (4-2):

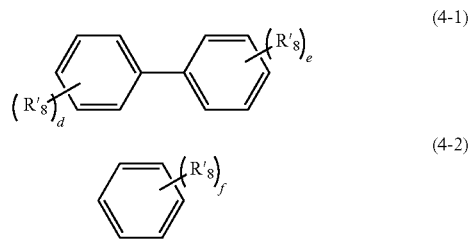

(4-1)

(4-2)

In formulae (4-1) and (4-2), each of d and e represents an integer of 0 to 3, and at least one is an integer of 1 or more. f represents an integer of 1 to 4, $R'_8$ represents a substituent, and when each of d, e and f is an integer of 2 or more, each $R'_8$ may be the same as or different from every other $R'_8$. Also, at least one $R'_8$ represents a carbazole group represented by the following formula (5):

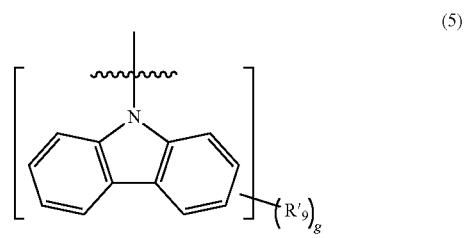

(5)

In formula (5), each $R'_9$ independently represents a substituent, and g represents an integer of 0 to 8.

Each $R'_8$ independently represents a substituent and is specifically a halogen atom, an alkoxy group, a cyano group, a nitro group, an alkyl group, an aryl group, a heterocyclic group or a substituent represented by formula (5) and in the case where $R'_8$ is not a substituent represented by formula (5), preferably an alkyl group having a carbon number of 10 or less or a substituted or unsubstituted aryl group having a carbon number of 10 or less, more preferably an alkyl group having a carbon number of 6 or less.

Each $R'_9$ independently represents a substituent and is specifically a halogen atom, an alkoxy group, a cyano group, a nitro group, an alkyl group, an aryl group or a heterocyclic group, preferably an alkyl group having a carbon number of 10 or less or a substituted or unsubstituted aryl group having a carbon number of 10 or less, more preferably an alkyl group having a carbon number of 6 or less.

g represents an integer of 0 to 8 and from the standpoint of not excessively shielding the carbazole structure in charge of electric charge transport, preferably an integer of 0 to 4. Also, from the standpoint of easy synthesis, when the carbazole has a substituent, the carbazole preferably has substituents to create a symmetry with respect to the nitrogen atom.

In formula (4-1), from the standpoint of keeping the charge transporting ability, the sum of d and e is preferably 2 or more.

Also, $R'_8$ is preferably substituted at the meta position with respect to another benzene ring, because when ortho-substituted, the steric hindrance between adjacent substituents is large and bond cleavage readily occurs to decrease the durability. Also, in para-substitution, the molecular shape comes close to a rigid bar shape to readily allow for crystallization and the device deterioration is liable to occur under high-temperature conditions. Specifically, a compound represented by the following structure is preferred.

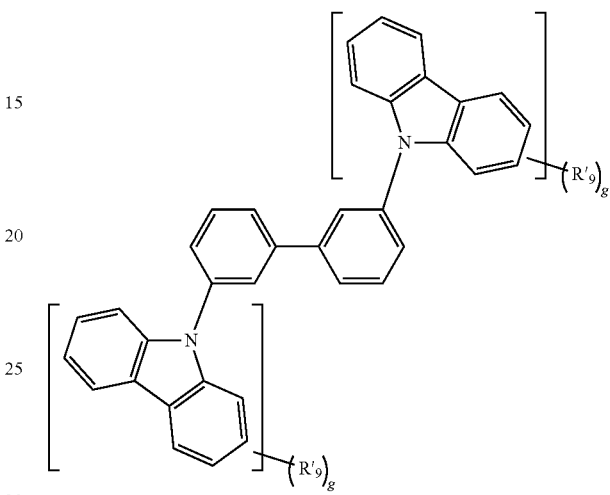

In formula (4-2), from the standpoint of keeping the charge transporting ability, f is preferably 2 or more. When f is 2 or 3, from the same reason, $R'_8$ are preferably substituted at the meta position from each other. Specifically, a compound represented by the following structure is preferred.

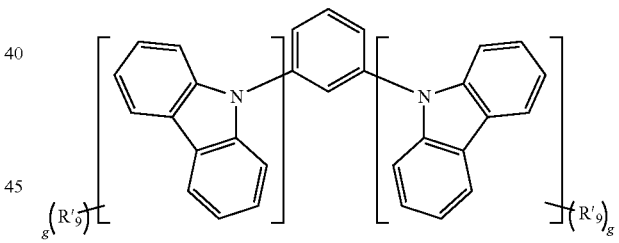

In the case of formulae (4-1) and (4-2) have a hydrogen atom, the hydrogen includes its isotopes (e.g., deuterium atom). In this case, all hydrogen atoms in the compound may be replaced by a hydrogen isotope, or the compound may be a mixture partially containing a hydrogen isotope. Preferably, $R'_9$ in formula (5) is replaced by deuterium and in particular, the following structures are preferred.

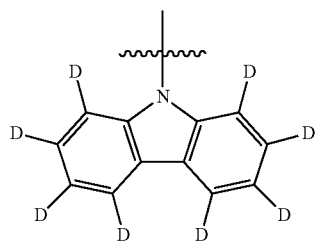

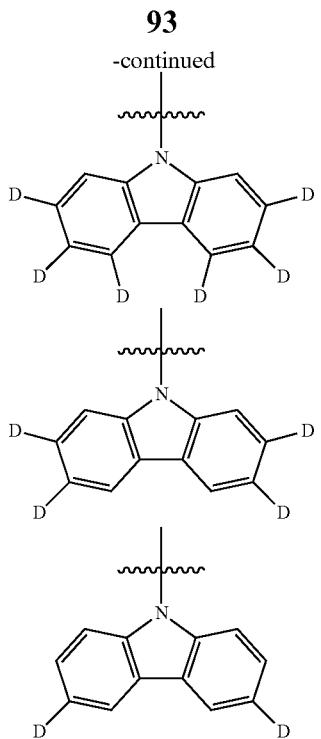

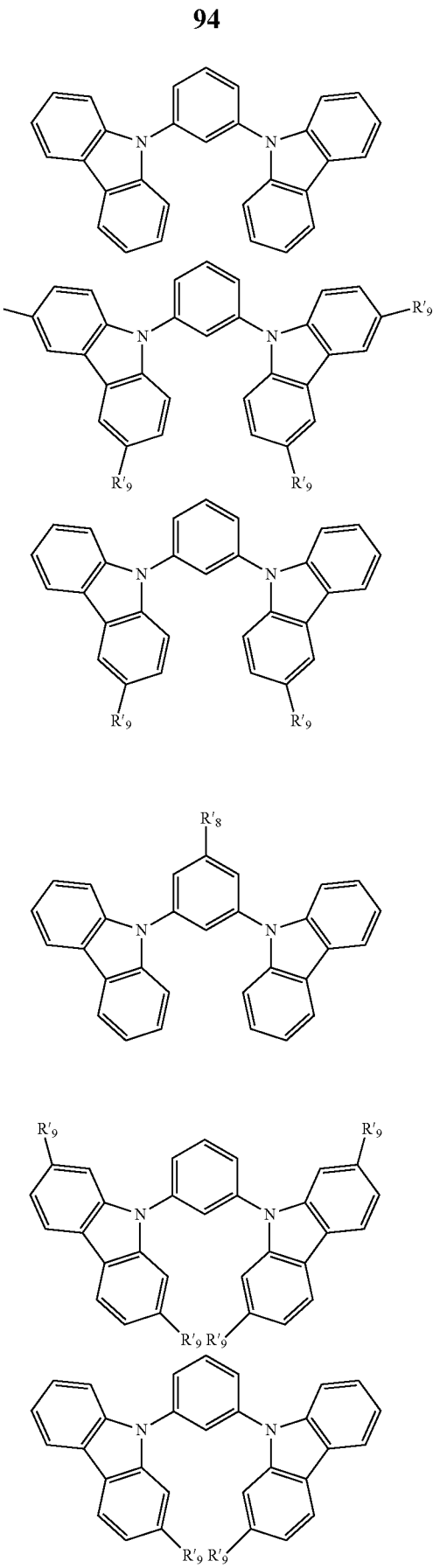

Furthermore, the atoms constituting the substituent includes its isotopes.

The compounds represented by formulae (4-1) and (4-2) can be synthesized by combining various known synthesis methods. With respect to the carbazole compound, a most common synthesis is a synthesis by a dehydrogenative aromatization after an aza-Cope rearrangement reaction of a condensate of an arylhydrazine with a cyclohexane derivative (L. F. Tieze, Th. Eicher (translated by Takano, Ogasawara), Seimitsu Yuki Gosei (Detailed Organic Syntheses), page 339, Nankodo). Also, with respect to the coupling reaction between the obtained carbazole compound and a halogenated aryl compound by using a palladium catalyst, methods described, for example, in Tetrahedron Letters, Vol. 39, page 617 (1998), ibid., Vol. 39, page 2367 (1998) and ibid., Vol. 40, page 6393 (1999) are known. The reaction temperature and reaction time are not particularly limited, and the conditions described in the publications above can be applied. Furthermore, as for some compounds such as mCP, commercially available products can be suitably used.

The compounds represented by formulae (4-1) and (4-2) for use in the present invention are preferably formed into a thin film by a vacuum deposition process, but a wet process such as solution coating can also be suitably used. From the standpoint of deposition suitability or solubility, the molecular weight of the compound is preferably 2,000 or less, more preferably 1,200 or less, still more preferably 800 or less. Also, in view of deposition suitability, if the molecular weight is too small, the vapor pressure becomes small, failing in causing transition from a vapor phase to a solid phase, and an organic layer can be hardly formed. Therefore, the molecular weight is preferably 250 or more, more preferably 300 or more.

The compounds represented by formulae (4-1) and (4-2) are preferably a structure shown below or a compound where one or more hydrogen atoms in the structure are replaced by a deuterium atom.

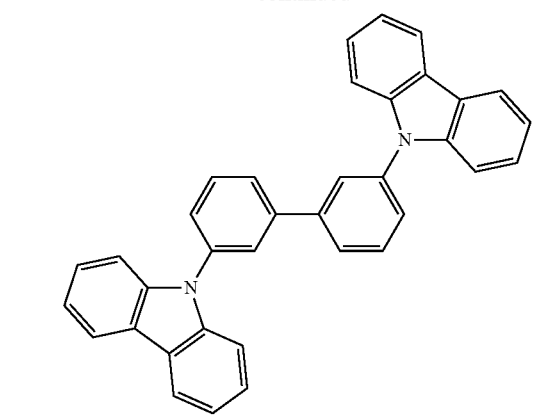
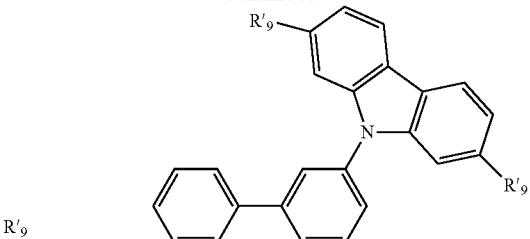
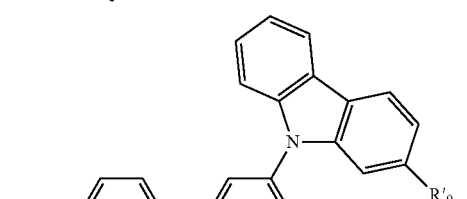
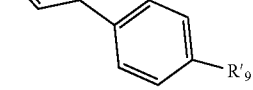
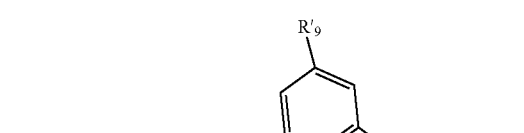
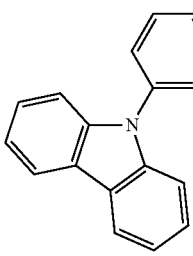
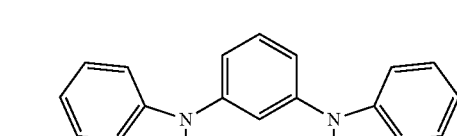
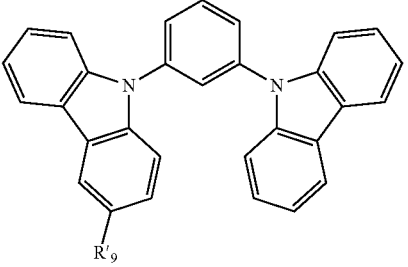

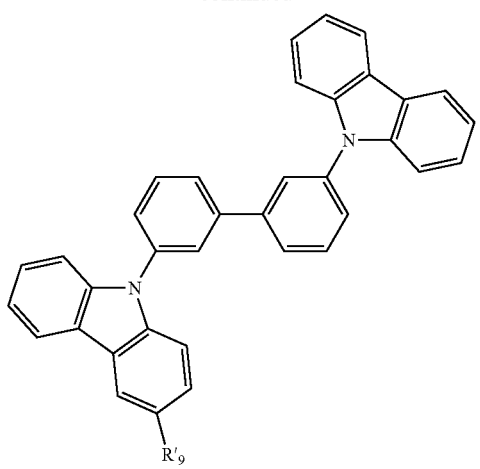
In the above compounds, the definitions of R'₈ to R'₉ are the same as those of R'₈ to R'₉ in formulae (5), (4-1) and (4-2) and preferred ranges are also the same.
Specific examples of the compounds represented by formulae (4-1) and (4-2) for use in the present invention are illustrated below, but the present invention is not limited thereto.
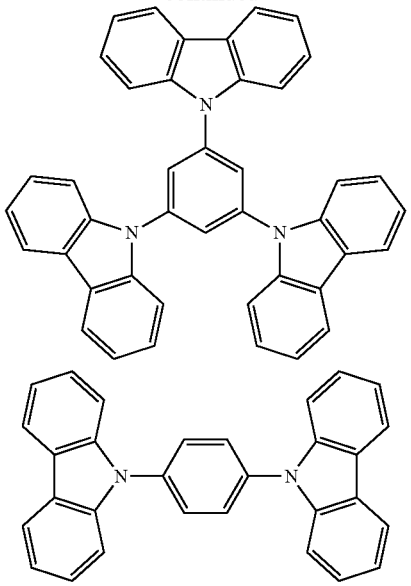
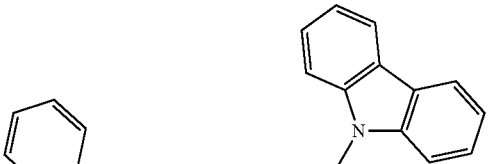
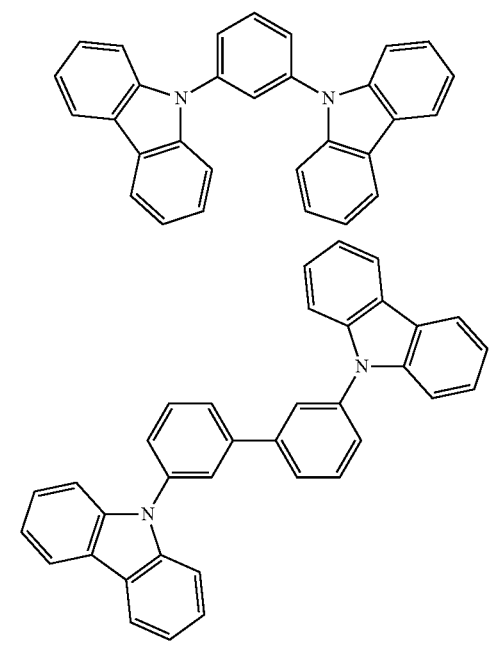
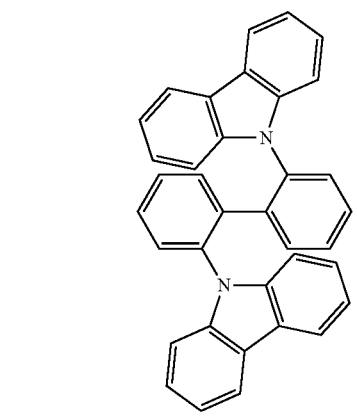
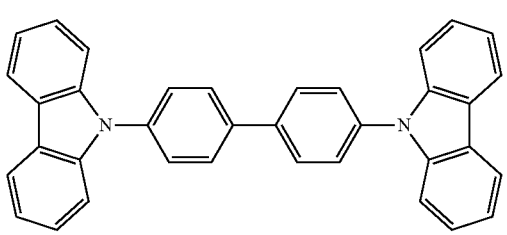
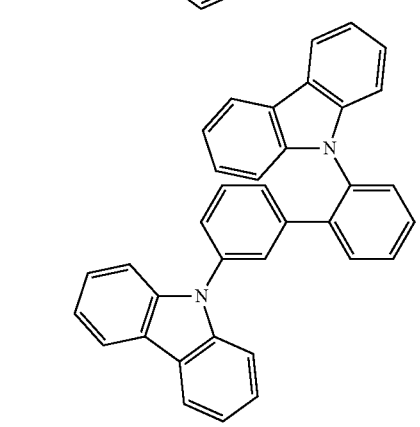

99
-continued
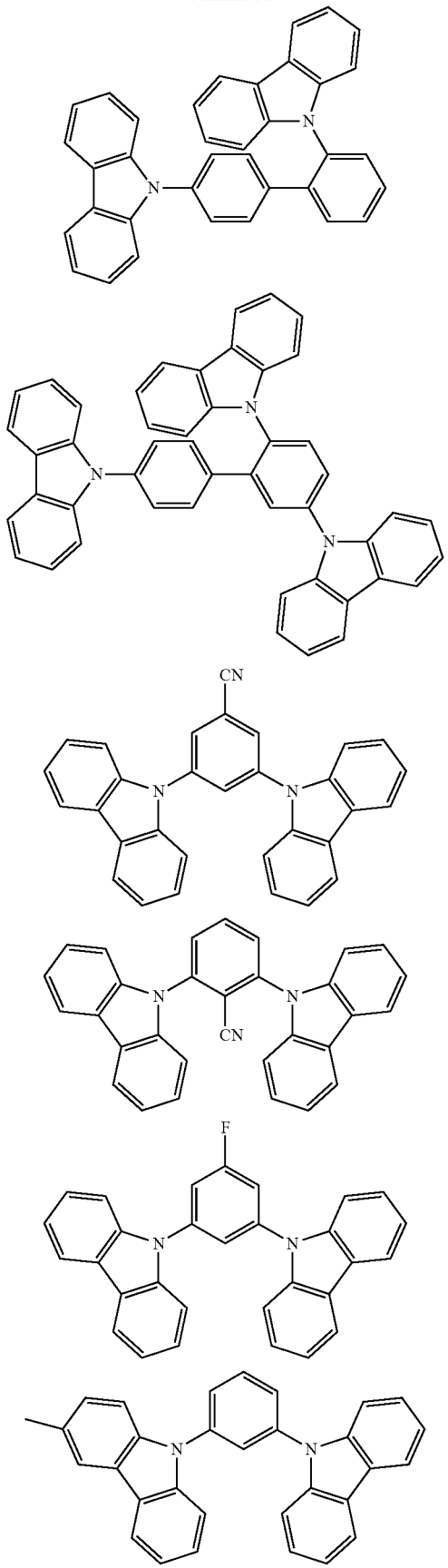
100
-continued
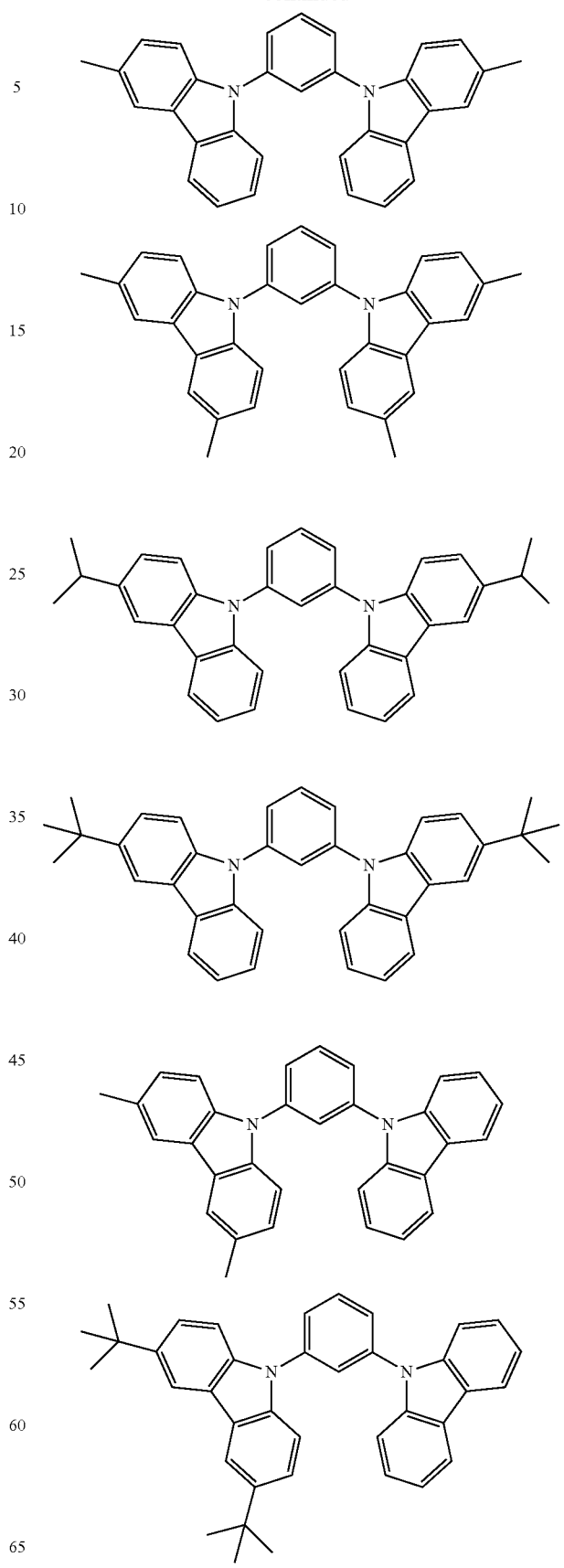

101
-continued
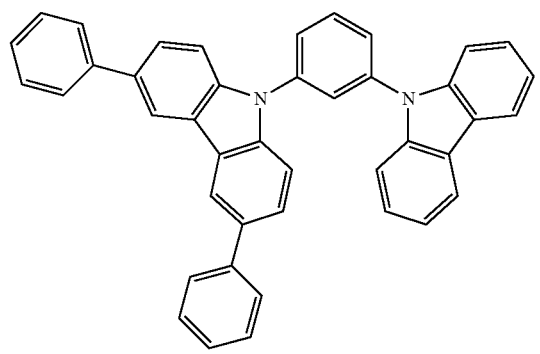
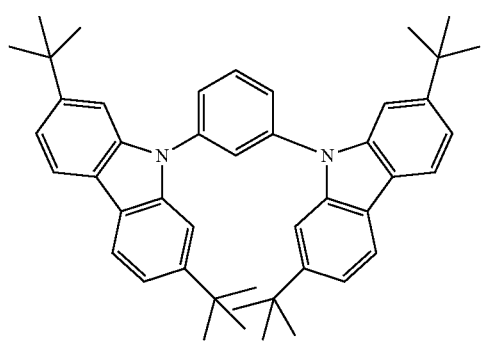
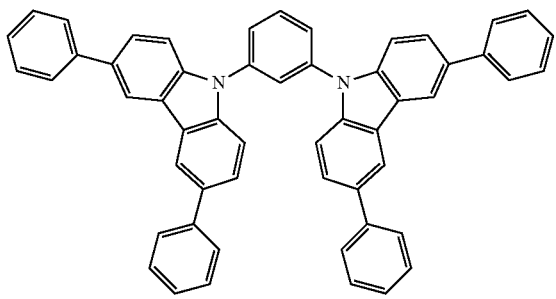
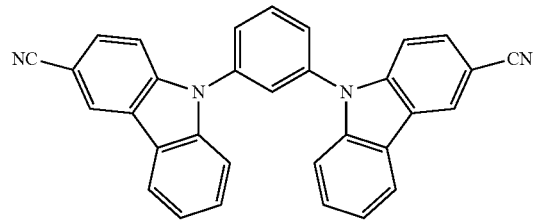
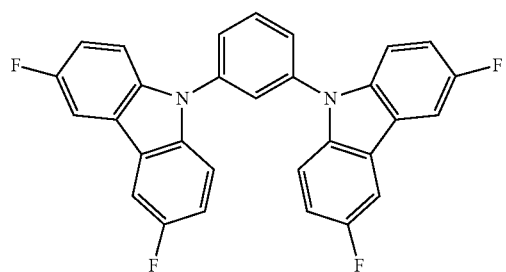
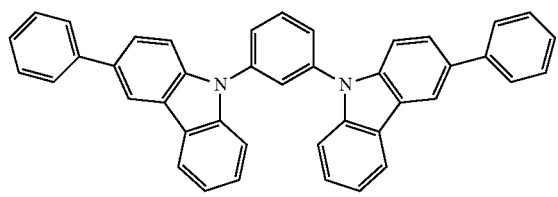
102
-continued
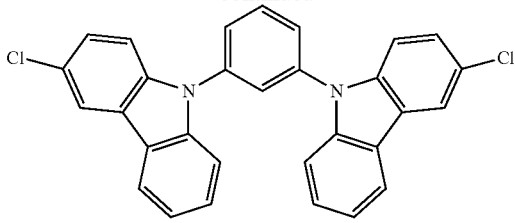
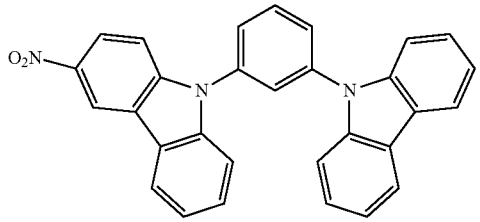
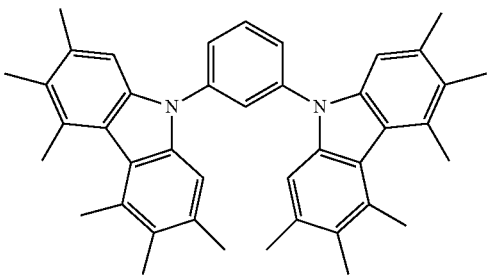
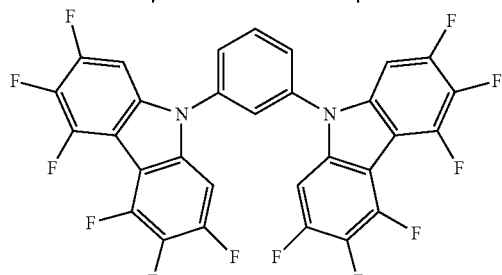
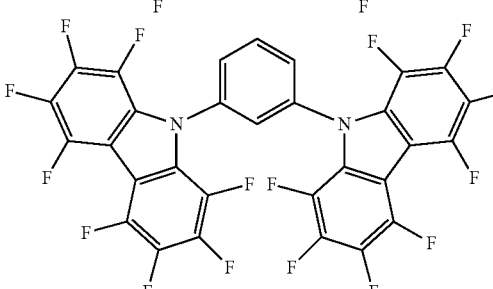
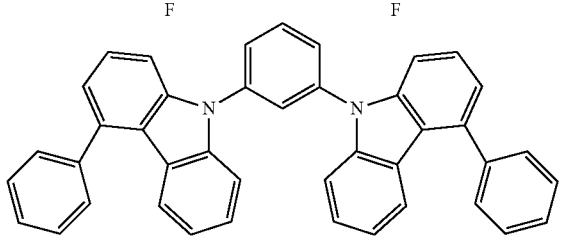
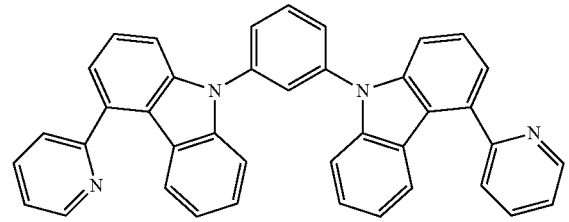

103
-continued
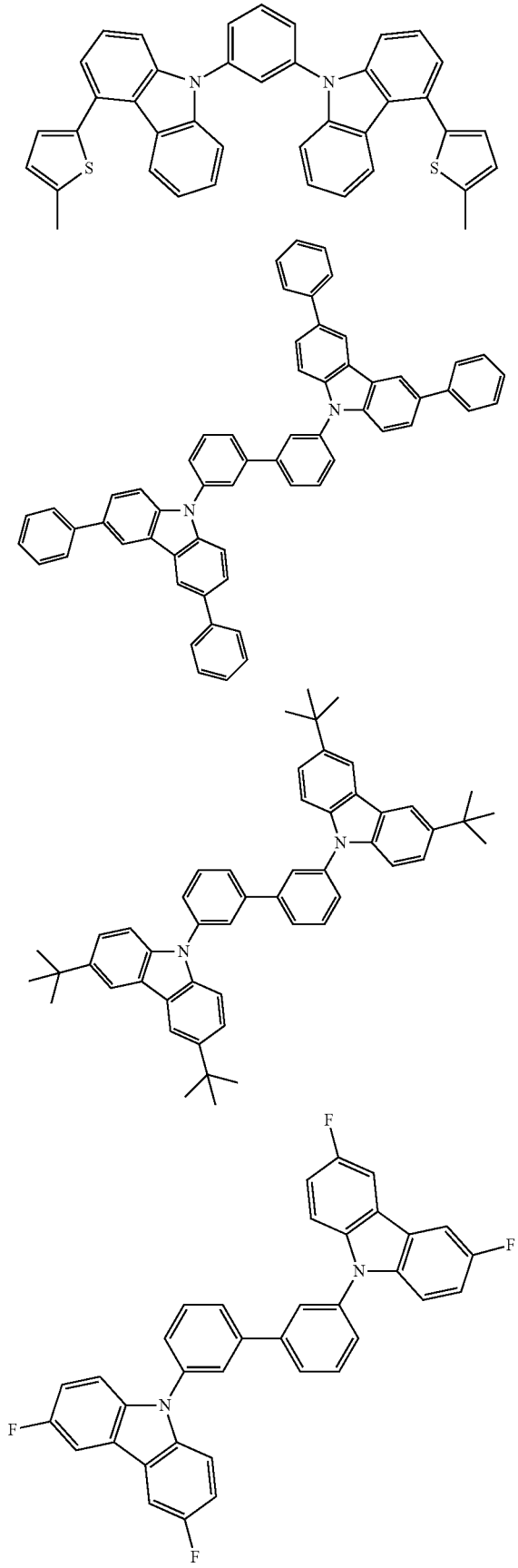
104
-continued
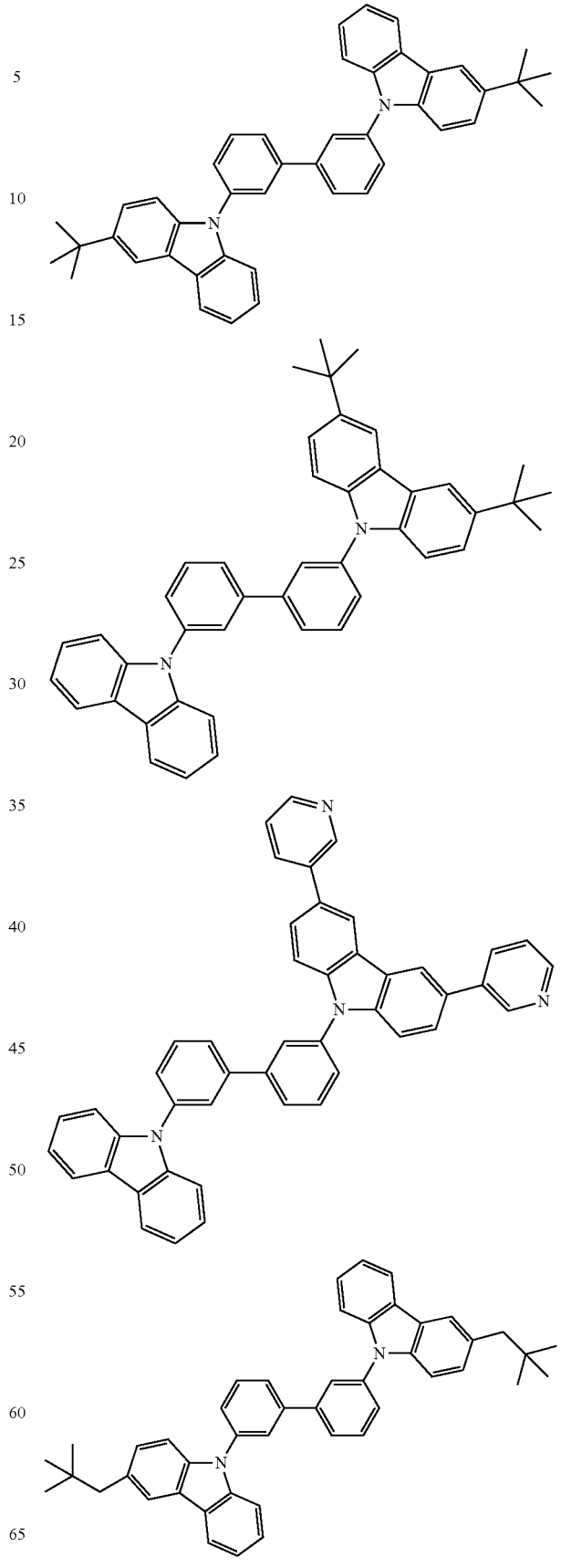

105
-continued
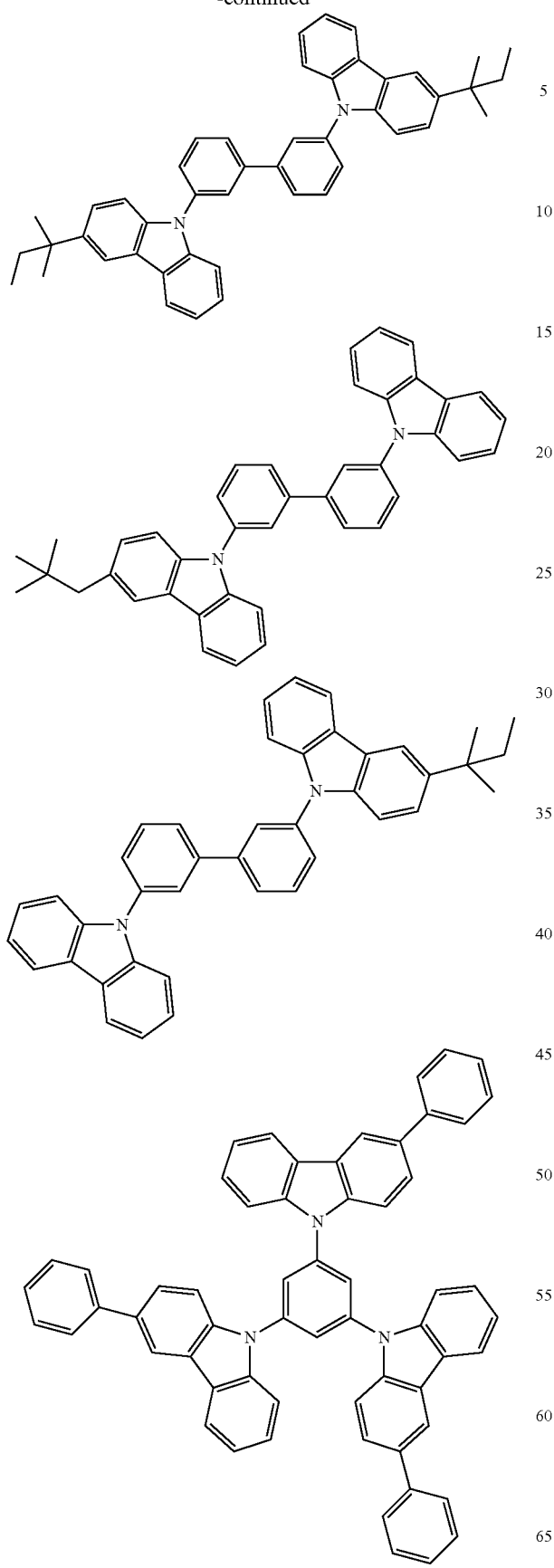
106
-continued
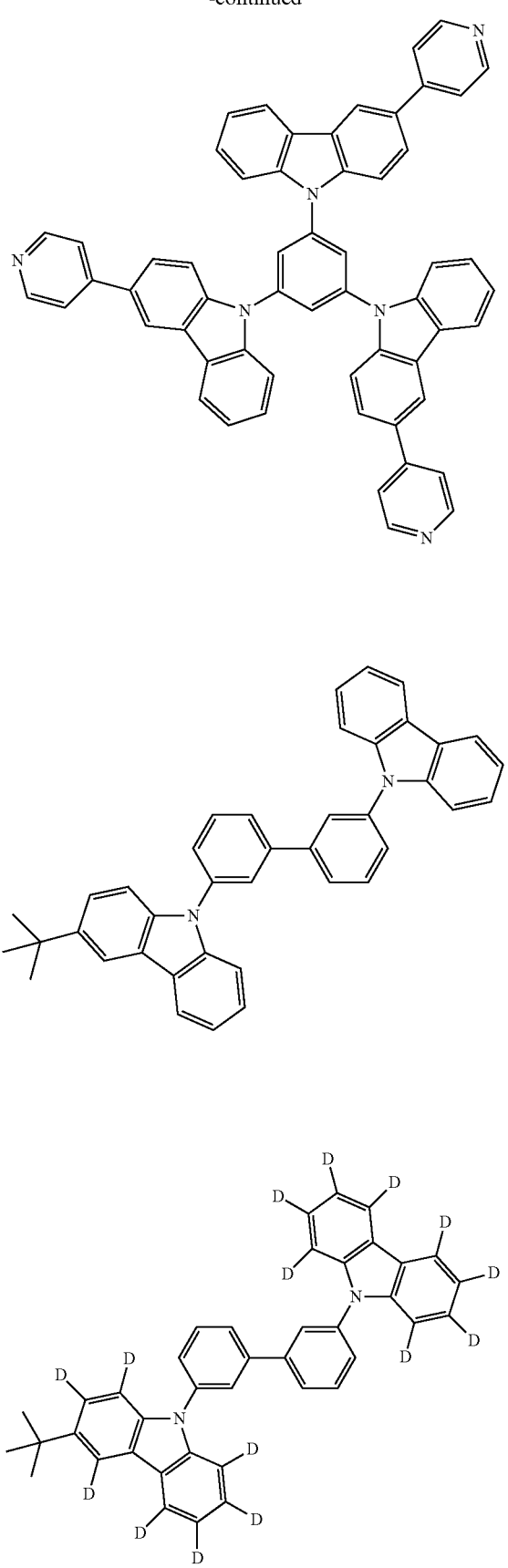

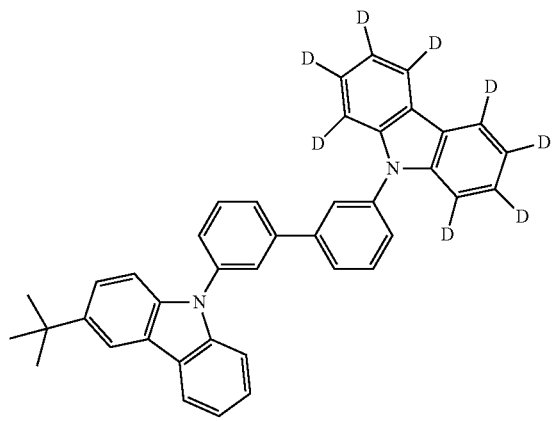
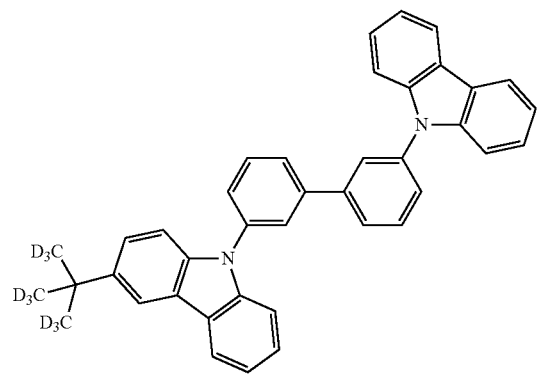
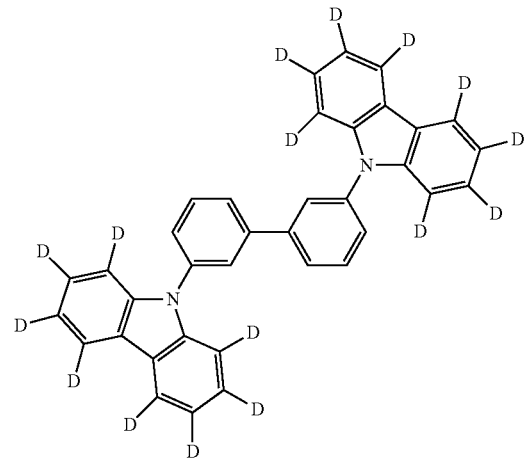
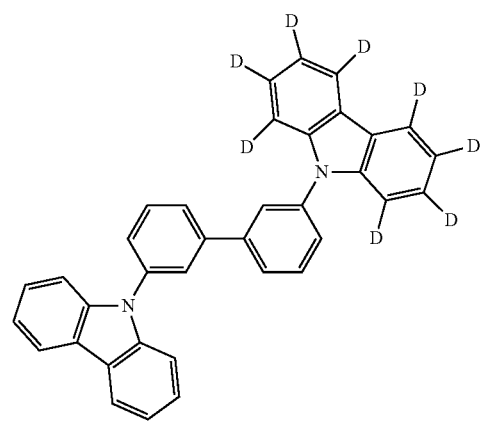
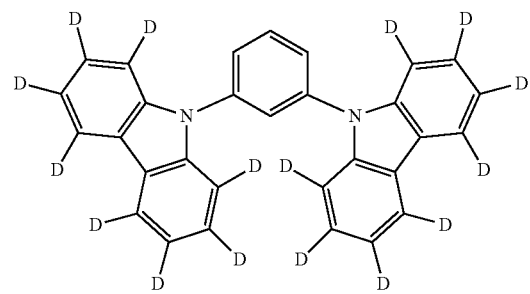
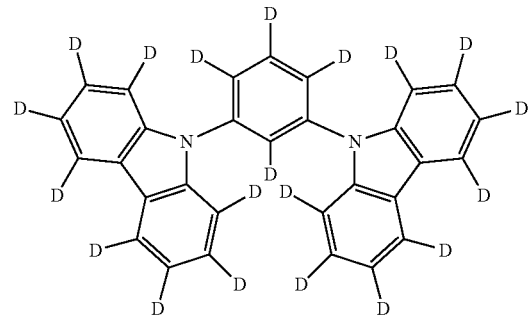
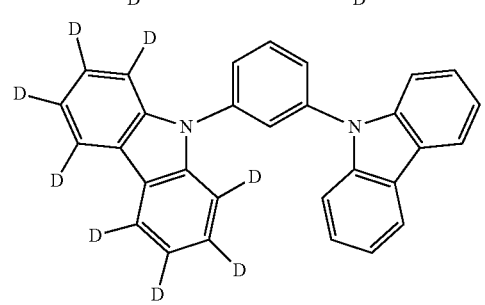
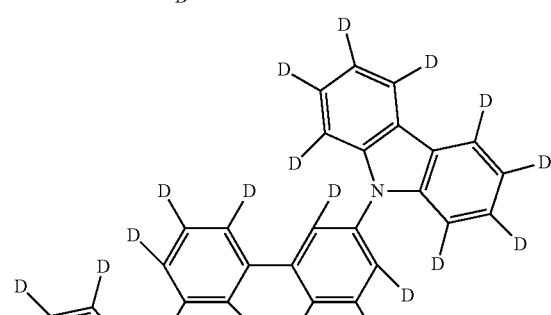
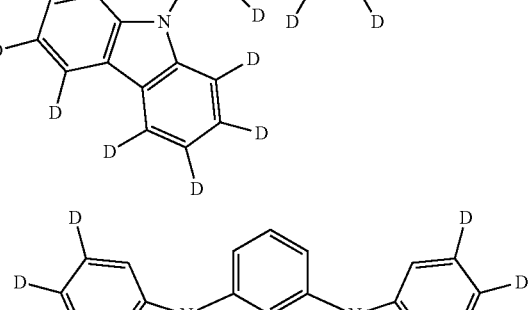
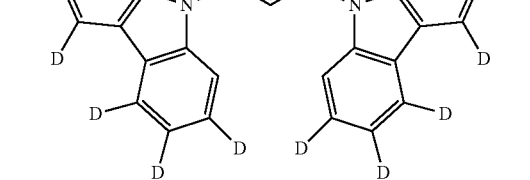

-continued

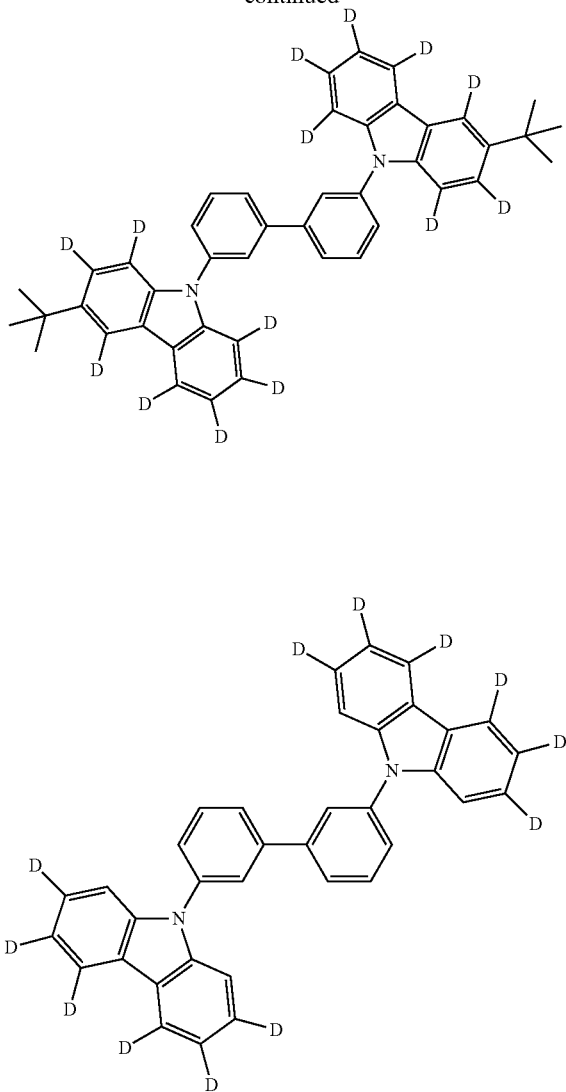

(Fluorescent Material)

Examples of the fluorescent material which can be used in the present invention include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perinon derivative, an oxadiazole derivative, an oxazine derivative, an aldazine derivative, a pyrrolidine derivative, a cyclopentadiene derivative, a bis-styrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidine compound, various complexes typified by a complex of 8-quinolinol derivative and a complex of pyrromethene derivative, a polymer compound such as polythiophene, polyphenylene and polyphenylenevinylene, and a compound such as organic silane derivative.

Examples of the phosphorescent material which can be used in the present invention include phosphorescent compounds described in patent documents such as U.S. Pat. Nos. 6,303,238B1, 6,097,147, WO00/57676, WO00/70655, WO01/08230, WO01/39234A2, WO01/41512A1, WO02/02714A2, WO02/15645A1, WO02/44189A1, WO05/19373A2, JP-A-2001-247859, JP-A-2002-302671, JP-A-2002-117978, JP-A-2003-133074, JP-A-2002-235076, JP-A-2003-123982, JP-A-2002-170684, EP1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635 and JP-A-2007-96259. Above all, as for the light emitting dopant, an Ir complex, a Pt complex, a Cu complex, a Re complex, a W complex, a Rh complex, a Ru complex, a Pd complex, an Os complex, a Eu complex, a Tb complex, a Gd complex, a Dy complex and a Ce complex are preferred; an Ir complex, a Pt complex and a Re complex are more preferred; an Ir complex, a Pt complex and a Re complex each containing at least one coordination mode of a metal-carbon bond, a metal-nitrogen bond, a metal-oxygen bond and a metal-sulfur bond are still more preferred; and in view of luminous efficiency, drive durability, chromaticity and the like, an Ir complex, a Pt complex and a Re complex each containing a tridentate or higher polydentate ligand are yet still more preferred.

The content of the phosphorescent material in the light emitting layer is preferably from 0.1 to 50 mass %, more preferably from 0.2 to 50 mass %, still more preferably from 0.3 to 40 mass %, and most preferably from 1 to 30 mass %, based on the total mass of the light emitting layer.

The content of the phosphorescent material (the above-described material of the present invention and/or a phosphorescent material used in combination) which can be used in the present invention is preferably from 0.1 to 50 mass %, more preferably from 1 to 40 mass %, and most preferably from 5 to 30 mass %, based on the total mass of the light emitting layer. In particular, within the range of 5 to 30 mass %, the chromaticity of luminescence of the organic electroluminescence device is small in the dependency on the concentration of the phosphorescent material added. As described above, the organic electroluminescence device of the present invention most preferably contains at least one kind of the material of the present invention in an amount of 1 to 30 mass % based on the total mass of the light emitting layer.

In the organic electroluminescence device, any one layer of the organic layer preferably further contains a hydrocarbon compound, and it is more preferred that a light emitting layer contains a hydrocarbon compound.

The hydrocarbon compound is preferably a compound represented by the following formula (VI).

By appropriately using the compound represented by formula (VI) together with the light emitting material, the interaction between material molecules can be adequately controlled to make uniform the energy gap and interaction between adjacent molecules, whereby the drive voltage can be more lowered.

Also, the compound represented by formula (VI) for use in the organic electroluminescence device is excellent in chemical stability and less causes a deterioration such as decomposition of the material during the device driving, so that the organic electroluminescence device can be prevented from reduction in the efficiency or life due to decomposition of the material.

The compound represented by formula (VI) is described below.

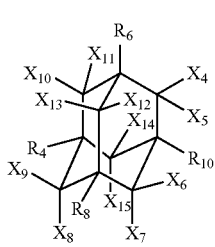

(VI)

In formula (VI), each of $R_4$, $R_6$, $R_8$, $R_{10}$ and $X_4$ to $X_{15}$ independently represents a hydrogen atom, an alkyl group or an aryl group.

In formula (VI), the alkyl group represented by $R_4$, $R_6$, $R_8$, $R_{10}$ and $X_4$ to $X_{15}$ may be substituted with an adamantane structure or an aryl structure and is preferably an alkyl group having a carbon number of 1 to 70, more preferably from 1 to 50, still more preferably from 1 to 30, yet still more preferably from 1 to 10, even yet still more preferably from 1 to 6, and most preferably a linear alkyl group having a carbon number of 2 to 6.

Examples of the alkyl group represented by $R_4$, $R_6$, $R_8$, $R_{10}$ and $X_4$ to $X_{15}$ in formula (VI) include an n-$C_{50}H_{101}$ group, an n-$C_{30}H_{61}$ group, a 3-(3,5,7-triphenyladamantan-1-yl)propyl group (carbon number: 31), a trityl group (carbon number: 19), a 3-(adamantan-1-yl)propyl group (carbon number: 13), a 9-decalyl group (carbon number: 10), a benzyl group (carbon number: 7), a cyclohexyl group (carbon number: 6), an n-hexyl group (carbon number: 6), an n-pentyl group (carbon number: 5), an n-butyl group (carbon number: 4), an n-propyl group (carbon number: 3), a cyclopropyl group (carbon number: 3), an ethyl group (carbon number: 2) and a methyl group (carbon number: 1).

In formula (VI), the aryl group represented by $R_4$, $R_6$, $R_8$, $R_{10}$ and $X_4$ to $X_{15}$ may be substituted with an adamantane structure or an aryl structure and is preferably an aryl group having a carbon number of 6 to 30, more preferably from 6 to 20, still more preferably from 6 to 15, yet still more preferably from 6 to 10, and most preferably 6.

Examples of the aryl group represented by $R_4$, $R_6$, $R_8$, $R_{10}$ and $X_4$ to $X_{15}$ in formula (VI) include a 1-pyrenyl group (carbon number: 16), a 9-anthracenyl group (carbon number: 14), a 1-naphthyl group (carbon number: 10), a 2-naphthyl group (carbon number: 10), a p-tert-butylphenyl group (carbon number: 10), a 2-m-xylyl group (carbon number: 8), a 5-m-xylyl group (carbon number: 8), an o-tolyl group (carbon number: 7), an m-tolyl group (carbon number: 7), a p-tolyl group (carbon number: 7) and a phenyl group (carbon number: 6).

In formula (VI), $R_4$, $R_6$, $R_8$ and $R_{10}$ may be a hydrogen atom, an alkyl group or an aryl group, but from the standpoint that a high glass transition temperature is preferred, at least one member is preferably an aryl group; more preferably, at least two members are an aryl group; and still more preferably, three or four members are an aryl group.

In formula (VI), each of $X_4$ to $X_{15}$ may be a hydrogen atom, an alkyl group or an aryl group but is preferably a hydrogen atom or an aryl group, more preferably a hydrogen atom.

The organic electroluminescence device is fabricated using a vacuum deposition process or a solution coating process and therefore, in view of vapor deposition suitability or solubility, the molecular weight of the compound represented by formula (VI) for use in the present invention is preferably 2,000 or less, more preferably 1,200 or less, still more preferably 1,000 or less. Also, from the standpoint of deposition suitability, if the molecular weight is too small, the vapor pressure becomes small, failing in causing transition from a vapor phase to a solid phase, and an organic layer can be hardly formed. Therefore, the molecular weight is preferably 250 or more, more preferably 350 or more, still more preferably 400 or more.

The compound represented by formula (VI) is preferably a solid at room temperature (25° C.), more preferably a solid in the range of room temperature (25° C.) to 40° C., still more preferably a solid in the range of room temperature (25° C.) to 60° C.

In the case of using a compound represented by formula (VI) that does not form a solid at room temperature (25° C.), a solid phase can be formed at ordinary temperature by the combination with other materials.

The compound represented by formula (VI) is not limited in its use and may be contained in any layer within the organic layer. The layer into which the compound represented by formula (VI) for use in the present invention is introduced is preferably any one of a light emitting layer, a hole injection layer, a hole transport layer, an electron transport layer, an electron injection layer, an exciton blocking layer and a charge blocking layer, which are described later, or a plurality of layers thereof. The compound is more preferably contained in any one of a light emitting layer, a hole injection layer, a hole transport layer, an electron transport layer and an electron injection layer, or in a plurality of layers thereof, still more preferably in any one of a light emitting layer, a hole injection layer and a hole transport layer, or in a plurality of layers thereof, and most preferably in a light emitting layer.

In the case of using the compound represented by formula (VI) in the organic layer, the compound represented by formula (VI) needs to be used by limiting its amount to such an extent as not inhibiting the charge transportability, and the content of the compound represented by formula (VI) is preferably from 0.1 to 70 mass %, more preferably from 0.1 to 30 mass %, still more preferably from 0.1 to 25 mass %.

Also, in the case of using the compound represented by formula (VI) in a plurality of organic layers, the compound is preferably contained in the range above in each layer.

Only one kind of a compound represented by formula (VI) may be contained in any organic layer, or a plurality of kinds of compounds represented by formula (VI) may be contained in combination in an arbitrary ratio.

Specific examples of the compound represented by formula (VI) are illustrated below, but the present invention is not limited thereto.

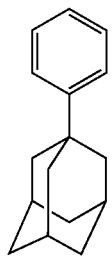

(1-1)

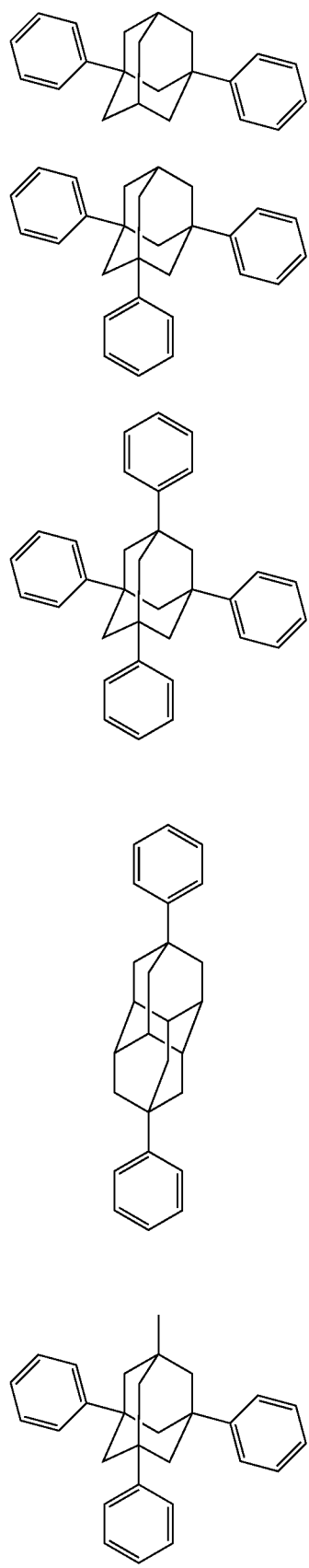
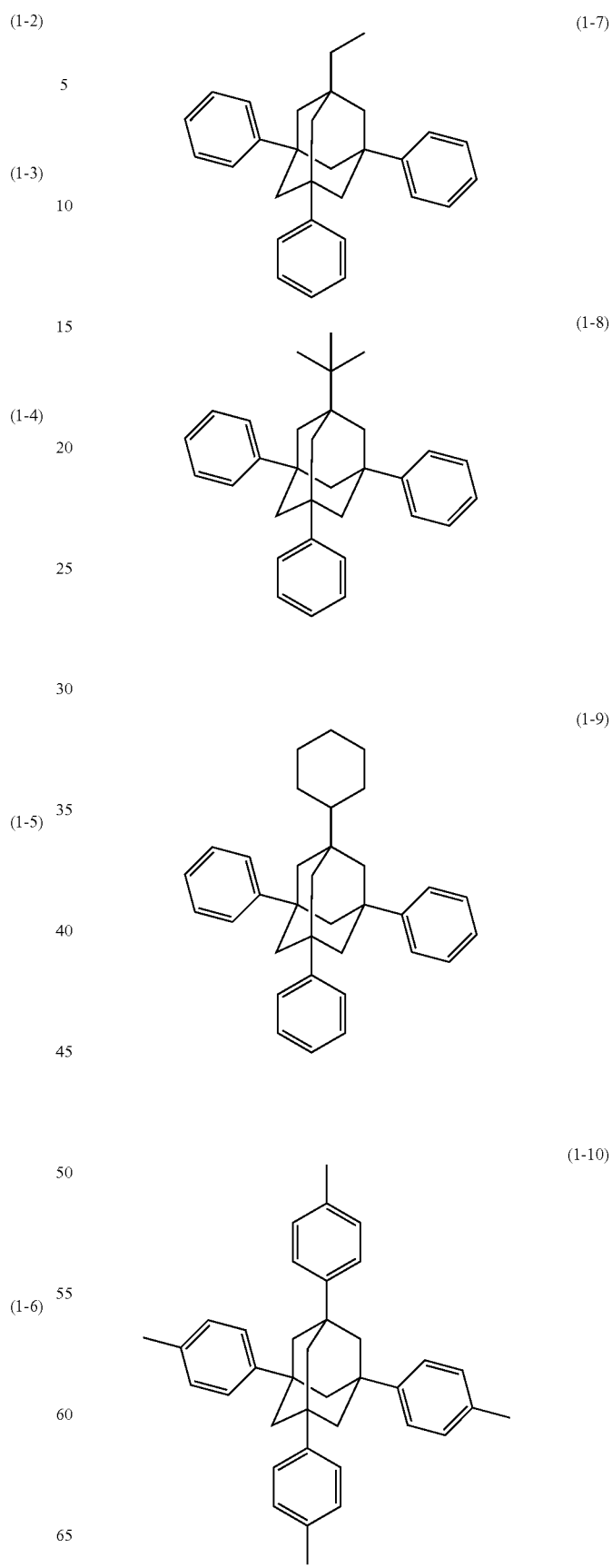

(1-11)

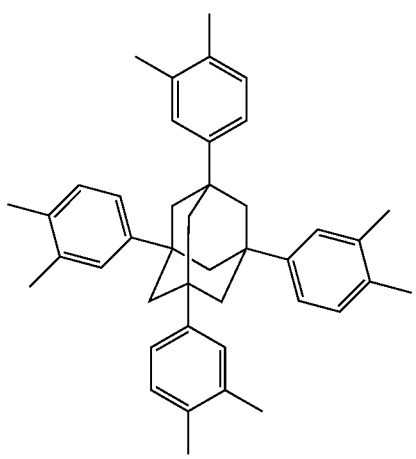

(1-12)

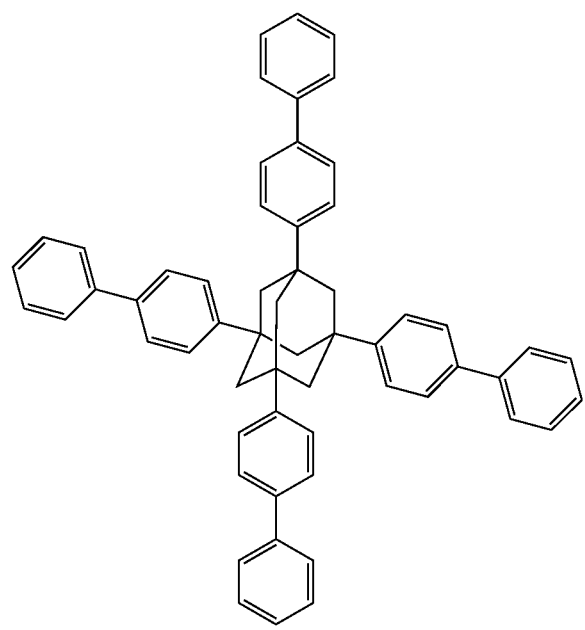

(1-13)

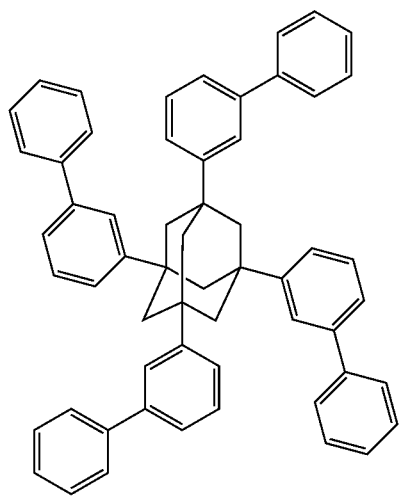

(1-14)

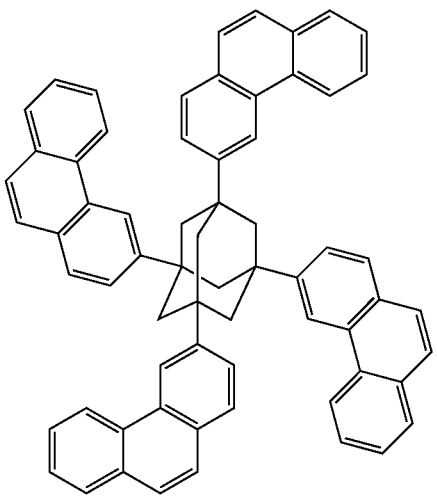

The compound represented by formula (VI) can also be synthesized by appropriately combining an adamantane or a halogenated adamantane with an alkyl halide or an alkylmagnesium halide (Grignard's reagent). For example, a halogenated adamantane and an alkyl halide can be coupled using indium (Document 1); an alkyl halide may be converted into an alkyl copper reagent and coupled with Grignard's reagent of an aromatic compound (Document 2); or an alkyl halide can be coupled using an appropriate arylboric acid and a palladium catalyst (Document 3).

Document 1: Tetrahedron Lett., 39, 9557-9558 (1998)
Document 2: Tetrahedron Lett., 39, 2095-2096 (1998)
Document 3: J. Am. Chem. Soc., 124, 13662-13663 (2002)

The adamantane structure having an aryl group can be synthesized by appropriately combining an adamantane or a halogenated adamantane with a corresponding arene or aryl halide.

Incidentally, in the production methods described above, when the defined substituent changes under the conditions of a certain synthesis method or is improper to perform the method, the compound can be easily produced, for example, by a technique of protection or deprotection of a functional group (see, for example, T. W. Greene, Protective Groups in Organic Synthesis, John Wiley & Sons Inc. (1981)). Also, the order of reaction processes such as introduction of a substituent can be arbitrarily changed, if desired.

The thickness of the light emitting layer is not particularly limited but usually, the thickness is preferably from 1 to 500 nm, more preferably from 5 to 200 nm, still more preferably from 10 to 100 nm.

—Hole Injection Layer, Hole Transport Layer—

The hole injection layer and hole transport layer are a layer having a function of receiving a hole from the anode or anode side and transporting it to the cathode side.

In the present invention, a hole injection layer or hole transport layer containing an electron-accepting dopant is preferably contained as an organic layer.

—Electron Injection Layer, Electron Transport Layer—

The electron injection layer and electron transport layer are a layer having a function of receiving an electron from the cathode or cathode side and transporting it to the anode side.

As regards the hole injection layer, hole transport layer, electron injection layer and electron transport layer, the matters described in JP-A-2008-270736, paragraphs [0165] to [0167] can be applied to the present invention.

—Hole Blocking Layer—

The hole blocking layer is a layer having a function of not allowing a hole transported to the light emitting layer from the anode side to penetrate to the cathode side. In the present invention, the hole blocking layer may be provided as an organic compound layer adjacent to the light emitting layer on the cathode side.

Examples of the organic compound constituting the hole blocking layer include an aluminum complex such as aluminum(III) bis(2-methyl-8-quinolinato)4-phenylphenolate (simply referred to as "BAlq"), a triazole derivative, and a phenanthroline derivative such as (2,9-dimethyl-4,7-diphenyl-1,10-phenanthroline (simply referred to as "BCP").

The thickness of the hole blocking layer is preferably from 1 to 500 nm, more preferably from 5 to 200 nm, still more preferably from 10 to 100 nm.

The hole blocking layer may have a single-layer structure composed of one kind of a material described above or two or more kinds of the materials or may have a multilayer structure composed of a plurality of layers having the same composition or different compositions.

—Electron Blocking Layer—

The electron blocking layer is a layer having a function of not allowing an electron transported to the light emitting layer from the cathode side to penetrate to the anode side. In the present invention, the electron blocking layer may be provided as an organic compound layer adjacent to the light emitting layer on the anode side.

Examples of the organic compound constituting the electron blocking layer include those described above as the hole transport material.

The thickness of the electron blocking layer is preferably from 1 to 500 nm, more preferably from 5 to 200 nm, still more preferably from 10 to 100 nm.

The electron blocking layer may have a single-layer structure composed of one kind of a material described above or two or more kinds of the materials or may have a multilayer structure composed of a plurality of layers having the same composition or different compositions.

<Protective Layer>

In the present invention, the entire organic EL device may be protected by a protective layer.

As for the protective layer, the matters described in JP-A-2008-270736, paragraphs [0169] and [0170] can be applied to the present invention.

<Sealing Container>

The device of the present invention may be entirely sealed using a sealing container.

As for the sealing container, the matters described in JP-A-2008-270736, paragraph [0171] can be applied to the present invention.

(Drive)

Luminescence of the organic electroluminescence device of the present invention can be obtained by applying a direct-current (if desired, an alternate-current component may be contained) voltage (generally from 2 to 15 volts) or DC current between the anode and the cathode.

As for the driving method of the organic electroluminescence device of the present invention, the driving methods described, for example, in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be applied to the present invention.

The light collection efficiency of the luminescence device of the present invention can be enhanced by various known devices. For example, the light collection efficiency and the external quantum efficiency can be enhanced by processing the substrate surface shape (for example, forming a fine uneven pattern), by controlling the refractive index of the substrate, ITO layer or organic layer, or by controlling the film thickness of the substrate, ITO layer or organic layer.

The luminescence device of the present invention may be in a so-called top emission system of collecting light from the anode side.

The organic EL device in the present invention may have a resonator structure. For example, a multilayer mirror composed of a plurality of laminated films differing in the refractive index, a transparent or translucent electrode, a light emitting layer, and a metal electrode are superposed on a transparent substrate. Light generated in the light emitting layer repeats reflection and resonates between the multilayer mirror and the metal electrode by using these as reflectors.

In another preferred embodiment, each of a transparent or translucent electrode and a metal electrode functions as a reflector on a transparent substrate, and light generated in the light emitting layer repeats reflection and resonates therebetween.

In order to form a resonance structure, the effective refractive index of two reflectors and the optical path length determined from the refractive index and thickness of each layer between the reflectors are adjusted to optimal values for obtaining a desired resonance wavelength. The calculating formula in the case of the first embodiment is described in JP-A-9-180883, and the calculating formula in the case of the second embodiment is described in JP-A-2004-127795.

The external quantum efficiency of the organic electroluminescence device of the present invention is preferably 2.5% or more, more preferably 3.0% or more, still more preferably 3.5% or more. As for the numerical value of the external quantum efficiency, a maximum value of the external quantum efficiency when the device is driven at 20° C., or a value of the external quantum efficiency in the vicinity of 1,000 cd/m$^2$ when the device is driven at 20° C., can be used.

The internal quantum efficiency of the organic electroluminescence device of the present invention is preferably 30% or more, more preferably 50% or more, still more preferably 70% or more. The internal quantum efficiency of the device is calculated by dividing the external quantum efficiency by the light collection efficiency. In the normal organic EL device, the light collection efficiency is about 20%, but the light collection efficiency can be increased to 20% or more by designing the shape of substrate, the shape of electrode, the thickness of organic layer, the thickness of inorganic layer, the refractive index of organic layer, the refractive index of inorganic layer, or the like.

The organic electroluminescence device of the present invention preferably has a maximum emission wavelength (a maximum intensity wavelength of the emission spectrum) at 350 to 700 nm, more preferably at 350 to 600 nm, still more preferably at 400 to 520 nm, yet still more preferably at 400 to 470 nm.

(Use of Luminescence Device of the Present Invention)

The luminescence device of the present invention can be suitably used for light emission apparatuses, pixels, display devices, displays, backlights, electrophotography, illumination light sources, recording light sources, exposure light sources, reading light sources, indicators, signboards, interiors, optical communication and the like. In particular, the luminescence device of the present invention is preferably used for a device that is driven in a region with high luminescence luminance, such as light emission apparatus, illumination apparatus and display apparatus.

The light emission apparatus of the present invention is described below by referring to FIG. 2.

The light emission apparatus of the present invention uses the above-described organic electroluminescence device.

Figure 2:
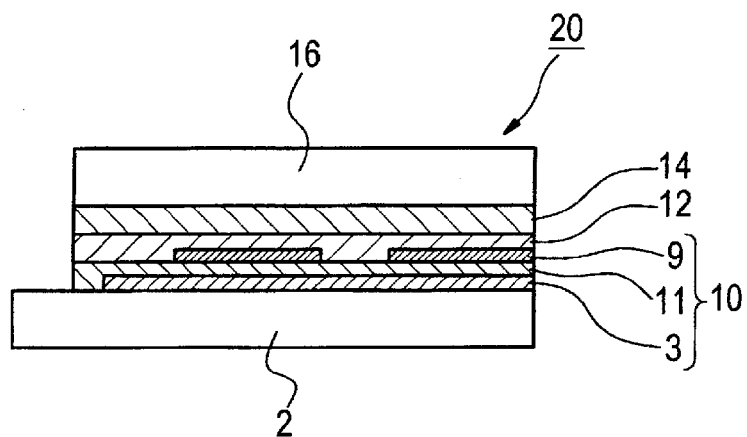
FIG. 2 is a schematic view showing one example of the light emission apparatus according to the present invention.

FIG. 2 is a cross-sectional view schematically showing one example of the light emission apparatus of the present invention.

The light emission apparatus 20 of FIG. 2 is composed of a transparent substrate (supporting substrate) 2, an organic electroluminescence device 10, a sealing container 16 and the like.

The organic electroluminescence device 10 is configured by sequentially stacking an anode (first electrode) 3, an organic layer 11 and a cathode (second electrode) 9 on a substrate 2. A protective layer 12 is stacked on the cathode 9, and a sealing container 16 is provided on the protective layer 12 through an adhesion layer 14. Incidentally, a part of electrodes 3 and 9, a partition wall, an insulating layer and the like are omitted.

Here, as for the adhesion layer 14, a photocurable or thermosetting adhesive such as epoxy resin can be used and, for example, a thermosetting adhesive sheet can also be used.

The light emission apparatus of the present invention is not particularly limited in its application and, for example, can be used not only as an illumination apparatus but also a display apparatus of a television set, a personal computer, a cellular phone, an electronic paper and the like.

(Illumination Apparatus)

The illumination apparatus according to an embodiment of the present invention is described below by referring to FIG. 3.

Figure 3:
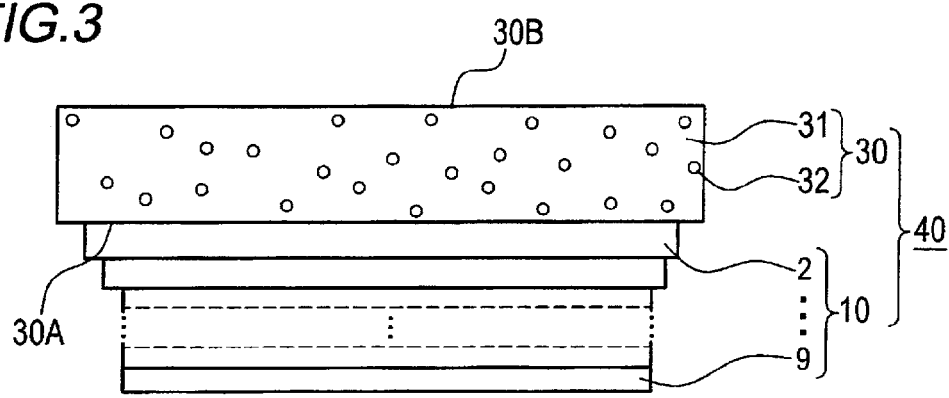
FIG. 3 is a schematic view showing one example of the configuration of the illumination apparatus according to the present invention.

FIG. 3 is a cross-sectional view schematically showing one example of the illumination apparatus according to an embodiment of the present invention.

The illumination apparatus 40 according to an embodiment of the present invention comprises, as shown in FIG. 3, the above-described organic EL device 10 and a light scattering member 30. More specifically, the illumination apparatus 40 is configured such that the substrate 2 of the organic EL device 10 and the light scattering member 30 are put into contact.

The light scattering member 30 is not particularly limited as long as it can scatter light, but in FIG. 3, a member obtained by dispersing fine particles 32 in a transparent substrate 31 is used. Suitable examples of the transparent substrate 31 include a glass substrate, and suitable examples of the fine particle 32 include a transparent resin fine particle. As the glass substrate and the transparent resin fine particle, a known product can be used for both. In such an illumination apparatus 40, when light emitted from the organic electroluminescence device 10 is incident on the light incident surface 30A of the scattering member 30, the incident light is scattered by the light scattering member 30 and the scattered light is output as illuminating light from the light output surface 30B.

EXAMPLES

The present invention is described in greater detail below by referring to Examples, but the present invention is not limited thereto.

Structures of compounds used in Examples and Comparative Examples are shown below.

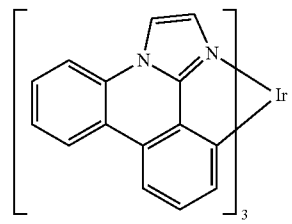

b-1

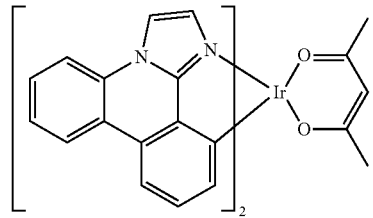

a-11

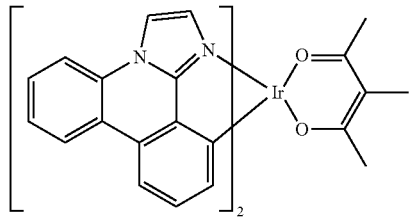

a-12

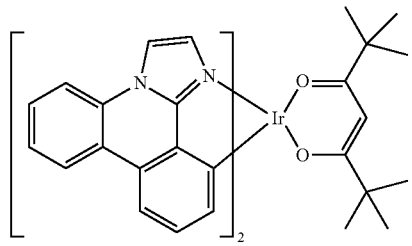

a-13

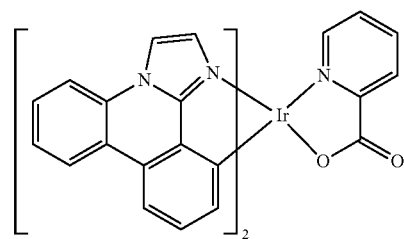

a-14

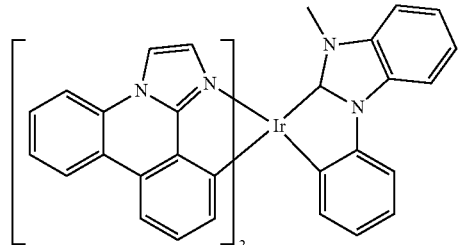

a-15 ref-a-10
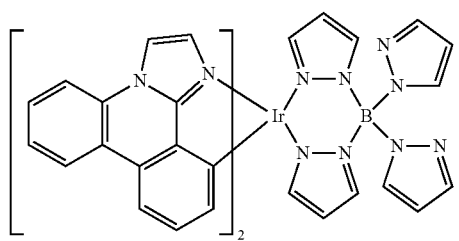
b-2
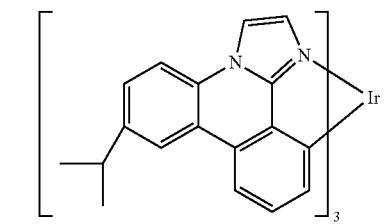
a-21
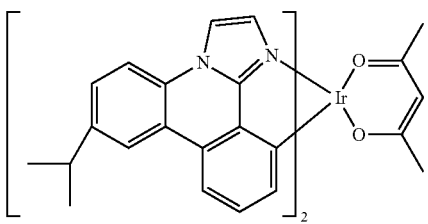
b-3
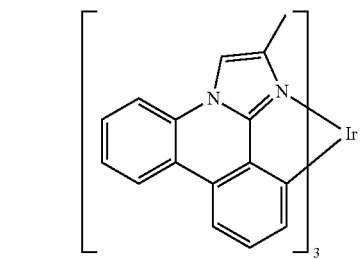
a-31
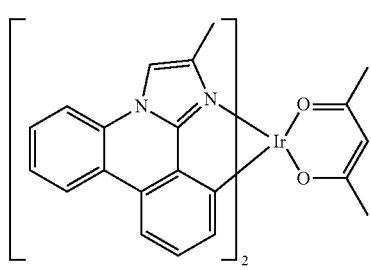
b-4
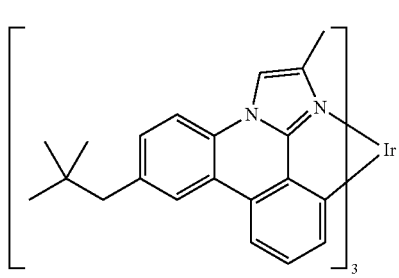
a-41
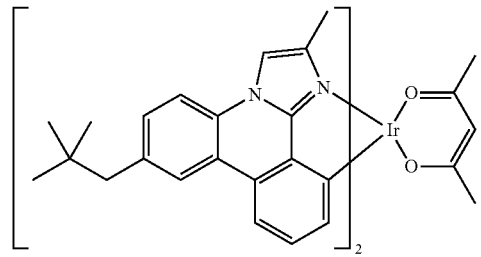
b-5
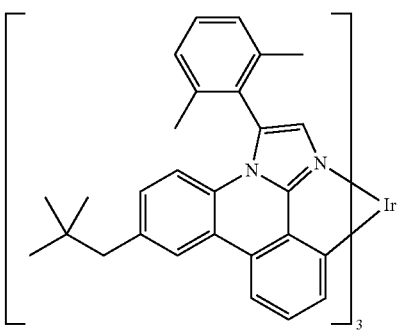
a-51
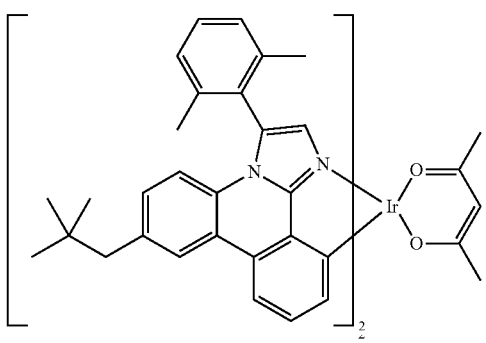
b-6
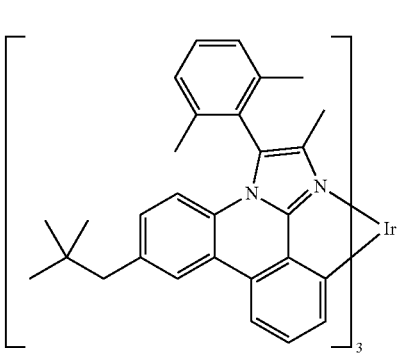
a-61
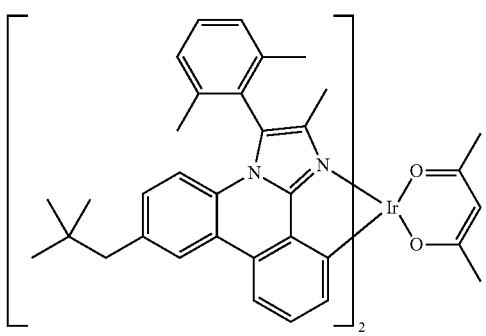

-continued
b-7
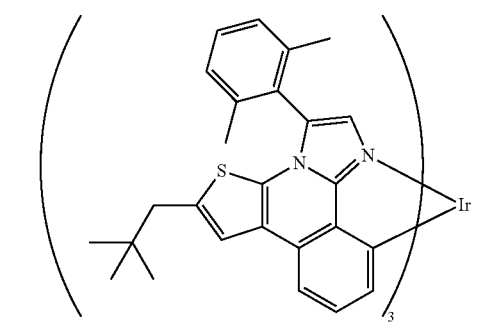
a-71
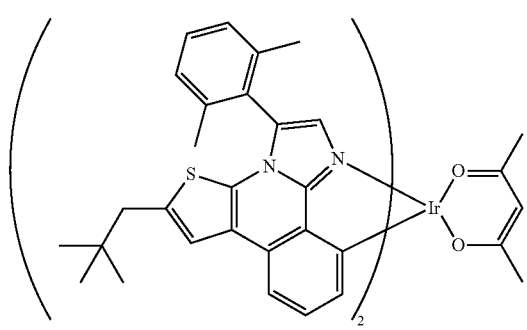
b-8
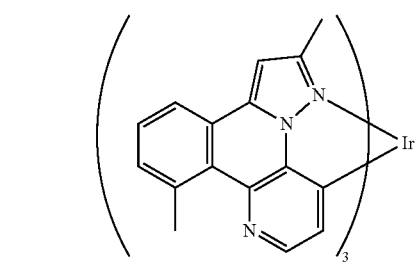
a-81
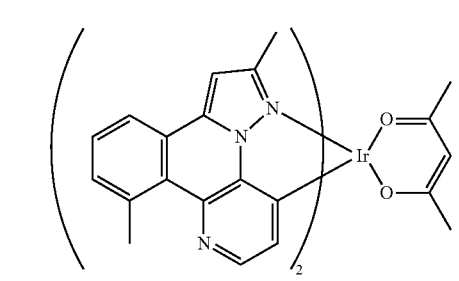
b-9
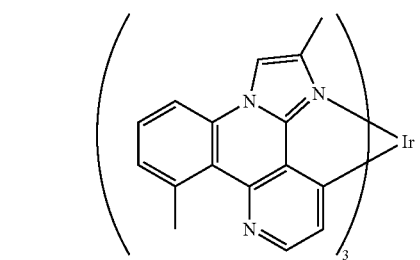
-continued
a-91
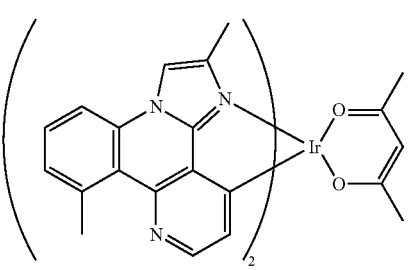
b-10
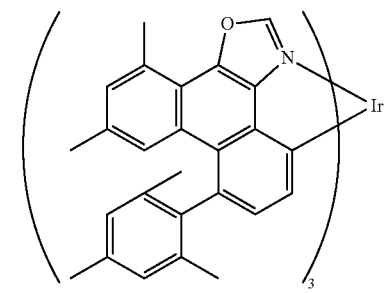
a-101
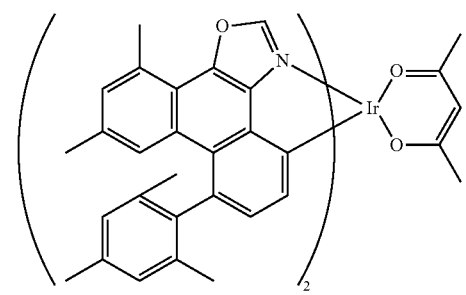
b-11
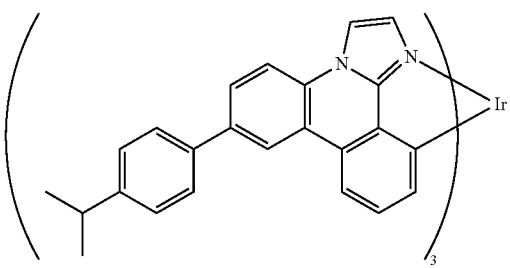
a-111
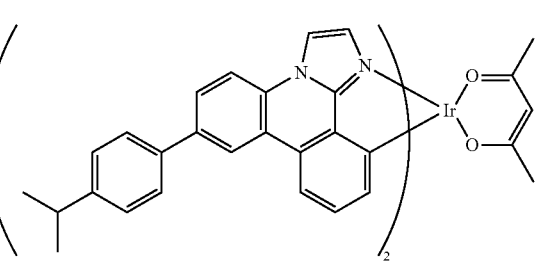

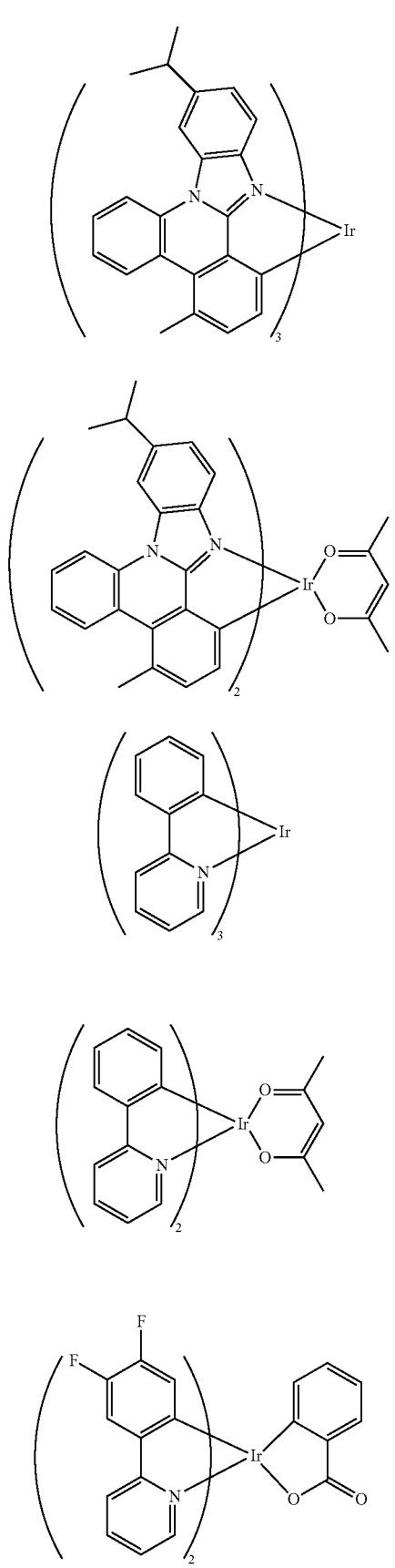
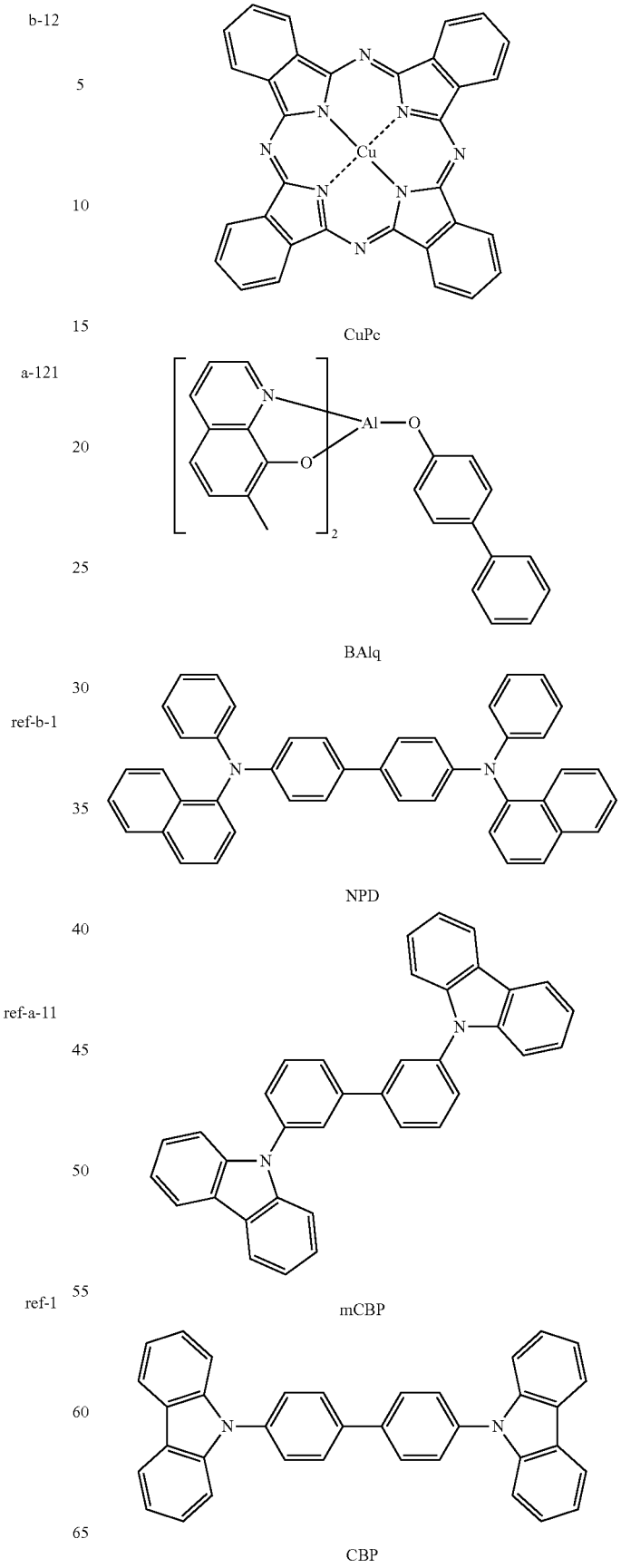

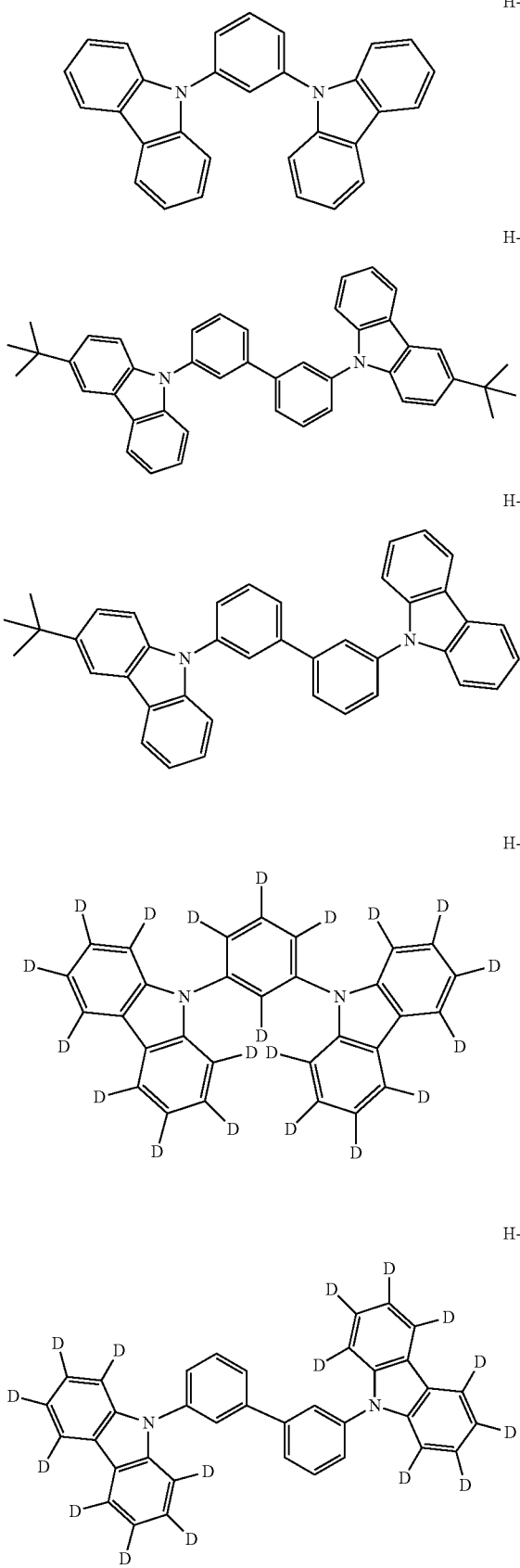
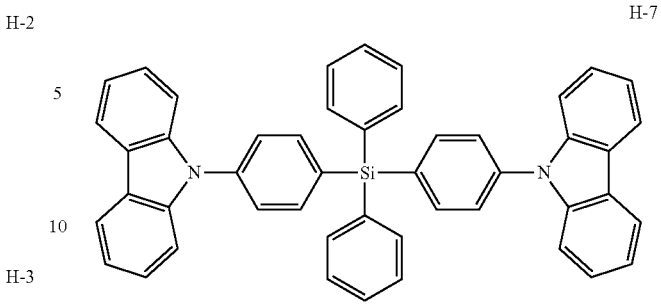

Molecular weights of the materials used in the light emitting layer are shown below.

TABLE 9

| Compound No. | Molecular Weight |
|---|---|
| b-1 | 843.97 |
| b-2 | 970.21 |
| b-3 | 885.73 |
| b-4 | 1096.42 |
| b-5 | 1366.81 |
| b-6 | 1408.87 |
| b-7 | 1384.9 |
| b-8 | 931.09 |
| b-9 | 931.09 |
| b-10 | 1285.6 |
| b-11 | 1198.48 |
| b-12 | 1162.45 |
| a-11 | 725.83 |
| a-12 | 739.85 |
| a-13 | 809.99 |
| a-14 | 748.82 |
| a-15 | 834.98 |
| ref-a-10 | 905.81 |
| ref-b-1 | 654.79 |
| ref-a-11 | 599.71 |
| ref-1 | 694.66 |
| a-21 | 809.99 |
| a-31 | 753.67 |
| a-41 | 894.13 |
| a-51 | 1074.39 |
| a-61 | 1102.43 |
| a-71 | 1086.45 |
| a-81 | 783.91 |
| a-91 | 783.91 |
| a-101 | 1020.25 |
| a-111 | 962.17 |
| a-121 | 938.15 |

Compounds b-1 to b-7 and b-10 to b-12 were produced using the synthesis methods described in US2008/0297033, page 55, paragraph 129 et seq.

Compounds b-8, b-9, a-81 and a-91 were produced using the synthesis methods described in JP-A-2009-102533, page 189, paragraphs 288 to 302.

Compound a-11, a-21 to a-71 and a-101 to a-121 were produced in accordance with the method for synthesizing Complex B described in JP-A-2008-311607, page 39, paragraph [0132].

Compounds b-12 to b-16 were also synthesized in the same manner. Specifically, Compound a-14 was synthesized by the method described at page 33 of WO02/15645, Compounds a-12 to a-13 were synthesized by changing acetylacetone to a corresponding diketone in the method described at page 169 of WO2008/140114, and Compound ref-a-10 was synthesized in accordance with the synthesis method of a complex described in Polyhedron, Vol. 23, page 419.

Each of the compounds indicated by Compounds b-1 to b-6 after synthesis was subjected to sublimation purification under reduced pressure, and the sample precipitated on the high-temperature side was collected in a dry atmosphere and analyzed using an oxygen/nitrogen analyzer EMGA-920 manufactured by Horiba Mfg. Co., Ltd. by the Karl Fischer's method. After confirming that an oxygen atom not derived from the water molecule is not detected in the sample, each of the separately synthesized compounds indicated by Compounds a-11 to a-61 was mixed to obtain the content ratio shown in the Tables.

The thus-produced mixture was used for the production of a light emitting layer.

A 100 μm-thick 2.5 cm-square glass substrate having thereon indium tin oxide (ITO) film (produced by GEO-MATEC Corporation, surface resistance: 10 Ω/sq.) was placed in a cleaning vessel and subjected to ultrasonic cleaning in 2-propanol and then to a UV-ozone treatment for 30 minutes. On this transparent anode (ITO film), the following organic compound layers were sequentially deposited by the vacuum deposition method.

First layer: CuPc (copper phthalocyanine), thickness: 120 nm
Second layer: NPD (N,N'-di-α-naphthyl-N,N'-diphenyl)benzidine, thickness: 7 nm
Third layer: CBP (4,4'-di(9-carbazoyl)biphenyl), thickness: 3 nm
Fourth layer (light emitting layer): dopant (9 mass %), host material (91 mass %), thickness: 30 nm
Fifth layer: electron transport material (Balq), thickness: 30 nm On this layer, lithium fluoride of 1 nm and metal aluminum of 100 nm were deposited in this order to form a cathode.

The obtained laminate was placed in an argon gas-purged glove box without exposing to the atmosphere and then encapsulated using a stainless steel-made sealing can and an ultraviolet curable adhesive (XNR5516HV, produced by Nagase Ciba K.K.) to obtain Device 1 of the present invention.

Devices 2 to 49 as Examples of the present invention and Comparative Devices 1 to 25 were fabricated in the same manner as Device 1 of the present invention except for changing the material of the light emitting layer as shown in Tables 10 to 12 below.

In Tables 10 to 12, the content ratio of dopants of the light emitting layer indicates the ratio of the content of the light emitting layer material 2 to the content of the light emitting layer material 1. Also, the molecular weight ratio of dopants of the light emitting layer indicates the ratio of the molecular weight of the light emitting layer material 2 to the molecular weight of the light emitting layer material 1.

These devices were caused to emit light, as a result, luminescence derived from each light emitting material was obtained.

(Performance Evaluation of Organic Electroluminescence Device)

Each of the obtained devices was measured for the external quantum efficiency and the rate of change in the external quantum efficiency at high-temperature driving, and the performance of the device was thereby evaluated. Various measurements were performed as follows.

(a) External Quantum Efficiency

A direct-current voltage was applied to each device to emit light by using Source Measure Unit 2400 manufactured by Toyo Corp. and its luminance was measured by means of Luminance Meter BM-8 manufactured by Topcon Corporation. The emission spectrum and the emission wavelength were measured using Spectrum Analyzer PMA-11 manufactured by Hamamatsu Photonics K.K. Based on the values obtained, the external quantum efficiency in the vicinity of a luminance of 1,000 cd/m$^2$ was calculated by a luminance conversion method.

(b) Rate of Change in External Quantum Efficiency at High-Temperature Driving; Rate($\phi$):

After measuring the external quantum efficiency (efficiency before heating) by the method of (a) above, each device was left standing at 75° C. for 4 hours and then anew measured for the external quantum efficiency (efficiency after heating) in the same manner as in (a) above. The rate($\phi$) was determined as a ratio of efficiency after heating to efficiency before heating.

The evaluation results of each device are shown in Tables 10 to 12.

TABLE 10

| Device No. | Light Emitting Layer Material 1 | Light Emitting Layer Material 2 | Molecular Weight Ratio | Host Material | Content Ratio (ppm) | External Quantum Efficiency (%) | rate($\phi$) |
|---|---|---|---|---|---|---|---|
| Comparative Device 1 | b-1 | — | — | mCBP | 0 | 2.1 | 0.5 |
| Device 1 of Invention | b-1 | a-11 | 0.86 | mCBP | 500 | 4.6 | 0.94 |
| Device 2 of Invention | b-1 | a-11 | 0.86 | H-7 | 500 | 4.1 | 0.93 |
| Device 3 of Invention | b-1 | a-11 | 0.86 | H-6 | 500 | 5 | 0.98 |
| Device 4 of Invention | b-1 | a-12 | 0.88 | mCBP | 500 | 3.5 | 0.93 |
| Device 5 of Invention | b-1 | a-13 | 0.96 | mCBP | 500 | 3.4 | 0.95 |
| Device 6 of Invention | b-1 | a-14 | 0.89 | mCBP | 500 | 3.2 | 0.95 |
| Device 7 of Invention | b-1 | a-15 | 0.99 | mCBP | 500 | 2.9 | 0.96 |
| Comparative Device 2 | b-1 | ref-a-10 | 1.07 | mCBP | 1 | 2 | 0.68 |
| Comparative Device 3 | b-1 | ref-a-10 | 1.07 | mCBP | 500 | 2.1 | 0.65 |
| Comparative Device 4 | b-1 | ref-a-10 | 1.07 | mCBP | 5000 | 2 | 0.7 |
| Comparative Device 5 | b-1 | ref-1 | 0.82 | mCBP | 500 | 2.8 | 0.39 |
| Comparative Device 6 | b-1 | ref-1 | 0.82 | mCBP | 30000 | 2.7 | 0.35 |
| Comparative Device 7 | ref-b-1 | ref-a-11 | 0.92 | mCBP | 0 | 5.6 | 0.64 |
| Comparative Device 8 | ref-b-1 | ref-a-11 | 0.92 | mCBP | 500 | 5.4 | 0.65 |
| Comparative Device 9 | ref-b-1 | ref-a-11 | 0.92 | mCBP | 5000 | 5.7 | 0.61 |
| Comparative Device 10 | b-2 | — | — | mCBP | 0 | 1.5 | 0.64 |
| Device 8 of Invention | b-2 | a-21 | 0.83 | mCBP | 500 | 2.8 | 0.96 |
| Comparative Device 11 | b-3 | — | — | mCBP | 0 | 12.5 | 0.55 |
| Device 9 of Invention | b-3 | a-31 | 0.85 | mCBP | 500 | 14.8 | 0.89 |
| Comparative Device 12 | b-4 | — | — | mCBP | 0 | 10.2 | 0.59 |
| Device 10 of Invention | b-4 | a-41 | 0.82 | mCBP | 500 | 13.6 | 0.94 |
| Comparative Device 13 | b-5 | — | — | mCBP | 0 | 8 | 0.61 |

TABLE 10-continued

| Device No. | Light Emitting Layer Material 1 | Light Emitting Layer Material 2 | Molecular Weight Ratio | Host Material | Content Ratio (ppm) | External Quantum Efficiency (%) | rate(φ) |
|---|---|---|---|---|---|---|---|
| Device 11 of Invention | b-5 | a-51 | 0.79 | mCBP | 500 | 11.2 | 0.93 |
| Comparative Device 14 | b-6 | — | — | mCBP | 0 | 11.9 | 0.51 |
| Device 12 of Invention | b-6 | a-61 | 0.78 | mCBP | 500 | 14.9 | 0.89 |
| Comparative Device 15 | b-7 | — | — | mCBP | 0 | 1.7 | 0.41 |
| Device 13 of Invention | b-7 | a-71 | 0.78 | H-4 | 500 | 3 | 0.78 |

TABLE 11

| Device No. | Light Emitting Layer Material 1 | Light Emitting Layer Material 2 | Molecular Weight Ratio | Host Material | Content Ratio (ppm) | External Quantum Efficiency (%) | rate(φ) |
|---|---|---|---|---|---|---|---|
| Comparative Device 16 | b-8 | — | — | H-4 | 0 | 5 | 0.31 |
| Device 14 of Invention | b-8 | a-81 | 0.84 | mCBP | 500 | 6.8 | 0.66 |
| Comparative Device 17 | b-9 | — | — | mCBP | 0 | 2.8 | 0.45 |
| Device 15 of Invention | b-9 | a-91 | 0.84 | mCBP | 500 | 3.6 | 0.85 |
| Comparative Device 18 | b-10 | — | — | mCBP | 0 | 2.5 | 0.12 |
| Device 16 of Invention | b-10 | a-101 | 0.79 | mCBP | 500 | 3.4 | 0.67 |
| Comparative Device 19 | b-11 | — | — | H-3 | 0 | 1.9 | 0.59 |
| Device 17 of Invention | b-11 | a-111 | 0.80 | H-3 | 500 | 3.8 | 0.9 |
| Comparative Device 20 | b-12 | — | — | H-3 | 0 | 3 | 0.67 |
| Device 18 of Invention | b-12 | a-121 | 0.81 | H-3 | 500 | 4.7 | 0.98 |
| Comparative Device 21 | b-1 | a-11 | 0.86 | H-2 | 0.05 | 2.2 | 0.51 |
| Device 19 of Invention | b-1 | a-11 | 0.86 | H-2 | 0.1 | 2.9 | 0.79 |
| Device 20 of Invention | b-1 | a-11 | 0.86 | H-2 | 0.4 | 3.5 | 0.84 |
| Device 21 of Invention | b-1 | a-11 | 0.86 | H-2 | 0.5 | 4.1 | 0.84 |
| Device 22 of Invention | b-1 | a-11 | 0.86 | H-2 | 8 | 4.2 | 0.89 |
| Device 23 of Invention | b-1 | a-11 | 0.86 | H-2 | 10 | 4.2 | 0.91 |
| Device 24 of Invention | b-1 | a-11 | 0.86 | H-2 | 45 | 4.2 | 0.9 |
| Device 25 of Invention | b-1 | a-11 | 0.86 | H-2 | 50 | 4.4 | 0.92 |
| Device 26 of Invention | b-1 | a-11 | 0.86 | H-2 | 100 | 4.5 | 0.92 |
| Device 27 of Invention | b-1 | a-11 | 0.86 | H-2 | 250 | 4.4 | 0.94 |
| Device 28 of Invention | b-1 | a-11 | 0.86 | H-2 | 500 | 4.6 | 0.96 |
| Device 29 of Invention | b-1 | a-11 | 0.86 | H-2 | 650 | 4.3 | 0.95 |
| Device 30 of Invention | b-1 | a-11 | 0.86 | H-2 | 750 | 4 | 0.93 |
| Device 31 of Invention | b-1 | a-11 | 0.86 | H-2 | 900 | 3.8 | 0.95 |
| Device 32 of Invention | b-1 | a-11 | 0.86 | H-2 | 1000 | 3.8 | 0.94 |
| Device 33 of Invention | b-1 | a-11 | 0.86 | H-2 | 2800 | 3.4 | 0.95 |
| Device 34 of Invention | b-1 | a-11 | 0.86 | H-2 | 3000 | 3.3 | 0.96 |

TABLE 12

| Device No. | Light Emitting Layer Material 1 | Light Emitting Layer Material 2 | Molecular Weight Ratio | Host Material | Content Ratio (ppm) | External Quantum Efficiency (%) | rate(φ) |
|---|---|---|---|---|---|---|---|
| Device 35 of Invention | b-1 | a-11 | 0.86 | H-2 | 4500 | 2.9 | 0.94 |
| Comparative Device 22 | b-1 | a-11 | 0.86 | H-2 | 5500 | 2 | 0.94 |
| Device 36 of Invention | b-1 | a-12 | 0.88 | H-5 | 0.2 | 3 | 0.76 |
| Device 37 of Invention | b-1 | a-12 | 0.88 | H-5 | 0.5 | 3.4 | 0.84 |
| Device 38 of Invention | b-1 | a-12 | 0.88 | H-5 | 500 | 3.5 | 0.98 |
| Device 39 of Invention | b-1 | a-12 | 0.88 | H-5 | 4000 | 3.6 | 0.99 |
| Device 40 of Invention | b-1 | a-12 | 0.88 | H-5 | 5000 | 3.4 | 0.94 |
| Comparative Device 23 | b-1 | a-12 | 0.88 | H-5 | 10000 | 3.8 | 0.97 |
| Device 41 of Invention | b-5 | a-51 | 0.79 | H-6 | 1 | 8.9 | 0.86 |
| Device 42 of Invention | b-5 | a-51 | 0.79 | H-6 | 500 | 11.9 | 0.97 |
| Device 43 of Invention | b-5 | a-51 | 0.79 | H-6 | 1500 | 11.5 | 1 |
| Device 44 of Invention | b-5 | a-51 | 0.79 | H-6 | 4000 | 11 | 0.97 |
| Comparative Device 24 | b-5 | a-51 | 0.79 | H-6 | 7500 | 10.1 | 0.94 |
| Comparative Device 25 | b-6 | a-61 | 0.78 | H-5 | 0.01 | 11.8 | 0.55 |
| Device 45 of Invention | b-6 | a-61 | 0.78 | H-5 | 0.1 | 12.9 | 0.76 |

TABLE 12-continued

| Device No. | Light Emitting Layer Material 1 | Light Emitting Layer Material 2 | Molecular Weight Ratio | Host Material | Content Ratio (ppm) | External Quantum Efficiency (%) | rate(φ) |
|---|---|---|---|---|---|---|---|
| Device 46 of Invention | b-6 | a-61 | 0.78 | H-5 | 0.2 | 13 | 0.78 |
| Device 47 of Invention | b-6 | a-61 | 0.78 | H-5 | 0.5 | 13.9 | 0.85 |
| Device 48 of Invention | b-6 | a-61 | 0.78 | H-5 | 0.75 | 14.5 | 0.86 |
| Device 49 of Invention | b-6 | a-61 | 0.78 | H-5 | 500 | 14.7 | 0.98 |

It is seen from the results in Tables 10 to 12 that Devices 1 to 49 as Examples of the present invention using a material where the molecular weight of the compound represented by formula (1a) is smaller than the molecular weight of the compound represented by formula (1b) and the content of the compound represented by formula (1a) is from 0.1 to 5,000 ppm based on the compound represented by formula (1b), exhibit excellent external quantum efficiency with little reduction in the external quantum efficiency even at high-temperature driving, and excellent durability. When the content of the compound represented by formula (1a) exceeds 5,000 ppm, the external quantum efficiency decreases, though the external quantum efficiency is maintained even at high-temperature driving, and when the content is less than 0.1 ppm, both of the effects obtained are insufficient.

As seen from comparison between Device 2 and Device 3 of the present invention, when the host is the compound represented by formula (4-1) or (4-2), the external quantum efficiency becomes high.

As seen from Comparative Devices 2 to 4, when the molecular weight of the compound represented by formula (1a) is larger than the molecular weight of the compound represented by formula (1b), even if the compound represented by formula (1b) is contained, the improvement of external quantum efficiency is not recognized and the external quantum efficiency is decreased at high-temperature driving. Also, as seen from Comparative Devices 7 to 9, even if a mixed-type metal complex with a metal complex not represented by formula (1b) is incorporated, the improvement of external quantum efficiency is not recognized and the external quantum efficiency is decreased as high-temperature driving. That is, it is understood that the effects of the present invention can be remarkably brought out when the compound represented by formula (1a) is contained together with the compound represented by formula (1b).

Furthermore, as seen from Comparative Devices 5 and 6, even when another complex having no common ligand is present together, the effect of enhancing the efficiency is small in the blue region, and deterioration at high-temperature driving cannot be prevented.

The organic electroluminescence device using the material of the present invention can maintain the luminous efficiency at a high level even when used in a high-temperature environment, such as in-vehicle usage, and exhibit excellent durability and therefore, can be advantageously utilized in a light emission apparatus, a display apparatus and an illumination apparatus.

Subsequently, some devices, that is, the devices shown in Table 10, were evaluated for the device durability. A direct-current voltage was applied to each device to obtain a luminance of 1,000 cd/m$^2$, and the time spent until the luminance was reduced to 500 cd/m$^2$ was measured. Using this half-luminance time as the index in the evaluation of drive durability, the device durability is expressed for clarification by a relative value assuming that the half-luminance time of Device 1 of the present invention is 100. Evaluation results of each device are shown in Table 13.

TABLE 13

| No. | Device No. in Table 10 | Light Emitting Layer Material 1 | Light Emitting Layer Material 2 | Molecular Weight Ratio | Host Material | Content Ratio (ppm) | External Quantum Efficiency (%) | Enhancement Ratio in Efficiency | Durability (relative value) | Durability Ratio |
|---|---|---|---|---|---|---|---|---|---|---|
| Device A1 | Comparative Device 1 | b-1 | — | — | mCBP | 0 | 2.1 | 2.19 | 101 | 0.99 |
| Device B1 | Device 1 of Invention | b-1 | a-11 | 0.86 | mCBP | 500 | 4.6 | | 100 | |
| Device A2 | Comparative Device 11 | b-5 | — | — | mCBP | 0 | 8 | 1.40 | 1601 | 1.01 |
| Device B2 | Device 10 of Invention | b-5 | a-51 | 0.79 | mCBP | 500 | 11.2 | | 1622 | |
| Device A3 | Comparative Device 12 | b-6 | — | — | mCBP | 0 | 11.9 | 1.25 | 1200 | 0.97 |
| Device B3 | Device 11 of Invention | b-6 | a-61 | 0.78 | mCBP | 500 | 14.9 | | 1158 | |
| Device A4 | Comparative Device 1 | b-1 | — | — | mCBP | 0 | 2.1 | 5.95 | 101 | 0.09 |
| Device B4 | Comparative Device 9 | b-3 | — | — | mCBP | 0 | 12.5 | | 9 | |
| Device A5 | Comparative Device 1 | b-1 | — | — | mCBP | 0 | 2.1 | 1.28 | 101 | 0.21 |
| Device B5 | Comparative Device 6 | b-1 | ref-1 | 0.82 | mCBP | 30000 | 2.7 | | 21 | |

In Table 13, the enhancement ratio of efficiency indicates the ratio of efficiency of Device B to efficiency of Device A, and the durability ratio indicates the ratio of durability of Device B to durability of Device A. As compared with Devices A1 to A3, Devices B1 to B3 can be enhanced in the efficiency and moreover, can maintain an almost equal durability. On the other hand, it is seen that when Compound b-3 indicated as a method for enhancing the efficiency in Patent Document 1 (Devices A4 and B4) is used, satisfying both of those properties cannot be realized. Also, in the case of causing a metal complex completely differing in the structure and emitting light at a short wavelength to coexist, as in the method described in Patent Document 2, decrease in the durability is revealed. For obtaining a highest efficiency while maintaining a highest durability, it is preferred to use a material where a-5 is mixed with b-5.

INDUSTRIAL APPLICABILITY

According to the present invention, an organic electroluminescence device having high luminous efficiency and causing less reduction in the luminous efficiency can be obtained.

The present application claims foreign priority based on Japanese Patent Application No. JP2009-201145 filed Aug. 31, 2009 the contents of which is incorporated herein by reference.

REFERENCE SIGNS LIST

2 Substrate
3 Anode
4 Hole injection layer
5 Hole transport layer
6 Light emitting layer
7 Hole blocking layer
8 Electron transport layer
9 Cathode
10 Organic electroluminescence device (organic EL device)
11 Organic layer
12 Protective layer
14 Adhesion layer
16 Sealing container
20 Light emission apparatus
30 Light scattering member
30A Light incident surface
30B Light output surface
32 Fine particle
40 Illumination apparatus

The invention claimed is:

1. A material for an organic electroluminescence device, comprising a compound represented by formula (3a) and a compound represented by formula (3b),
wherein the compound represented by formula (3a) has a molecular weight smaller than that of the compound represented by formula (3b), and
the material has a content ratio of the compound represented by formula (3a) to the compound represented by formula (3b) of from 0.1 to 5,000 ppm:

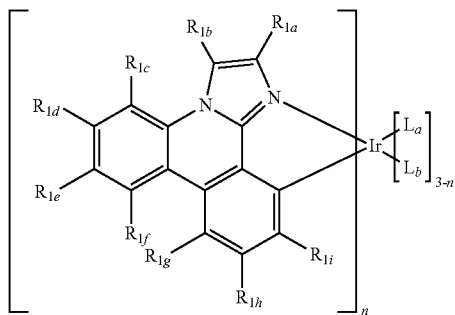

(3a)

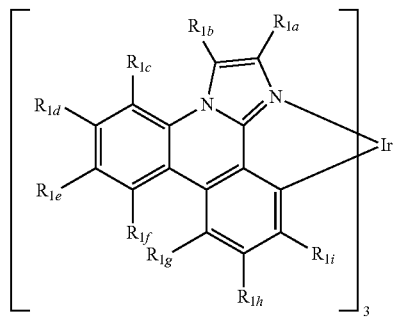

(3b)

wherein each of $R_{1a}$ to $R_{1i}$ in formula (3a) is the same as the corresponding $R_{1a}$ to $R_{1i}$ in formula (3b), and each $R_{1a}$ to $R_{1i}$ in formula (3a) and formula (3b) independently represents a hydrogen atom, an alkyl group having a carbon number of 1 to 20, a cycloalkyl having a carbon number of 3 to 8, an aryl group having a carbon number of 6 to 18, an cyano group, or a fluoro group; n is 1 or 2; and $L_a$ and $L_b$ form one of the following bidentate ligands:

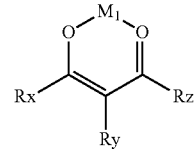

I-1

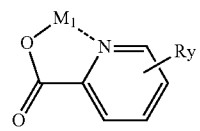

I-4

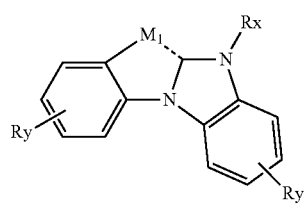

I-12 wherein each of Rx, Ry and Rz independently represents a hydrogen atom, an alkyl group having a carbon number of 1 to 20, a cycloalkyl group having a carbon number of 3 to 8, or an aryl group having a carbon number of 6 to 18; and $M_1$ corresponds to Ir in formula (3a).

2. The material for an organic electroluminescence device as claimed in claim 1, wherein the compound represented by formula (3a) is a compound represented by formula (3a-1):

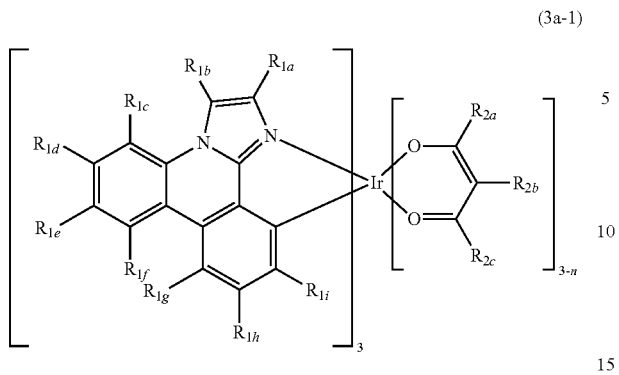

(3a-1)

wherein $R_{1a}$ to $R_{1i}$ have the same meanings as in formula (3a), n has the same meaning as in formula (3a), and each of $R_{2a}$ to $R_{2c}$ independently represents a hydrogen atom, an alkyl group having a carbon number of 1 to 20, a cycloalkyl group having a carbon number of 3 to 8, or an aryl group having a carbon number of 6 to 18.

3. The material for an organic electroluminescence device as claimed in claim 2, wherein the compound represented by formula (3a-1) is a compound represented by formula (3a-2):

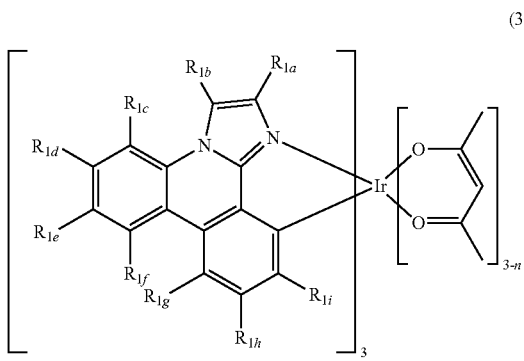

(3a-2)

wherein $R_{1a}$ to $R_{1i}$ have the same meanings as in formula (3a), and n has the same meaning as in formula (3a).

4. The material for an organic electroluminescence device as claimed in claim 3, wherein the compound represented by formula (3a-2) is a compound represented by formula (3a-3):

(3a-3)

wherein $R_{1a}$ to $R_{1i}$ have the same meanings as in formula (3a).

5. The material for an organic electroluminescence device as claimed in any one of claims 1 to 4, wherein the content ratio of the compound represented by formula (3a) to the compound represented by formula (3b) is from 0.1 to 1,000 ppm.

6. The material for an organic electroluminescence device as claimed in any one of claims 1 to 4, wherein a ratio of the molecular weight of the compound represented by formula (3a) to a molecular weight of the compound represented by formula (3b) is from 0.75 to 0.99.

7. An organic electroluminescence device comprising: a substrate; a pair of electrodes; and at least one organic layer containing a light emitting layer and being disposed between the electrodes, wherein
    the organic layer contains a material for an organic electroluminescence device claimed in any one of claims 1 to 4.

8. The organic electroluminescence device as claimed in claim 7, wherein the light emitting layer includes the material for an organic electroluminescence device.

9. A light emission apparatus comprising an organic electroluminescence device claimed in claim 7.

10. A display apparatus comprising an organic electroluminescence device claimed in claim 7.

11. An illumination apparatus comprising an organic electroluminescence device claimed in claim 7.

* * * * *